(12) United States Patent
Wu et al.

(10) Patent No.: US 12,438,518 B2
(45) Date of Patent: Oct. 7, 2025

(54) BULK ACOUSTIC WAVE RESONATOR AND FABRICATION METHOD THEREFOR

(71) Applicant: Suzhou HunterSun Electronics Co., Ltd., Suzhou Nano (CN)

(72) Inventors: Ming Wu, Suzhou Nano (CN); Zhaoyun Tang, Suzhou Nano (CN); Qinghua Yang, Suzhou Nano (CN); Zhiguo Lai, Suzhou Nano (CN); Jiayou Wang, Suzhou Nano (CN)

(73) Assignee: SUZHOU HUNTERSUN ELECTRONICS CO., LTD., Suzhou Nano (CN)

( * ) Notice: Subject to any disclaimer, the term of this patent is extended or adjusted under 35 U.S.C. 154(b) by 333 days.

(21) Appl. No.: 17/919,464

(22) PCT Filed: Apr. 19, 2021

(86) PCT No.: PCT/CN2021/088160
§ 371 (c)(1),
(2) Date: Oct. 17, 2022

(87) PCT Pub. No.: WO2021/213333
PCT Pub. Date: Oct. 28, 2021

(65) Prior Publication Data
US 2023/0155570 A1  May 18, 2023

(30) Foreign Application Priority Data

Apr. 20, 2020 (CN) .......................... 202010313604.7
Apr. 20, 2020 (CN) .......................... 202010314202.9
Apr. 20, 2020 (CN) .......................... 202010314204.8

(51) Int. Cl.
*H03H 9/205* (2006.01)
*H03H 3/02* (2006.01)
(Continued)

(52) U.S. Cl.
CPC .............. *H03H 9/205* (2013.01); *H03H 3/02* (2013.01); *H03H 9/02015* (2013.01);
(Continued)

(58) Field of Classification Search
CPC ...... H03H 9/205; H03H 3/02; H03H 9/02015; H03H 9/131; H03H 9/173; H03H 9/174;
(Continued)

(56) References Cited

U.S. PATENT DOCUMENTS

| | | | |
|---|---|---|---|
| 2002/0089393 A1 | 7/2002 | Tikka et al. | |
| 2006/0158284 A1* | 7/2006 | Ruby | H03H 9/587 |
| | | | 29/25.35 |

(Continued)

FOREIGN PATENT DOCUMENTS

| | | |
|---|---|---|
| CN | 101009482 A | 8/2007 |
| CN | 110266285 A | 9/2019 |

(Continued)

OTHER PUBLICATIONS

International Search Report Corresponding to PCT/CN2021/088160, dated Jul. 15, 2021.

(Continued)

*Primary Examiner* — Jorge L Salazar, Jr.
(74) *Attorney, Agent, or Firm* — Harness, Dickey & Pierce, P.L.C.

(57) ABSTRACT

A BAW resonator includes: a piezoelectric film array, including multiple piezoelectric films between a substrate of a chip and a capping layer on the top, where multiple first cavities are provided between adjacent piezoelectric films in a vertical direction, between the piezoelectric films and the capping layer, and between the piezoelectric films and the substrate, second cavities are shared between adjacent piezoelectric films in a first direction in a horizontal plane, and third cavities are shared between adjacent piezoelectric (Continued)

films in a second direction in the horizontal plane; multiple electrode layers, covering at least the top surface and bottom surface of each of the piezoelectric films; and multiple electrode interconnection layers, connected to the electrode layers on the bottom surfaces of the piezoelectric films along sidewalls of the third cavities.

20 Claims, 48 Drawing Sheets

(51) Int. Cl.
  *H03H 9/02* (2006.01)
  *H03H 9/13* (2006.01)
  *H03H 9/17* (2006.01)

(52) U.S. Cl.
  CPC ............ *H03H 9/131* (2013.01); *H03H 9/173* (2013.01); *H03H 9/174* (2013.01); *H03H 2003/021* (2013.01); *H03H 2003/023* (2013.01)

(58) Field of Classification Search
  CPC ....... H03H 2003/021; H03H 2003/023; H03H 9/0557
  USPC .......................................... 333/133, 186–188
  See application file for complete search history.

(56) References Cited

U.S. PATENT DOCUMENTS

| | | |
|---|---|---|
| 2006/0202779 A1 | 9/2006 | Fazzio et al. |
| 2007/0139139 A1 | 6/2007 | Park et al. |
| 2007/0278469 A1 | 12/2007 | Marty et al. |
| 2011/0047783 A1 | 3/2011 | Ruby et al. |
| 2018/0367113 A1 | 12/2018 | Shealy et al. |
| 2019/0229705 A1 | 7/2019 | Dasgupta et al. |
| 2019/0267536 A1 | 8/2019 | Apte et al. |
| 2019/0372543 A1 | 12/2019 | Qian et al. |

FOREIGN PATENT DOCUMENTS

| | | |
|---|---|---|
| CN | 110798160 A | 2/2020 |
| CN | 110994099 A | 4/2020 |
| CN | 111446940 A | 7/2020 |
| CN | 111510096 A | 8/2020 |
| CN | 111564467 A | 8/2020 |

OTHER PUBLICATIONS

First Office Action issued in corresponding Chinese Application No. 202010313604.7 dated Mar. 25, 2023.
First Office Action issued in corresponding Chinese Application No. 202010314204.8 dated Mar. 25, 2023.
First Office Action issued in corresponding Chinese Application No. 202010314202.9 dated Mar. 31, 2023.
Extended European Search Report Corresponding to Application No. 21792573.4, mailed Jul. 28, 2023.

* cited by examiner

BULK ACOUSTIC WAVE RESONATOR AND FABRICATION METHOD THEREFOR

CROSS-REFERENCE TO RELATED APPLICATIONS

This application is a U.S. National Stage Entry of PCT/CN2021/088160, filed Apr. 19, 2021, which claims priority to Chinese Patent Application No. 202010313604.7 filed Apr. 20, 2020, Chinese Patent Application No. 202010314202.9 filed Apr. 20, 2020, and Chinese Patent Application No. 202010314204.8 filed Apr. 20, 2020, which are incorporated herein by reference in their entirety.

FIELD

The present disclosure relates to a bulk acoustic wave (BAW) resonator and a method for producing the BAW resonator.

BACKGROUND

In wireless communications, radio frequency (RF) filters are used to filter signals of specific frequencies to reduce interference from signals of other frequencies, so as to implement functions of image cancellation, spurious filtering, channel selection or the like in wireless transceivers. With the increasing deployment of 4G LTE networks, the RF front-ends are designed to meet the requirements of miniaturization, low power consumption, high integration, and high filtering performance. Therefore, the Film Bulk Acoustic Resonator (FBAR, which is also referred to as BAW resonator) has been widely used in radio frequency communications, because of its small size, high operating frequency, low power consumption, high quality factor (Q value), direct output of frequency signals and compatibility with CMOS process.

FBAR is a thin film device produced on a substrate material, having a sandwich structure of electrode, piezoelectric film and electrode. Regarding the structure, the FBAR may be of a cavity type, a Bragg reflection type (i.e., a SMR type), or a backside etching type. Compared with the FBAR of the SMR type, the FBAR of the cavity type has a higher Q value, a lower loss and a higher electromechanical coupling coefficient. Compared with the FBAR of the backside etching type, the FBAR of the cavity type has a higher mechanical strength because it does not require removing a large area of the substrate. Therefore, the FBAR of the cavity type is the best choice for being integrated on a CMOS device.

However, due to the complexity of production processes, existing BAW filters and bulk acoustic resonators (BAR) are produced as standalone planar or two-dimensional (2D) layout devices. That is, BAW filters and BARs have not been provided in structures integrated with other CMOS, BiCMOS SiGe HBTs and/or passive devices, resulting in high producing costs and extra processes.

In addition, the standalone 2D BAW resonator is large in volume and area, and has a low degree of integration, so that it is difficult to produce the standalone 2D BAW resonator and its driving circuit on the same chip using the CMOS technology, and it is even more difficult to integrate the standalone 2D BAW resonator with a 3D device such as a FinFET and a NAND memory. If stacking multiple 2D BAW resonators together by using the 3D packaging technology, although the integration degree can be effectively improved, each chip needs to be processed by bonding, grinding and the through-silicon vias (TSV) technology, to reduce the height of the package, which is complex and requires extremely high alignment accuracy, resulting in a high producing cost. In addition, this 3D package also has problems of complicated wiring, large parasitic impedance and the like.

SUMMARY

The objective of the present invention is to provide a BAW resonator and a method for producing the BAW resonator, to overcome the above technical obstacles. The BAW resonator is in particular a BAW resonator compatible with CMOS processes or a stacked BAW resonator.

A bulk acoustic wave (BAW) resonator is provided in the present invention, including:

a piezoelectric film array, including multiple piezoelectric films between a substrate of a chip and a capping layer on the top, where multiple first cavities are provided between adjacent piezoelectric films in the vertical direction, between the piezoelectric films and the capping layer, and between the piezoelectric films and the substrate, second cavities are shared between adjacent piezoelectric films in a first direction in a horizontal plane, and third cavities are shared between adjacent piezoelectric films in a second direction in the horizontal plane;

multiple electrode layers, covering at least the top surface and bottom surface of each of the piezoelectric films; and multiple electrode interconnection layers, connected to the electrode layers on the bottom surfaces of the piezoelectric films along sidewalls of the third cavities.

According to an embodiment of the BAW resonator in the present invention, the BAW resonator further includes a contact region formed by ion implantation, which is located in the capping layer and is electrically connected to an electrode layer at the top surface of a top piezoelectric film. Alternatively, According to an embodiment of the BAW resonator compatible with CMOS processes in the present invention, the BAW resonator further includes a driving transistor located in the capping layer, and a drain electrode of the driving transistor is electrically connected to an electrode layer at the top surface of a top piezoelectric film, where an ohmic contact layer is provided on a source electrode and the drain electrode of the drive transistor. Alternatively, according to an embodiment of the BAW resonator compatible with CMOS processes in the present invention, the BAW resonator further includes a driving transistor located in the capping layer, and a drain electrode of the driving transistor is electrically connected to an electrode layer at the top surface of a top piezoelectric film, where optionally the second cavities have the same width in the first direction, and optionally the width of a pad in the second direction is greater than or equal to 1.5 times the width of the third cavities.

In an embodiment, an electrode layer, a first isolation layer and an electrode interconnection layer are provided between each of the first cavities and the shared third cavities, and optionally an electrode layer and a second isolation layer surround each of the first cavities.

Optionally an interlayer dielectric layer is provided above the contact region, and a wiring layer is provided in the interlayer dielectric layer, preferably an intermetallic dielectric layer and at least one redistribution layer are provided above the interlayer dielectric layer, preferably a pad and a passivation layer are provided above the intermetallic dielectric layer and the redistribution layer, preferably a length that the interlayer dielectric layer extends into the second cavities or the third cavities is less than or equal to ⅓ of the thickness of the capping layer 3, optionally an ohmic contact layer is provided on the contact area. Alternatively, according to an embodiment of the BAW resonator compatible with CMOS processes in the present invention, an interlayer dielectric layer is provided above the driving transistor, and a contact plug is provided in the interlayer dielectric layer, and preferably an intermetallic dielectric layer and a redistribution layer are provided above the interlayer dielectric layer, and preferably a length that the interlayer dielectric layer extends into the second cavities or the third cavities is less than or equal to ⅓ of the thickness of the capping layer. Alternatively, according to an embodiment of the stacked BAW resonator in the present invention, an interlayer dielectric layer is provided above the driving transistor, and a contact plug is provided in the interlayer dielectric layer, and preferably an intermetallic dielectric layer and a redistribution layer are provided above the interlayer dielectric layer.

In some embodiments, the material of the substrate and/or the capping layer is selected from bulk Si, silicon-on-insulator (SOI), bulk Ge, GeOI, GaN, GaAs, SiC, InP, or GaP, and preferably the material of the substrate is the same as the material of the capping layer; optionally the material of the electrode layer and/or the electrode interconnection layer and/or the pad is selected from elemental metal of, alloy of, conductive oxide of or conductive nitride of Mo, W, Ru, Al, Cu, Ti, Ta, In, Zn, Zr, Fe, or Mg, or any combination thereof; optionally the material of the piezoelectric films is ZnO, AlN, BST, BT, PZT, PBLN, or PT; optionally the material of the first isolation layer and/or the second isolation layer is SiOx, SiOC, SiOC, SiOF, SiFC, BSG, PSG, or PBSG, or any combination thereof; and preferably the material of the first isolation layer is the same as the material of the second isolation layer; optionally the ohmic contact layer is made of metal silicide or metal germanide; and optionally the material of the passivation layer is silicon oxide, silicon nitride or organic resin.

Particularly, according to some embodiments of the stacked BAW resonator in the present invention, optionally the material of the pad is Al, Mg, or In, or any combinations thereof.

According to some embodiments of the BAW resonator in the present invention (except for the stacked BAW resonator in the present invention), optionally the interlayer dielectric layer and/or the intermetallic dielectric layer is made of a low-k material. Particularly, according to an embodiment of the BAW resonator compatible with CMOS processes in the present invention, optionally the interlayer dielectric layer is made of a low-k material.

According to another aspect of the present invention, a stacked BAW resonator package structure is provided, including a first stacked resonator on a first wafer and a second stacked resonator on a second wafer, the first wafer being oppositely bonded to the second wafer, where the first stacked resonator and second stacked resonator each are the stacked BAW resonator according to any of the above embodiments.

According to the present invention, a method for producing a bulk acoustic wave (BAW) resonator is provided. The BAW resonator is in particular a BAW resonator compatible with CMOS processes or a stacked BAW resonator. The method includes:

forming multiple sacrificial layers and multiple piezoelectric layers which are alternately stacked on a substrate;

forming a capping layer on a top sacrificial layer, and forming a hard mask on the capping layer;

forming multiple first openings extending along a first direction by etching the aforementioned layers in sequence until the substrate is exposed;

forming a first isolation layer in each opening;

forming multiple second openings extending along a second direction by etching until the substrate is exposed;

removing the plurality of sacrificial layers through the second openings, to form multiple first cavities between adjacent piezoelectric layers, between the piezoelectric layers and the capping layer, and between the piezoelectric layers and the substrate;

forming multiple electrode layers on at least top surfaces and bottom surfaces of the piezoelectric layers through the second openings; and forming, in the first openings, electrode interconnection layers connected to electrodes at the bottom surfaces of the piezoelectric layers.

In an embodiment, an electrode layer, a first isolation layer and an electrode interconnection layer are formed between each of the first cavities and shared third cavities; and optionally an electrode layer and a second isolation layer that surround each of the first cavities are formed.

A contact region electrically connected to an electrode layer at the top surface of a top piezoelectric layer is formed by performing an ion implantation process on the capping layer. Alternatively, according to some embodiments of the BAW resonator compatible with CMOS processes in the present invention, a driving transistor is formed in the capping layer, where a drain electrode of the driving transistor is electrically connected to an electrode layer at the top surface of a top piezoelectric layer, and an ohmic contact layer is formed on the source/drain electrode of the driving transistor. Alternatively, according to some embodiments of the stacked BAW resonator in the present invention, a driving transistor is formed in the capping layer, where a drain electrode of the driving transistor is electrically connected to an electrode layer at the top surface of a top piezoelectric layer, optionally second cavities have the same width in the first direction; and optionally the width of a pad in the second direction is greater than or equal to 1.5 times the width of third cavities.

Optionally, an interlayer dielectric layer is formed above the driving transistor and a wiring layer is formed in the interlayer dielectric layer, preferably an intermetallic dielectric layer and at least one redistribution layer are formed above the interlayer dielectric layer; more preferably a pad and a passivation layer are formed above the intermetallic dielectric layer and the redistribution layer, where preferably a length that the interlayer dielectric layer extends into the second cavities or the third cavities is less than or equal to ⅓ of the thickness of the capping layer; and optionally an annealing process is performed after forming the wiring layer, so that metal reacts with the semiconductor material of the contact region to form an ohmic contact layer. Alternatively, according to some embodiments of the BAW resonator in the present invention, optionally an interlayer dielectric layer is formed above the driving transistor and a contact plug is formed in the interlayer dielectric layer; and preferably an intermetallic dielectric layer and a redistribution layer are formed above the interlayer dielectric layer, where preferably a length that the interlayer dielectric layer extends into the second cavities or the third cavities is less than or equal to ⅓ of the thickness of the capping layer. Alternatively, according to some embodiments of the stacked BAW resonator in the present invention, an interlayer dielectric layer is formed above the driving transistor and a contact plug is formed in the interlayer dielectric layer; and preferably an intermetallic dielectric layer and a redistribution layer are formed above the interlayer dielectric layer.

In some embodiments, the material of the substrate and/or the capping layer is selected from bulk Si, silicon-on-insulator (SOI), bulk Ge, GeOI, GaN, GaAs, SiC, InP, or GaP, and preferably the material of the substrate is the same as the material of the capping layer; optionally the material of the electrode layer and/or the electrode interconnection layer and/or the pad is selected from elemental metal of, alloy of, conductive oxide of or conductive nitride of Mo, W, Ru, Al, Cu, Ti, Ta, In, Zn, Zr, Fe, or Mg, or any combination thereof; optionally the material of the piezoelectric films is ZnO, AlN, BST, BT, PZT, PBLN, or PT; optionally the material of the first isolation layer and/or the second isolation layer is SiOx, SiOC, SiOC, SiOF, SiFC, BSG, PSG, or PBSG, or any combination thereof; and preferably the material of the first isolation layer is the same as the material of the second isolation layer; optionally the ohmic contact layer is made of metal silicide or metal germanide; and optionally the material of the passivation layer is silicon oxide, silicon nitride or organic resin.

Particularly, according to some embodiments of the stacked BAW resonator in the present invention, optionally the material of the pad is Al, Mg, or In, or any combinations thereof.

According to some embodiments of the BAW resonator in the present invention (except for the stacked BAW resonator in the present invention), optionally the interlayer dielectric layer and/or the intermetallic dielectric layer is made of a low-k material. Particularly, according to an embodiment of the BAW resonator compatible with CMOS processes in the present invention, optionally the interlayer dielectric layer is made of a low-k material.

According to some embodiments of the BAW resonator in the present invention (except for the stacked BAW resonator in the present invention), the contact region is formed by selectively performing the ion implantation process using a mask and then performing a first annealing process. Particularly, according to some embodiments of the BAW resonator compatible with CMOS processes in the present invention, a shallow source region and a deep drain region are formed by selectively performing an ion implantation process with a mask and performing a first annealing process.

Particularly, according to some embodiments of the BAW resonator compatible with CMOS processes in the present invention (except for the stacked BAW resonator in the present invention), a process of forming the ohmic contact layer includes:

forming a metal layer on a source region and a drain region, and performing a second annealing process so that the metal layer reacts with a semiconductor material of the capping layer to form metal silicide or metal germanide, where preferably the metal layer is made of W, Co, Pt, Ti, Ni, or Ta, or any combination thereof.

In some embodiments, the second annealing process includes:

step a1), performing a low-temperature annealing process at a first temperature so that the metal layer reacts with the semiconductor material in the contact region to form a silicon-rich or germanium-rich compound; and step a2), performing a high-temperature annealing process at a second temperature to convert the silicon-rich or germanium-rich compound to be in a low resistance state, wherein the second temperature is higher than the first temperature;

where preferably the annealing in step a2) is combined with the first annealing process; and preferably the first temperature is lower than 450 degrees Celsius, and the second temperature is 450 to 650 degrees Celsius.

In some embodiments, after forming the bonding pad and the passivation layer, the method further includes: treating the surface of the passivation layer to enhance bond strength and/or repair surface damage; and/or forming a conductive bump on the pad pattern for external electrical connection.

More particularly, according to some embodiments of the BAW resonator compatible with CMOS processes in the present invention, a process of forming the ohmic contact layer includes:

a) forming a metal layer on the source region and the drain region, and performing a second annealing process so that the metal layer reacts with a semiconductor material of the capping layer to form metal silicide or metal germanide, where preferably the metal layer is made of W, Co, Pt, Ti, Ni, or Ta; or b) forming the ohmic contact layer in-situ while forming a source region and a drain region by the ion implantation process, where preferably the ohmic contact layer is made of silicide or germanide of W, Co, Pt, Ti, Ni, or Ta.

In some embodiments, step a) includes:

step a1), performing a low-temperature annealing process at a first temperature so that the metal layer reacts with the semiconductor material in the contact region to form a silicon-rich or germanium-rich compound; and step a2), performing a high-temperature annealing process at a second temperature to convert the silicon-rich or germanium-rich compound to be in a low resistance state, where the second temperature is higher than the first temperature;

where preferably the annealing in step a2) is combined with the first annealing process; and preferably the first temperature is lower than 450 degrees Celsius, and the second temperature is 450 to 650 degrees Celsius.

In some embodiments, in step b), a target material for the ion implantation process is a compound of implanted ions and the metal contained in the ohmic contact layer, preferably the implanted ions are As, P, Sb, or B, and the metal is W, Co, Pt, Ti, Ni, or Ta; and preferably, the implanted ions are selected by a first mass analyzer and implanted vertically, and alternately ions of the metal are selected by a second mass analyzer and guided to the surface of the source region and the drain region at an inclination; preferably the energy of the implanted ions is greater than the energy of the ions of the metal.

According to another aspect of the present invention, a method for producing a BAW resonator packaging structure is further provided, including:

producing a first BAW resonator on a first wafer by the method for producing a BAW resonator according to any of the above embodiments;

producing a second BAW resonator on a second wafer by the method for producing a BAW resonator according to any of the above embodiments;

bonding the first wafer and the second wafer oppositely;

preferably thinning a second substrate of the second wafer after bonding the first wafer and the second wafer; and preferably forming a bonding pad and a passivation layer on the thinned second substrate.

According to the BAW resonator and the method of producing the BAW resonator in the present invention, a CMOS compatible process is used to produce a three-dimensional resonator in which multiple cavities surround a piezoelectric film. Furthermore, in some embodiments of the present invention, a contact region or driving circuit electrically connected to the top electrode of the piezoelectric film is formed by deep ion implantation in the top capping layer, which reduces the package volume and reduces the interface resistance. In some embodiments of the present invention, especially in the embodiments of the stacked BAW resonator, the driving circuit is formed in the capping layer, and a redistribution layer is used to bond multiple chips together, which reduces the volume, increases the integration degree and reduces the cost.

The stated objective of the invention, as well as other objectives not listed here, are achieved by the solutions defined as the independent claims of the present application. Various embodiments of the invention are defined in the independent claims and specific features are defined in the dependent claims.

BRIEF DESCRIPTION OF THE DRAWINGS

The technical solutions of the present invention will be described in detail below with reference to the accompanying drawings, in which.

DETAILED DESCRIPTION

Figure 1A:
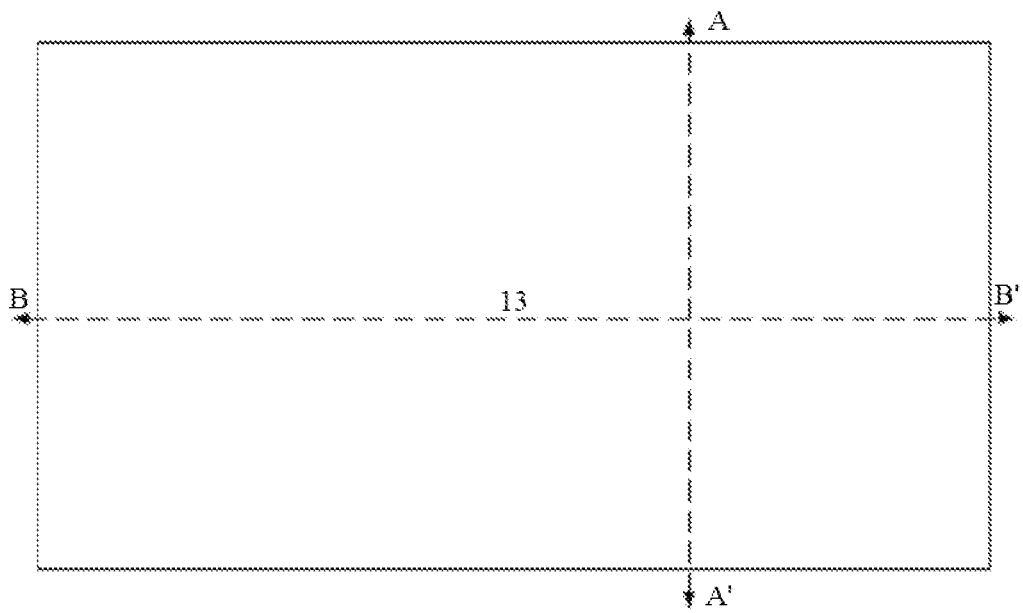
FIG. 1A shows a plan view of a resonator in a producing process according to an embodiment of the present invention.

The features and technical effects of the technical solutions of the present invention are described in detail below with reference to the accompanying drawings and the schematic embodiments. A BAW resonator and a method for producing the BAW resonator are disclosed, where the BAW resonator is especially a BAW resonator compatible with CMOS processes, or is a stacked BAW resonator. It should be noted that similar reference numerals denote similar structures, and the terms "first", "second", "upper", "lower", and the like used in this specification may be used for various device structures, which do not imply a spatial, sequential, or hierarchical relationship of the device structures unless specifically stated.

Figure 1B:
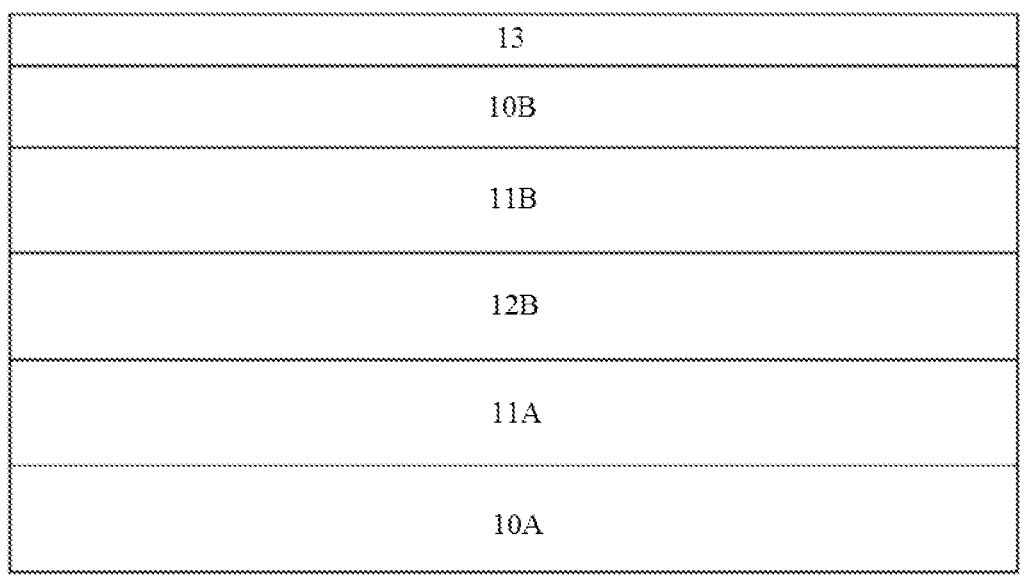
FIG. 1B shows a cross-sectional view along line B-B' of FIG. 1A.
Figure 1C:
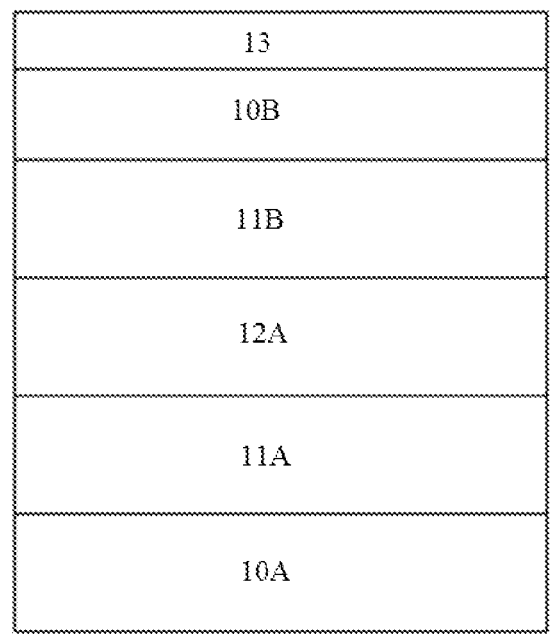
FIG. 1C shows a cross-sectional view along line A-A' of FIG. 1A.

As shown in FIGS. 1A-1C, a stacked structure is formed on a substrate 10A. The stacked structure includes one or more sacrificial layers 11A-11B (the actual number is optional N+1, N being a natural number) and one or more piezoelectric layers 12A (the number may be N, N being a natural number) which are alternately stacked from bottom to top. The number of the sacrificial layers is preferably greater than the number of the piezoelectric layers by one. In this embodiment of the present invention, only one piezoelectric layer 12A is illustrated, but other embodiments of the present invention are not limited thereto. That is, a stack of more than one piezoelectric layers may be formed. The material of the substrate 10A may be bulk Si, silicon-on-insulator (SOD, bulk Ge, or GeOI, so as to be compatible with CMOS processes and integrated with other digital and analog circuits. Alternatively, the material of the substrate 10A may be compound semiconductors, such as GaN, GaAs, SiC, InP, GaP, or other materials used for MEMSs, optoelectronic devices, and power devices. Alternatively, the material of the substrate 10A may be transparent insulating materials, such as glass, plastic, sapphire, or other materials used for display panels. In a preferred embodiment of the invention, the substrate 10A is monocrystal, such as bulk Si, to facilitate epitaxial growth of a stacked structure.

Through a conventional process such as PECVD, UHVCVD, HDPCVD, MOCVD, MBE, ALD, at least one sacrificial layer 11A-11B (the number of which is not limited to 2, but N+1, N is a natural number) and at least one piezoelectric layer 12A (the number of which is not limited to 1, but an arbitrary natural number N) are epitaxially generated and alternately stacked on the substrate 10A. The sacrificial layer materials are made of a semiconductor material such as SiGe, SiGeC, SiGeSn, SiGaN, SiGaP, SiGaAs, InSiN, InSiP, InSiAs, InSiSb, SiInGaAs, or made of a non-semiconductor material such as amorphous carbon and (oxidized) graphene. The piezoelectric layer is made of a material such as ZnO, AlN, BST (barium strontium titanate), BT (barium titanate), PZT (lead zirconate titanate), PBLN (lead barium lithium niobate), PT (lead titanate) and other ceramic materials. Preferably, the number of the sacrificial layers is greater than the number of the piezoelectric layers by one. Preferably, the stacked structure further includes a capping layer 10B formed on the top sacrificial layer 11D. The material of the capping layer 10B is preferably the same as that of the substrate 10A, to serve as the upper capping plate of the topmost resonant cavity in the subsequent process.

Figure 2A:
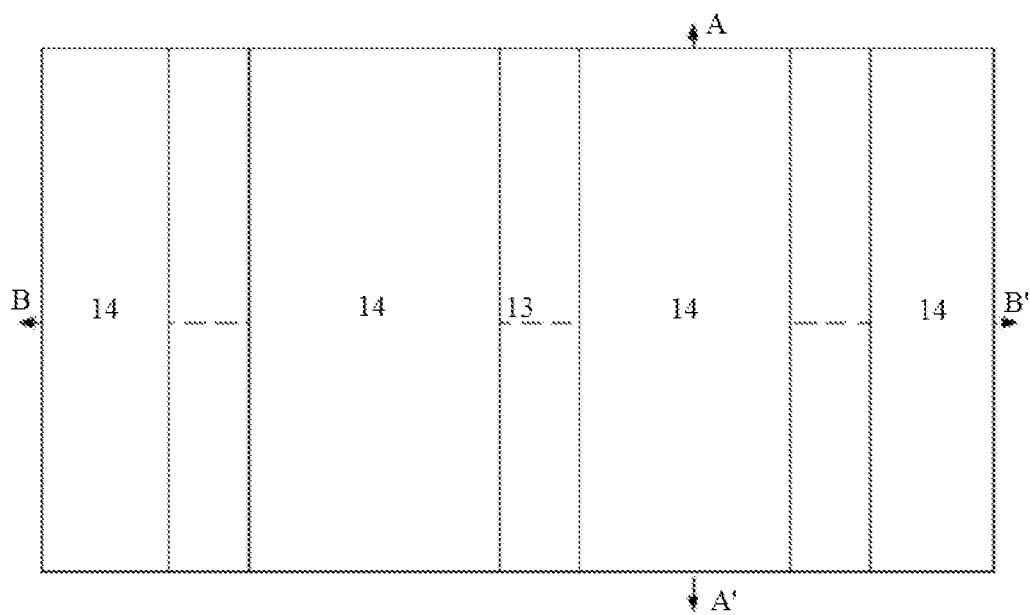
FIG. 2A shows a plan view of a resonator in a producing process according to an embodiment of the present invention.
Figure 2B:
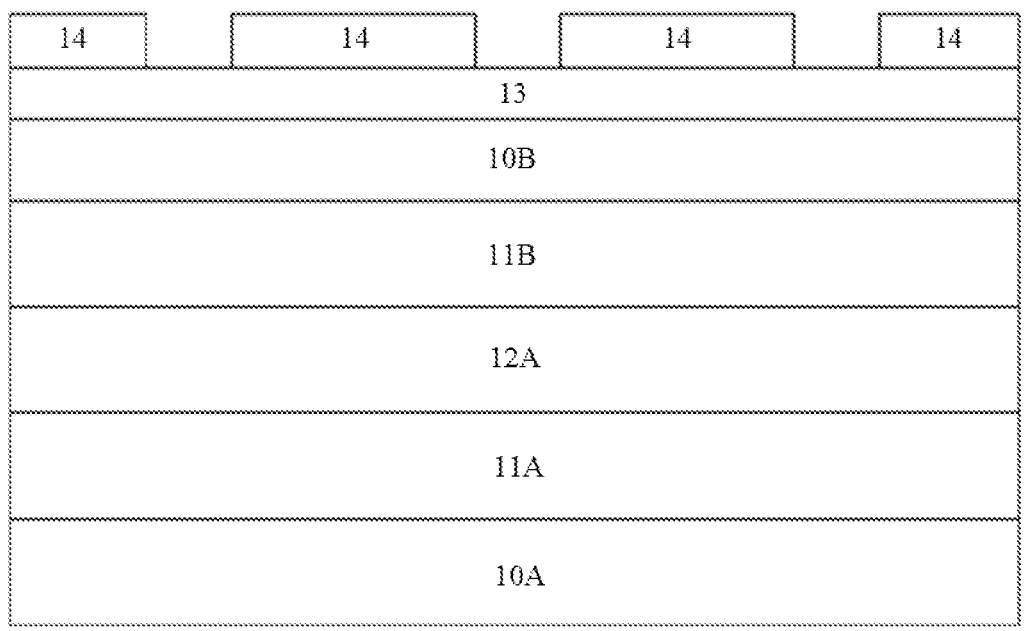
FIG. 2B shows a cross-sectional view along line B-B' of FIG. 2A.
Figure 2C:
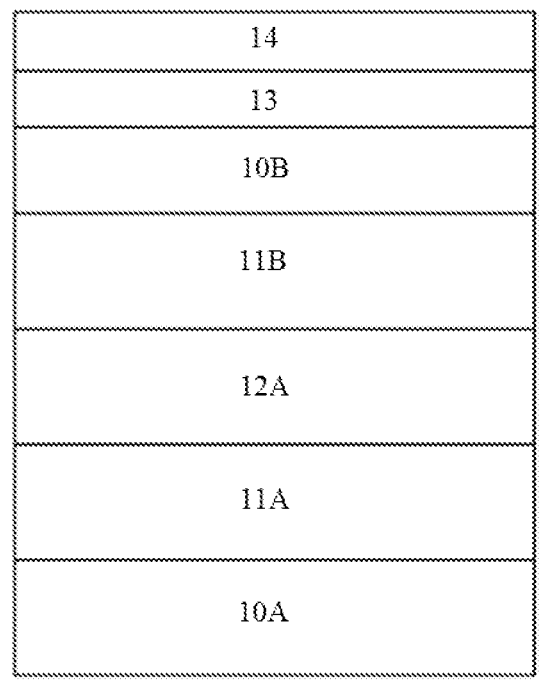
FIG. 2C shows a cross-sectional view along line A-A' of FIG. 2A.

As shown in FIGS. 2A-2C, a hard mask layer 13 is formed on top of the stacked structure to protect the stacked structure, especially protecting the capping layer 10B on top of the stacked structure, in subsequent processes. The hard mask layer 13 is deposited by a process of LPCVD, PECVD, HDPCVD or other processes, and is made of a material of SiN, SiON, SiNC, SiNF or the like. Next, a photoresist pattern 14 is formed on top of the hard mask layer 13. A photoresist coating is formed by a process of spin coating, spray coating or screen printing, and then exposure and development are performed to form the photoresist pattern 14. The photoresist pattern extends along the first direction A-A', having openings extending along the first direction between adjacent photoresist patterns (in the second direction B-B') to expose the hard mask layer 13.

Figure 3A:
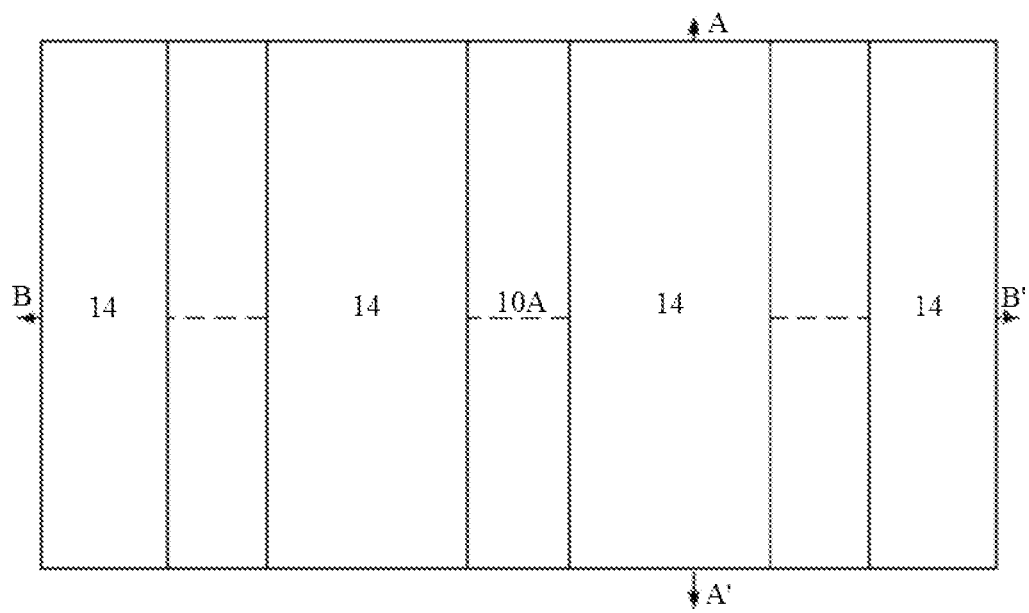
FIG. 3A shows a plan view of a resonator in a producing process according to an embodiment of the present invention.
Figure 3B:
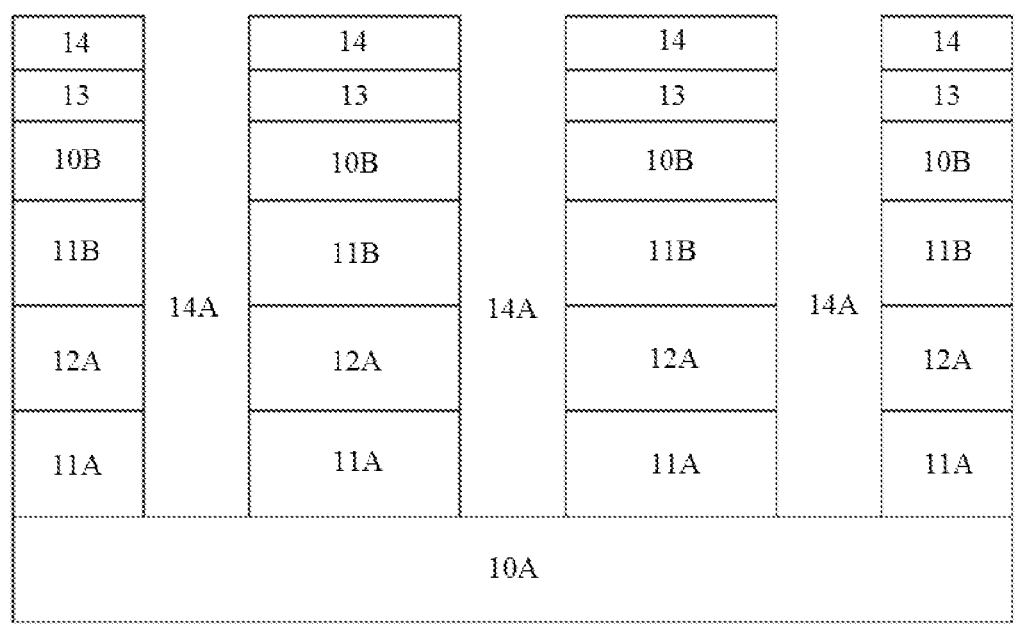
FIG. 3B shows a cross-sectional view along line B-B' of FIG. 3A.
Figure 3C:
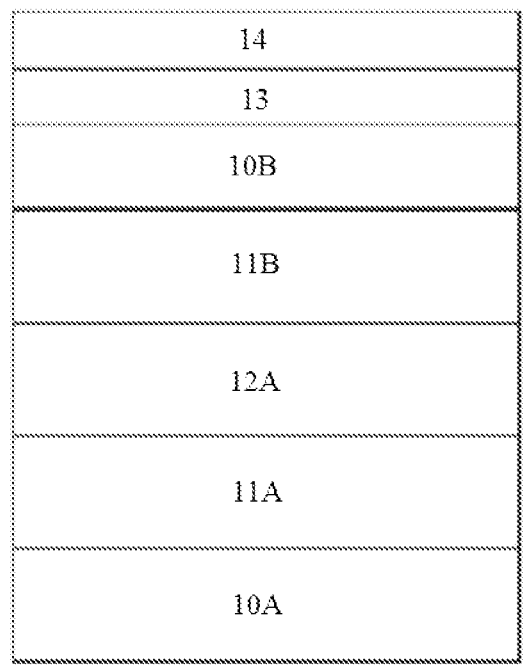
FIG. 3C shows a cross-sectional view along line A-A' of FIG. 3A.

As shown in FIGS. 3A to 3C, using the photoresist pattern 14 as a mask, the hard mask layer 13, the capping layer 10B, and the stacked structure of the sacrificial layer 11 and the piezoelectric film 12 are etched in sequence. The etching process stops when reaching the substrate 10A, so that the above-mentioned layers are penetrated vertically until the substrate 10A are exposed to form multiple first openings 14A. The etching process is preferably an anisotropic dry etching process, such as plasma dry etching or reactive ion etching using a fluorocarbon-based etching gas. Since the substrate 10A is made of a semiconductor material such as Si and does not contain elements commonly contained in insulating materials such as C, N, and O, the time to stop the etching can be determined by observing the change in the wavelength spectrum of the atmosphere in the etching chamber. For example, when the intensity of a plasma glow signal corresponding to the CN and/or NO group is monitored as being decreased to 1% of the peak value, especially 0.2% or less, and remaining unchanged for 10 to 500 microseconds, it is determined that the etching has reached the top of the substrate 10A.

Figure 4A:
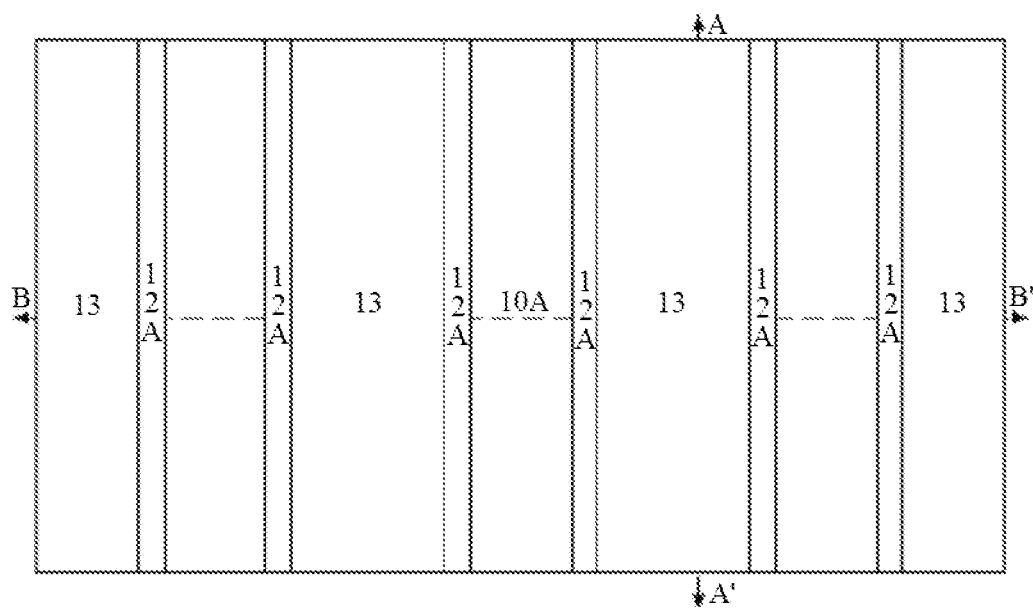
FIG. 4A shows a plan view of a resonator in a producing process according to an embodiment of the present invention.
Figure 4B:
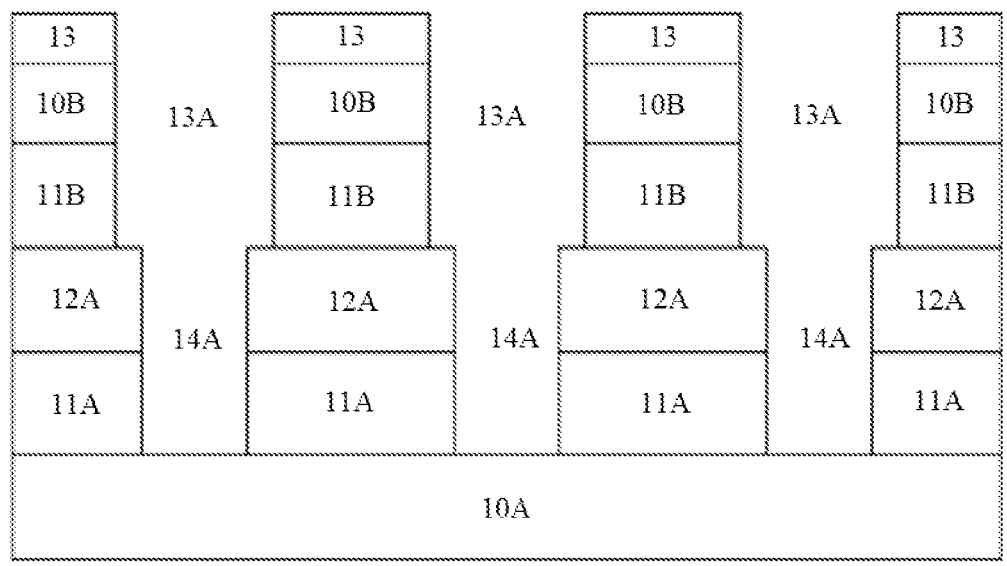
FIG. 4B shows a cross-sectional view along line B-B' of FIG. 4A.
Figure 4C:
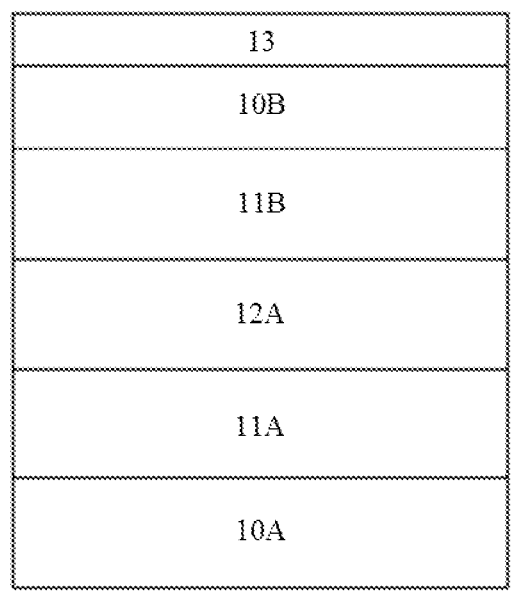
FIG. 4C shows a cross-sectional view along line A-A' of FIG. 4A.

As shown in FIGS. 4A-4C, the width of an upper portion of the first opening 14A is enlarged, so that the width of the upper portion, i.e., a second portion 13A, of the first opening along the B-B' direction is larger than that of a first portion 14A below the second portion 13A, and the second portion 13A exposes a part of the top surface of the piezoelectric layer 12A. A second photoresist pattern with a smaller size is formed, or the photoresist pattern 14 is subjected to a shrinking process to reduce the size of the photoresist pattern. The photoresist pattern with the smaller size is used as a mask layer to etch the cap larer 10B and the sacrificial layer 11B until the piezoelectric layer 12A is exposed. Subsequently, the photoresist pattern 14 is removed to expose the hard mask layer 13. Preferably a wet process is used to remove the organic photoresist with an acid and/or an oxidizing agent, thereby leaving multiple T-shaped first openings each includes a narrow first portion 14A extending along the first direction A-A' and a wide second portion 13A above the first portion 14A. Preferably, a wet method using a HF-based etching solution such as dHF and dBOE is performed to remove the native oxides on the surface of each layer, so as to improve the quality of thin films growed subsequently.

Figure 5A:
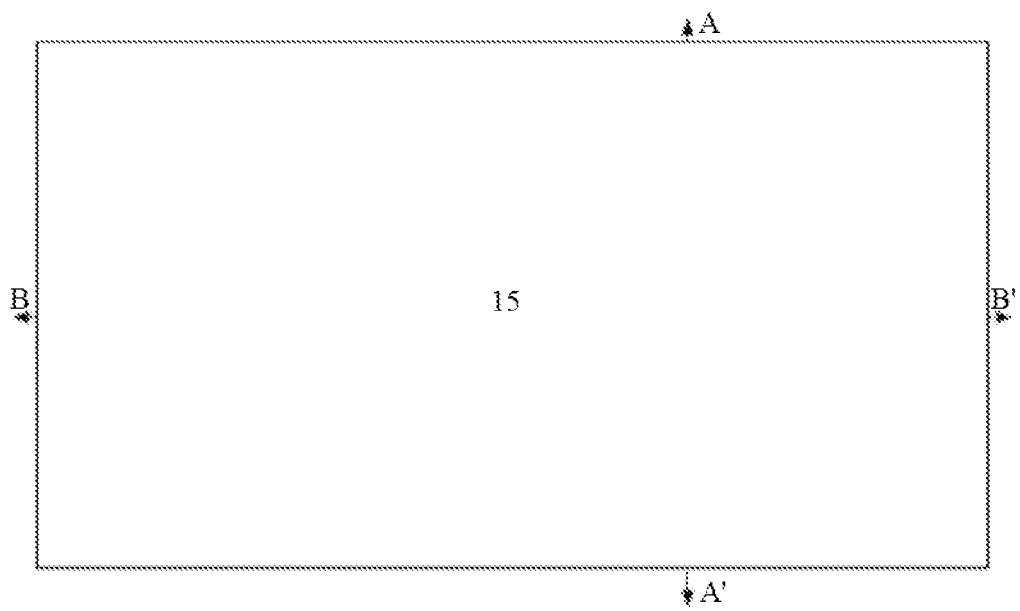
FIG. 5A shows a plan view of a resonator in a producing process according to an embodiment of the present invention.
Figure 5B:
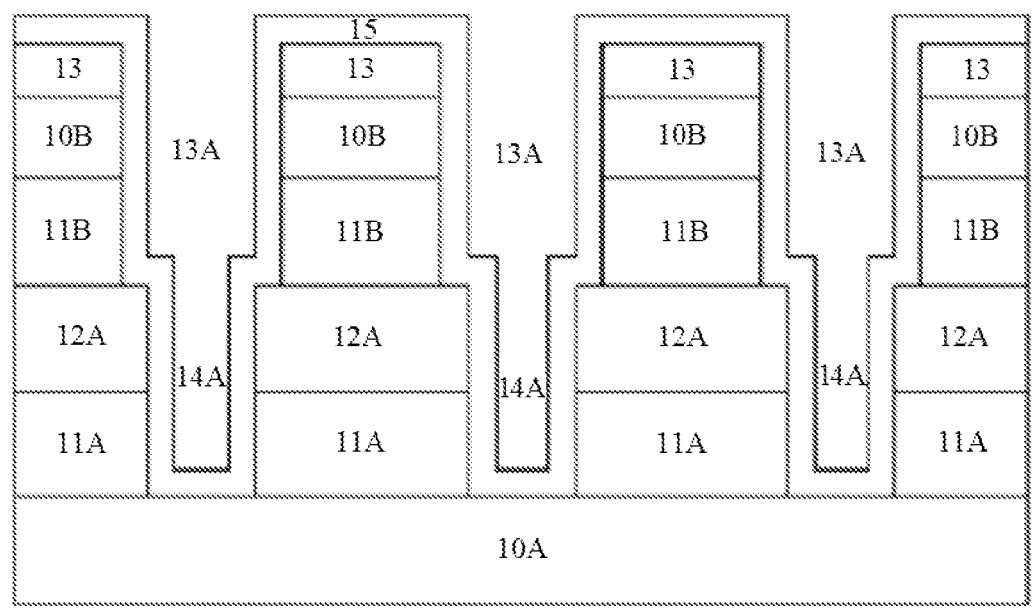
FIG. 5B shows a cross-sectional view along line B-B' of FIG. 5A.
Figure 5C:
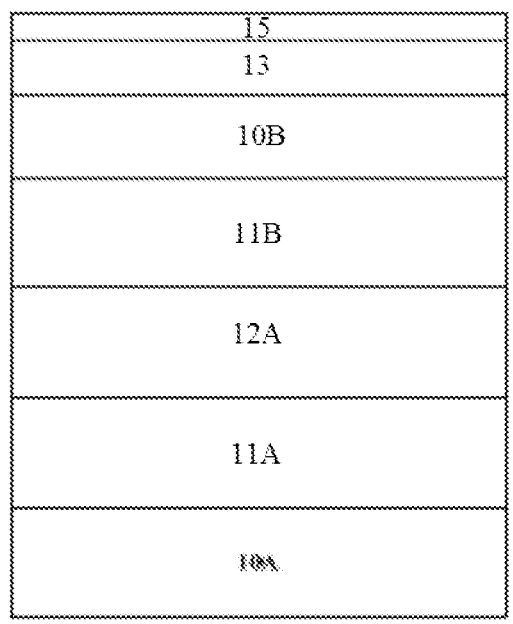
FIG. 5C shows a cross-sectional view along line A-A' of FIG. 5A.

As shown in FIGS. 5A-5C, an isolation layer 15 is formed over the entire device. Preferably, the isolation layer 15 is formed by a process with good conformality, such as HDPCVD, MBE, ALD, in-situ water vapor doping thermal oxidation/nitridation. The mertial of the isolation layer 15 is an insulating dielectric material different from that of the hard mask 13, such as SiOC, SiOF, SiFC, BSG, PSG and PBSG. The isolation layer 15 uniformly covers the first part 14A, the second part 13A and the top of the hard mask 13, especially covering the sidewalls of the sacrificial layer 11 and the piezoelectric layer 12 exposed by the first part 14A and the second part 13A. The isolation layer 15 will be used as an insulating isolation material between sub-resonators of the stacked BAW in the subsequent processes, and will be used as a temporary mechanical support in the subsequent processes. Preferably, the thickness of the isolation layer 15 is 1 nm to 50 nm and preferably 10 nm to 25 nm. If the isolation layer is too thin, it cannot provide sufficient mechanical support, and if the isolation layer is too thick, the bottom of the first portion 14A will be filled up too soon. Preferably, twice of the thickness of the isolation layer 15 is less than $1/4$, preferably $1/8$, but greater than or equal to $1/10$, of the width of the first portion 14A of the first opening.

Figure 6A:
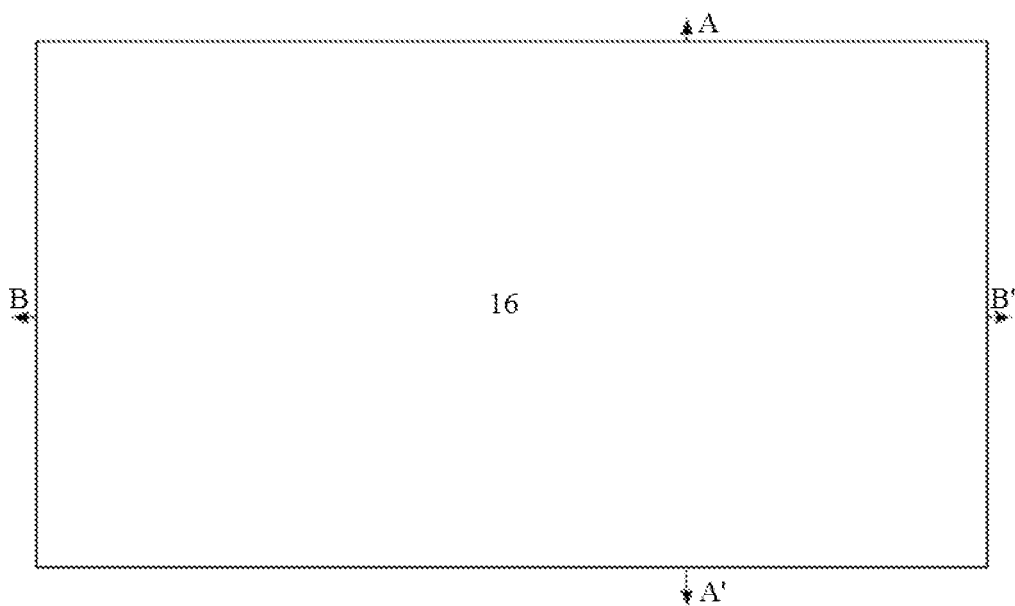
FIG. 6A shows a plan view of a resonator in a producing process according to an embodiment of the present invention.
Figure 6B:
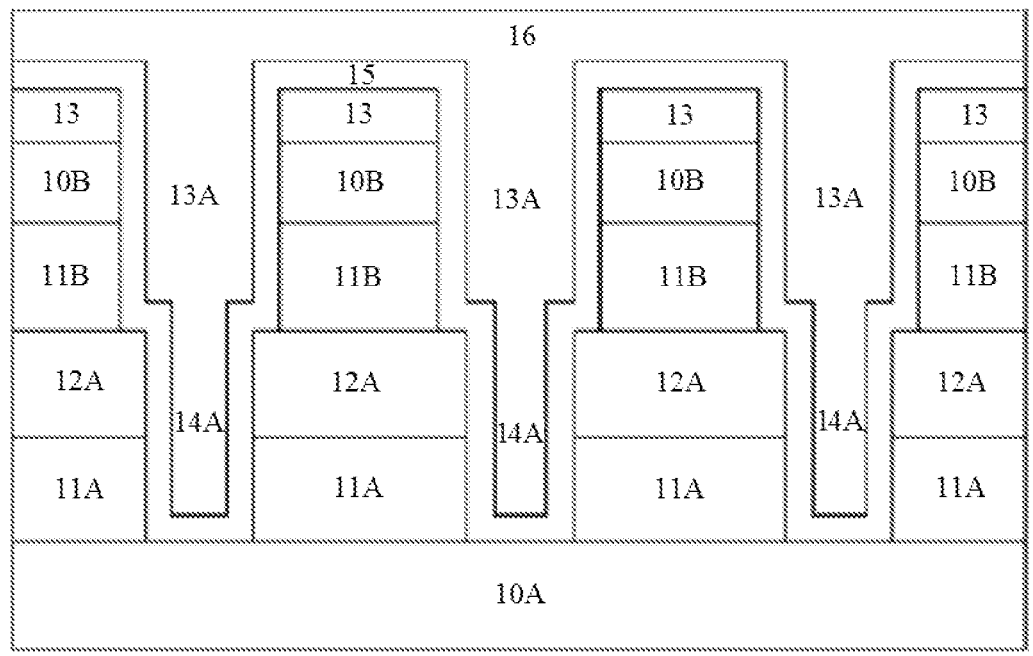
FIG. 6B shows a cross-sectional view along line B-B' of FIG. 6A.
Figure 6C:
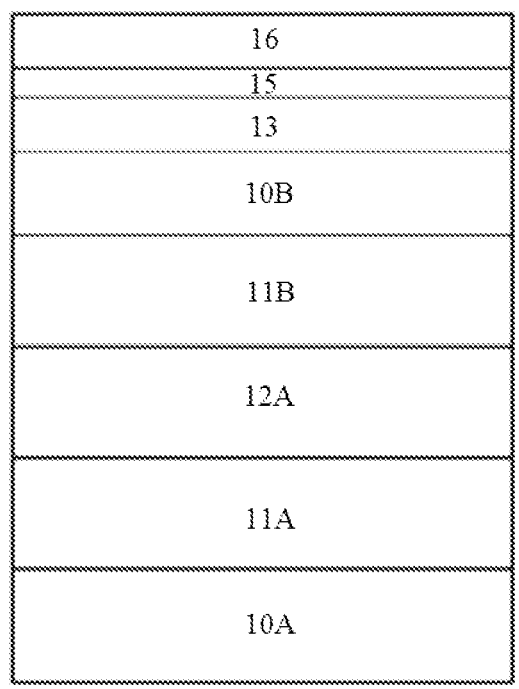
FIG. 6C shows a cross-sectional view along line A-A' of FIG. 6A.

As shown in FIGS. 6A-6C, a photoresist layer 16 is formed on the entire device by spin coating, spray coating or screen printing, and completely fills the first portion 14A and the second portion 13A of the first opening.

Figure 7A:
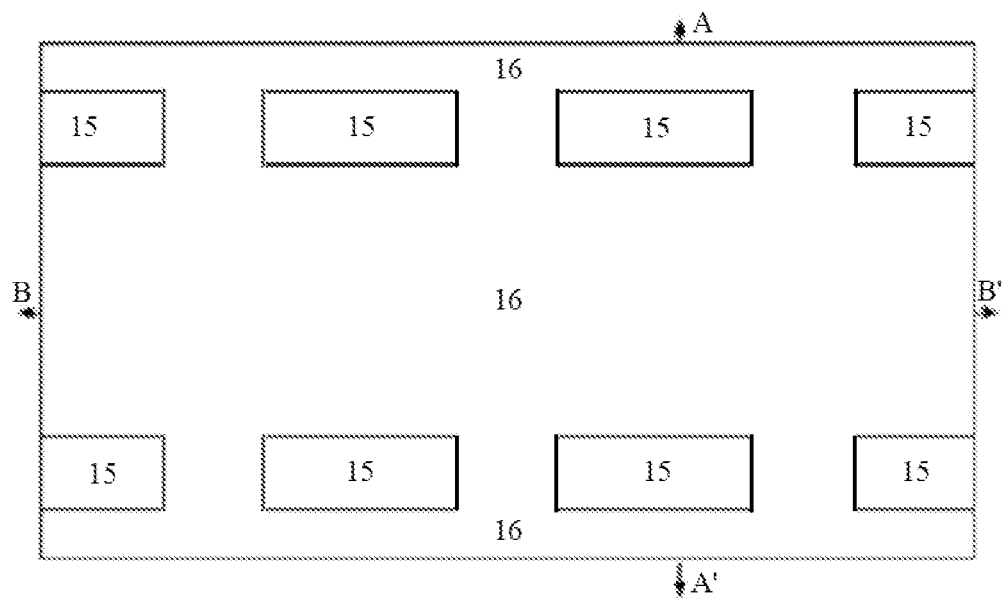
FIG. 7A shows a plan view of a resonator in a producing process according to an embodiment of the present invention.
Figure 7B:
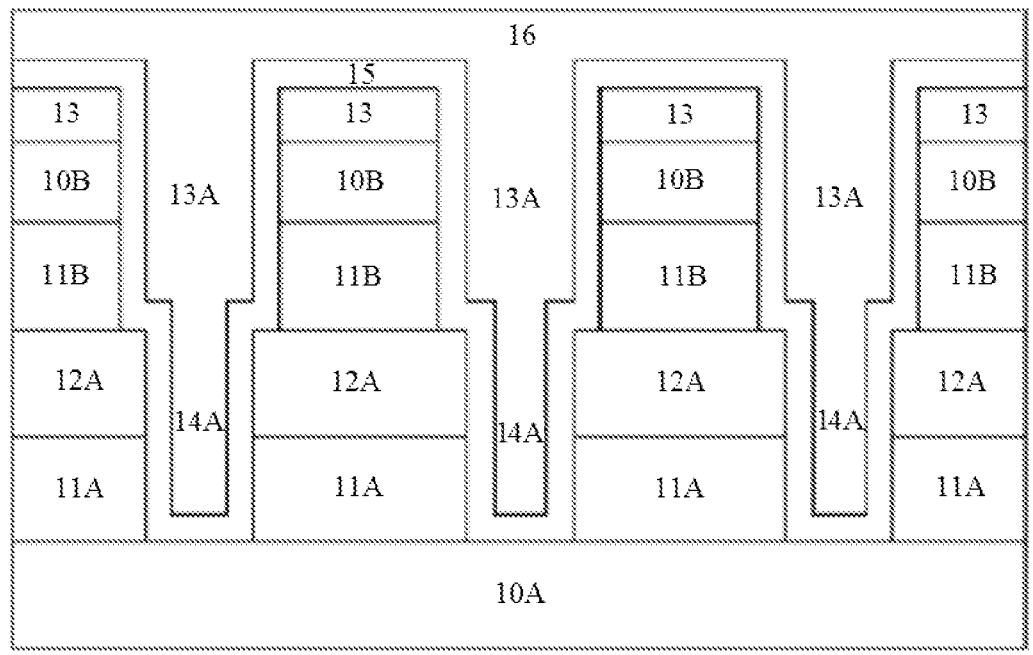
FIG. 7B shows a cross-sectional view along line B-B' of FIG. 7A.
Figure 7C:
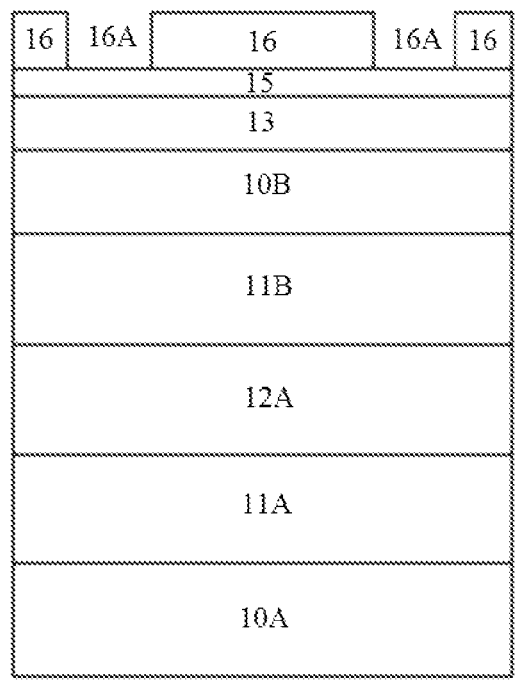
FIG. 7C shows a cross-sectional view along line A-A' of FIG. 7A.

As shown in FIGS. 7A-7C, the photoresist layer 16 is patterned by an exposure and development process, forming multiple second openings 16A extending along the second direction B-B' to expose the isolation layer 15 below. Preferably, the second opening 16A is not continuous in the second direction but is divided into multiple sub-sections so as to retain the intermittent isolation layer pattern 15 below, so as to avoid local collapse due to completely breaking of the isolation layer 15 in the first direction A-A' in the subsequent process of removing the sacrificial layer. Further preferably, the wavelength and dose used in the exposure and development process are selected such that the corners of the opening 16A are rounded, so as to reduce the degree of stress concentration at the right corner of the rectangle to ensure the good mechanical support performance of the isolation layer 15.

Figure 8A:
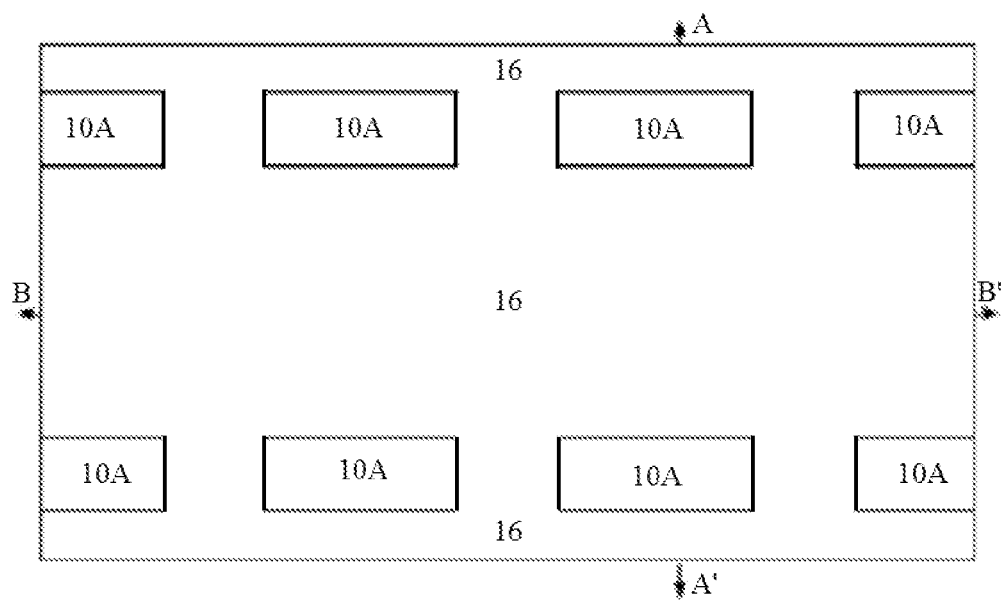
FIG. 8A shows a plan view of a resonator in a producing process according to an embodiment of the present invention.
Figure 8B:
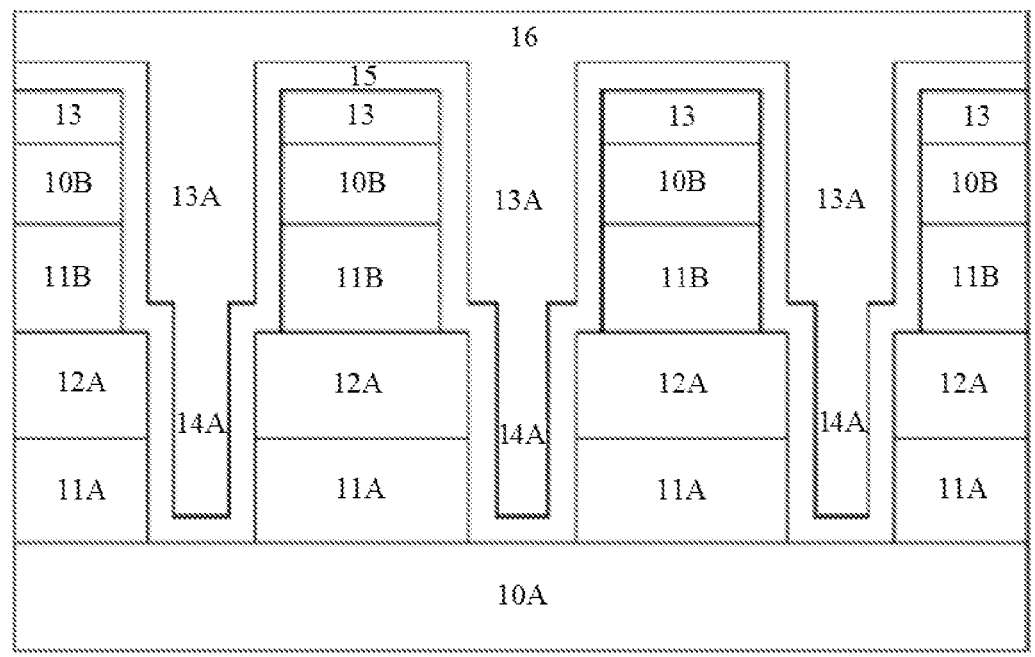
FIG. 8B shows a cross-sectional view along line B-B' of FIG. 8A.
Figure 8C:
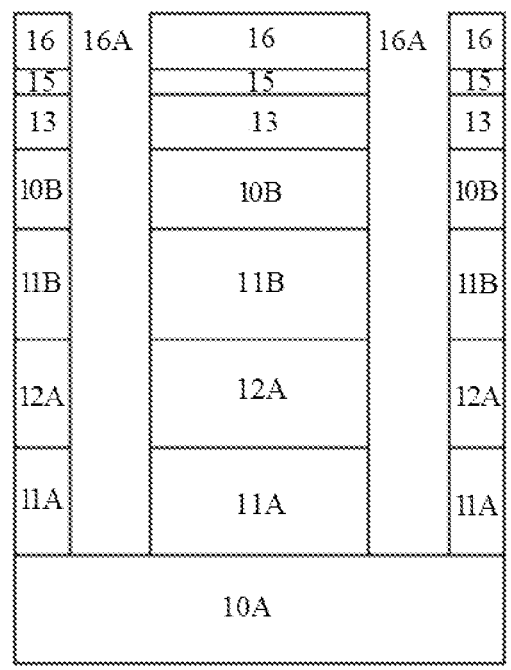
FIG. 8C shows a cross-sectional view along line A-A' of FIG. 8A.

As shown in FIGS. 8A-8C, using the photoresist pattern 16 as a mask, an anisotropic dry etching process, such as plasma dry etching or reactive ion etching using a fluorocarbon-based etching gas, is used to etch the isolation layer 15, the hard mask layer 13, the capping layer 10B, and the stacked structure of the sacrificial layers 11 and the piezoelectric layer 12s in sequence, until reaching the substrate 10A. That is, the depth of the multiple openings 16A are increased until the substrate 10A is exposed. The etching process preferably is performed by using a gas with a large carbon-fluorine ratio, such as CFH3, C2F3H3 and CF2H2, so that carbon C and elements such as Si, and N form a temporary protective layer on the sidewalls during the etching process to restrain lateral corrosion and ensure sufficient verticality of the sidewalls of the second opening 16A.

Figure 9A:
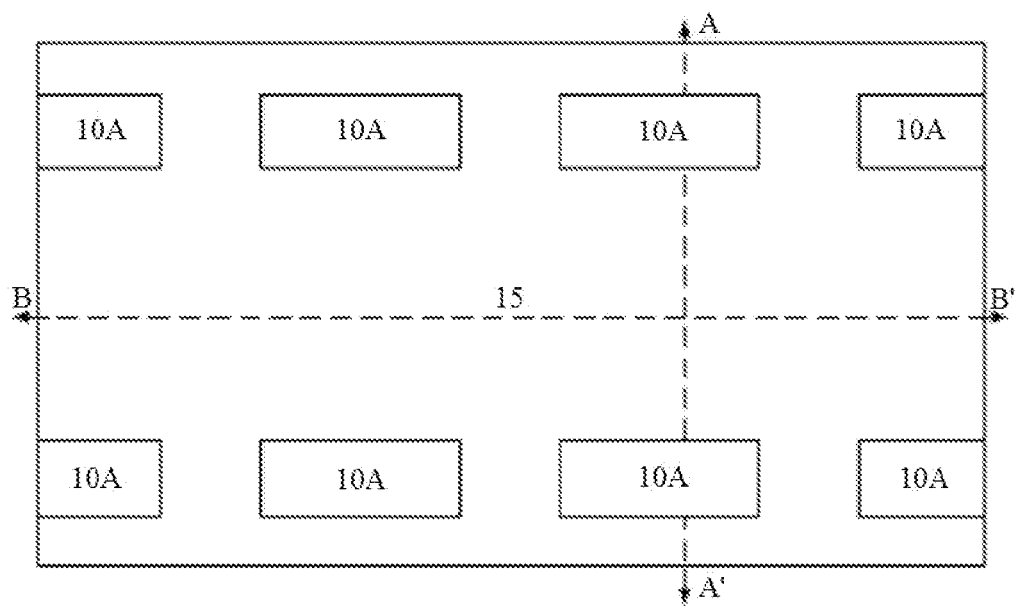
FIG. 9A shows a plan view of a resonator in a producing process according to an embodiment of the present invention.
Figure 9B:
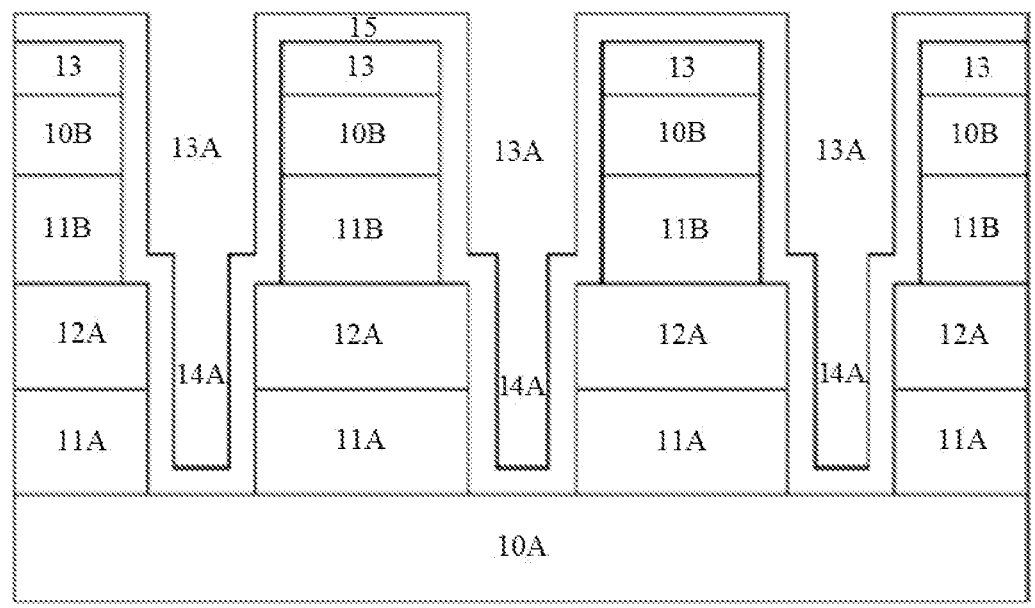
FIG. 9B shows a cross-sectional view along line B-B' of FIG. 9A.
Figure 9C:
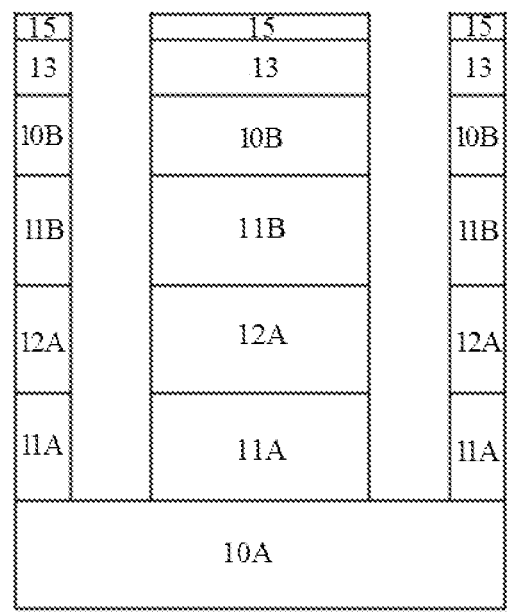
FIG. 9C shows a cross-sectional view along line A-A' of FIG. 9A.

As shown in FIGS. 9A-9C, the photoresist pattern 16 is removed. Preferably, a dry ashing process is used to remove the photoresist of the organic material, so as to avoid excessive etching of the isolation layer 15 by the wet etching solution. Further preferably, the surface of the isolation layer 15 is cleaned with an HF-based etching solution such as dHF and dBOE.

Figure 10A:
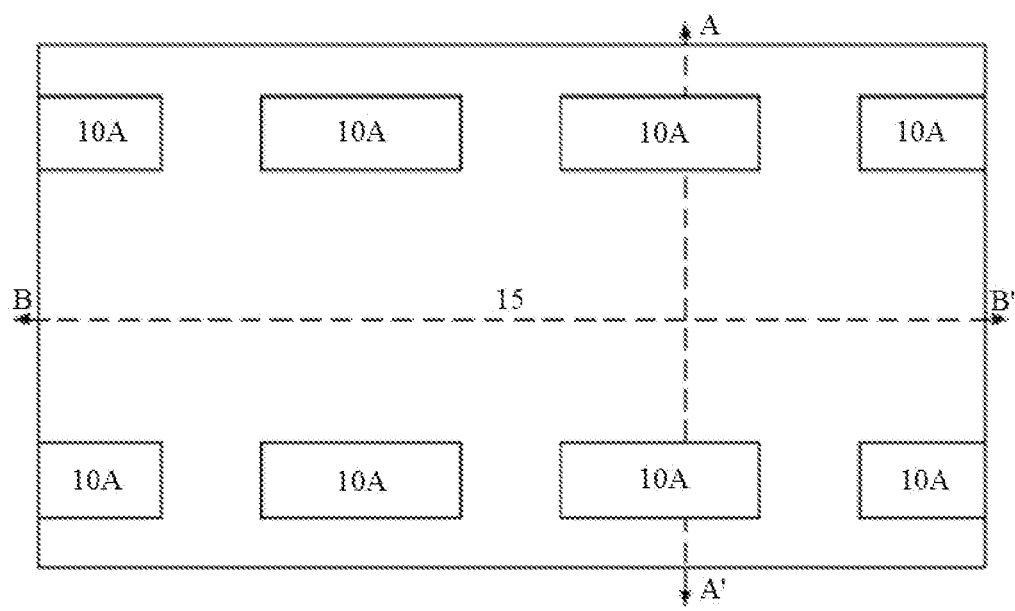
FIG. 10A shows a plan view of a resonator in a producing process according to an embodiment of the present invention.
Figure 10B:
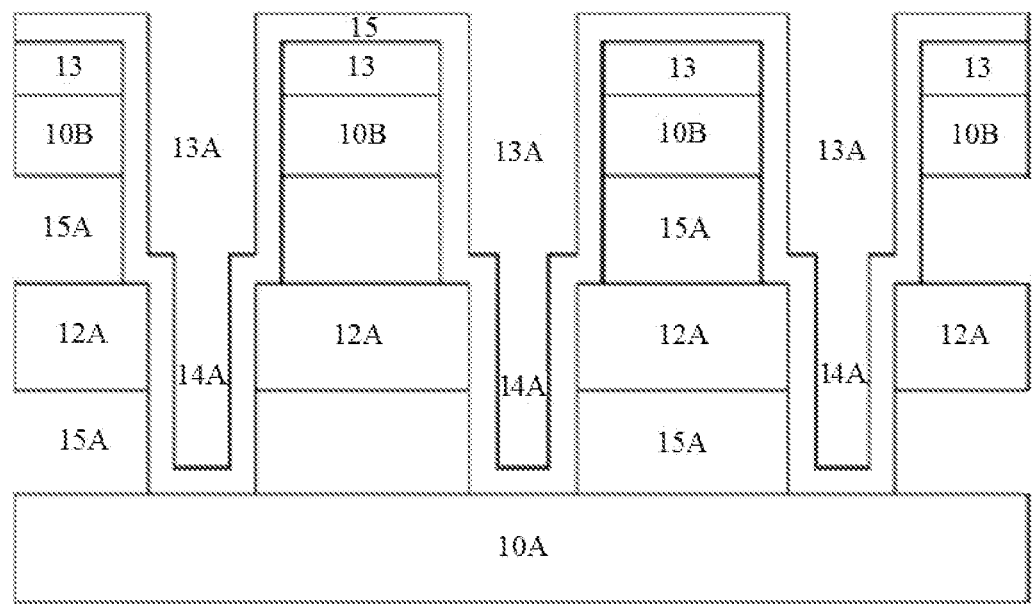
FIG. 10B shows a cross-sectional view along line B-B' of FIG. 10A.
Figure 10C:
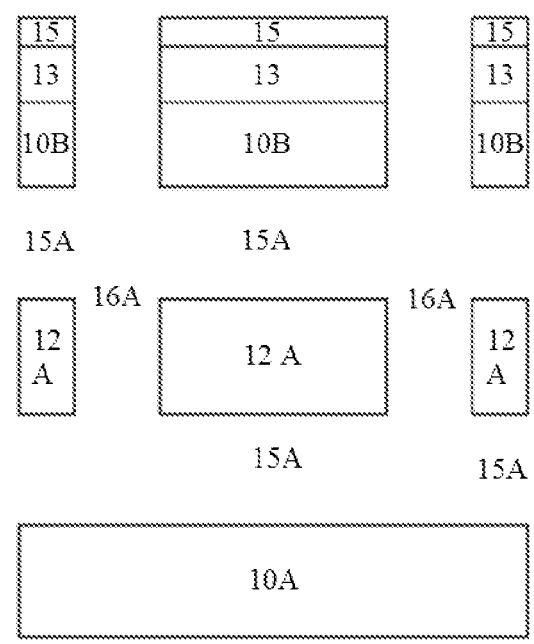
FIG. 10C shows a cross-sectional view along line A-A' of FIG. 10A.

As shown in FIGS. 10A-10C, the sacrificial layer 11 is selectively removed by isotropic etching, leaving multiple piezoelectric layer patterns 12 (not limited to 12A shown in the Figures) supported by the isolation layer 15 on the substrate. In addition to the T-shaped first openings in the vertical direction, there are also multiple horizontal recesses 15A between adjacent piezoelectric layer patterns, between the top piezoelectric layer and the capping layer 10B, and between the bottom piezoelectric layer and the substrate 10A. In a preferred embodiment of the present invention, the substrate 10A and the capping layer 10B are made of Si, and the sacrificial layer 11 is made of SiGe. A wet etching is performed by using an etching solution which is a combination of strong oxidant, strong inorganic acid and weak organic acid to improve the etch selectivity ratio between SiGe and Si. The strong oxidant may be nitric acid, hydrogen peroxide, ozone or perchloric acid, the strong inorganic acid may be hydrofluoric acid, hydrochloric acid or sulfuric acid, and the weak organic acid may be acetic acid or oxalic acid. For example, the strong oxidant is 30~50 parts by volume, the strong inorganic acid is 0.5~2 parts by volume, the weak organic acid is 1~4 parts by volume, and the solvent water is 40~70 parts by volume. For example, for single crystal $Si_{0.8}Ge_{0.2}$ and Si, a 40:1:2:57 ratio of $HNO_3$ (70%):HF (49%):$CH_3COOH$ (99.9%):$H_2O$ can be used to achieve the etch selectivity ratio of 300:1. In another embodiment of the present invention, the sacrificial layer 11 is a C-based material such as amorphous carbon (e.g., ta-C), graphene oxide, or graphene. An oxygen plasma dry etching process or a thermal oxidation process may be used to make the sacrificial layer react with oxygen, which generates gas. The generated gas is extracted. At this time, the oxygen will form a thin oxide layer on the surface of the piezoelectric layer 12, so that it is necessary to use an etching solution, such as dHF and dBOE, to remove the thin oxide layer.

Figure 11A:
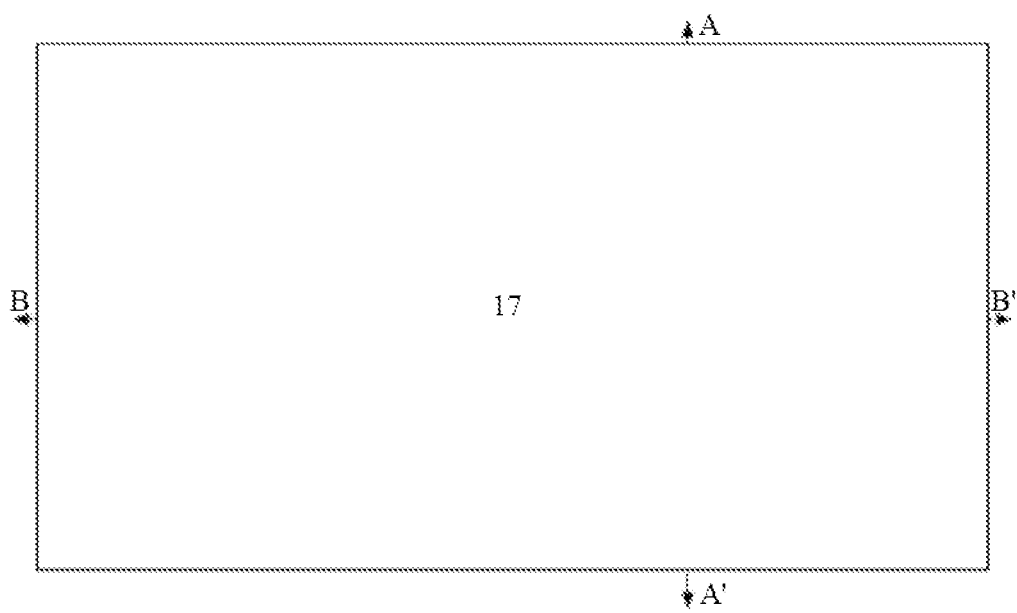
FIG. 11A shows a plan view of a resonator in a producing process according to an embodiment of the present invention.
Figure 11B:
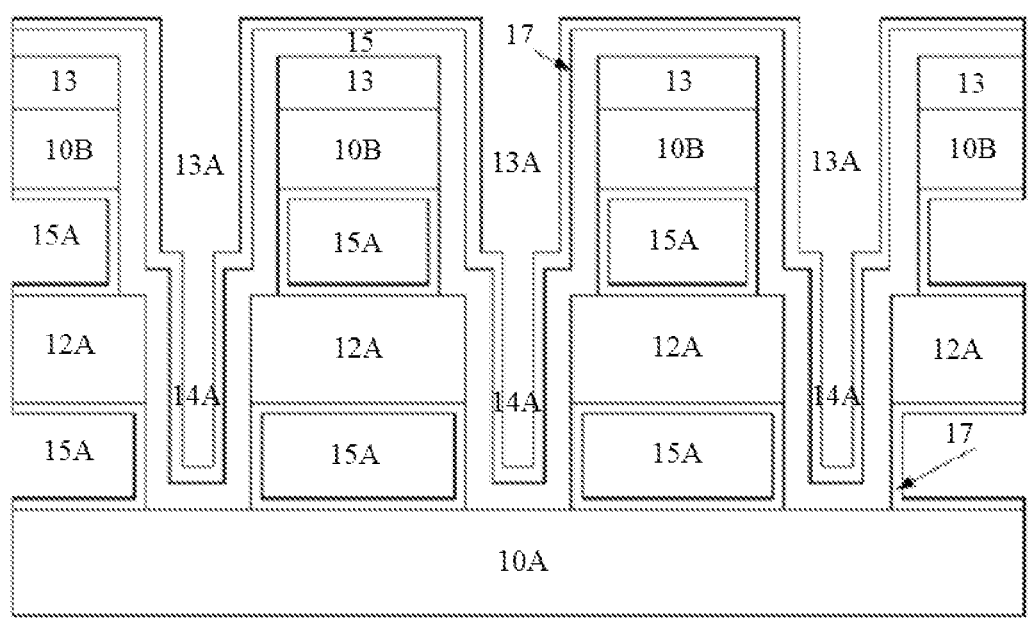
FIG. 11B shows a cross-sectional view along line B-B' of FIG. 11A.
Figure 11C:
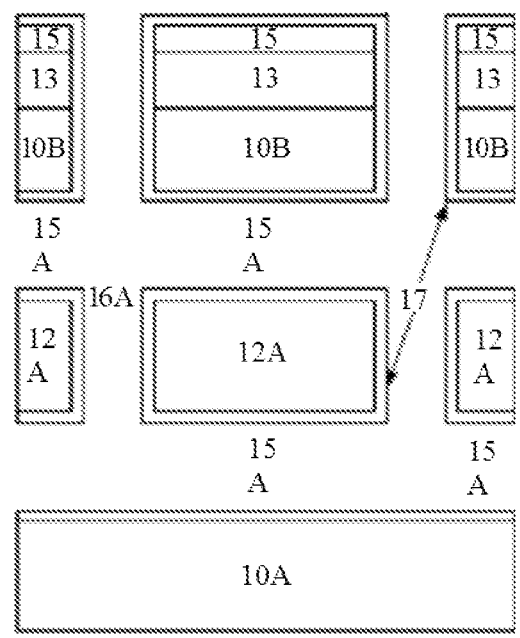
FIG. 11C shows a cross-sectional view along line A-A' of FIG. 1A.

As shown in FIGS. 11A-11C, a metal layer 17 is formed on the entire device by a deposition process with good conformality, such as ALD, MBE, and MOCVD. The metal layer 17 serves as contact electrodes for the piezoelectric layer 12. The material of the metal layer 17 is made of elemental metal of, alloy of, conductive oxide of or conductive nitride of Mo, W, Ru, Al, Cu, Ti, Ta, In, Zn, Zr, Fe, or Mg, or any combination thereof, thereby including a seed layer (or a barrier layer) and a conductive layer. As shown in FIG. 11C, in a cross-sectional view, the metal layer 17 not only surrounds the piezoelectric layer 12 (at least three sides, preferably four sides), but is also deposited on the substrate 10A and the capping layer 10B to serve as a contact layer on the bottom and top surfaces.

Figure 12A:
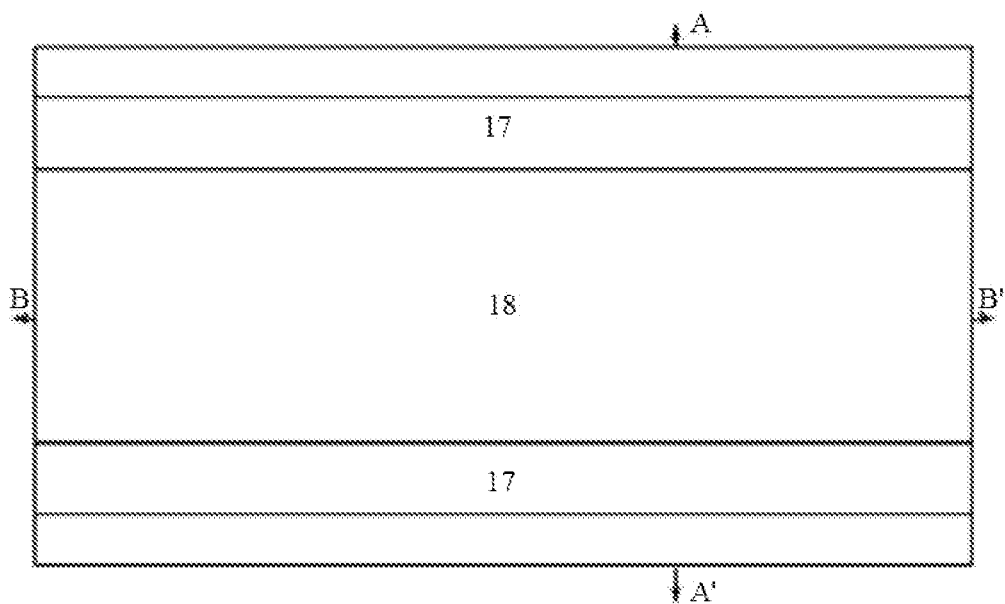
FIG. 12A shows a plan view of a resonator in a producing process according to an embodiment of the present invention.
Figure 12B:
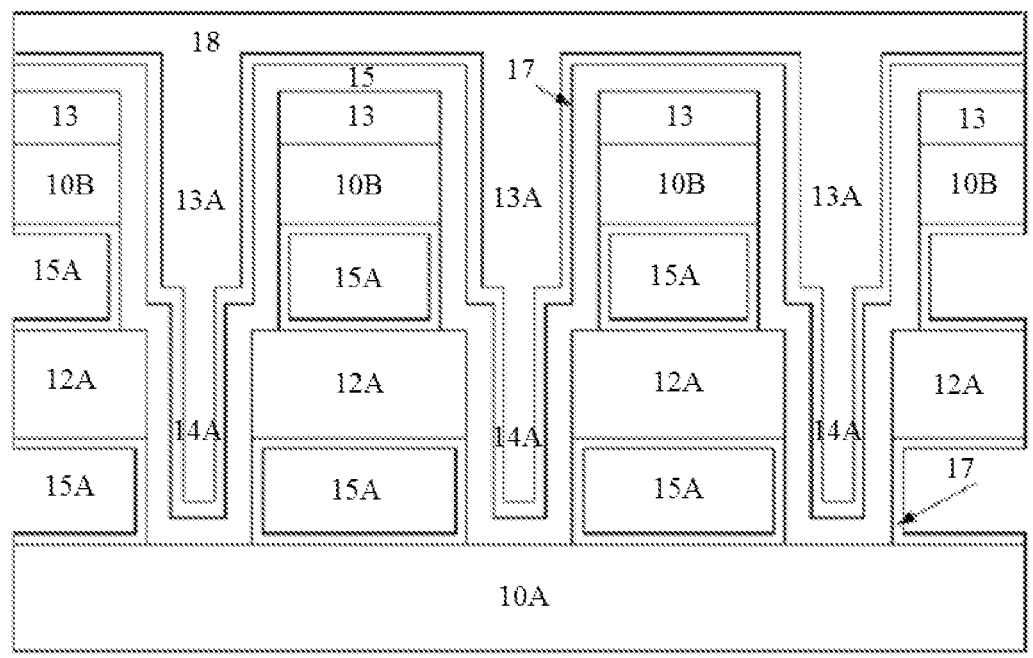
FIG. 12B shows a cross-sectional view along line B-B' of FIG. 12A.
Figure 12C:
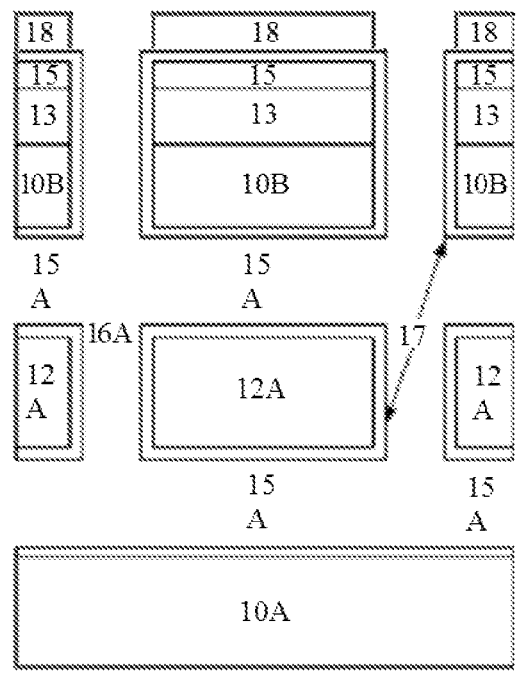
FIG. 12C shows a cross-sectional view along line A-A' of FIG. 12A.

As shown in FIGS. 12A-12C, the photoresist is spin-coated, exposed and developed to form photoresist patterns 18 extending along the second direction B-B', with the spacing along the first direction A-A' equal to the original width of the second opening 16A. That is, the sidewalls of the photoresist pattern 18 are flush with the sidewalls of the piezoelectric layer 12 in the vertical direction.

Figure 13A:
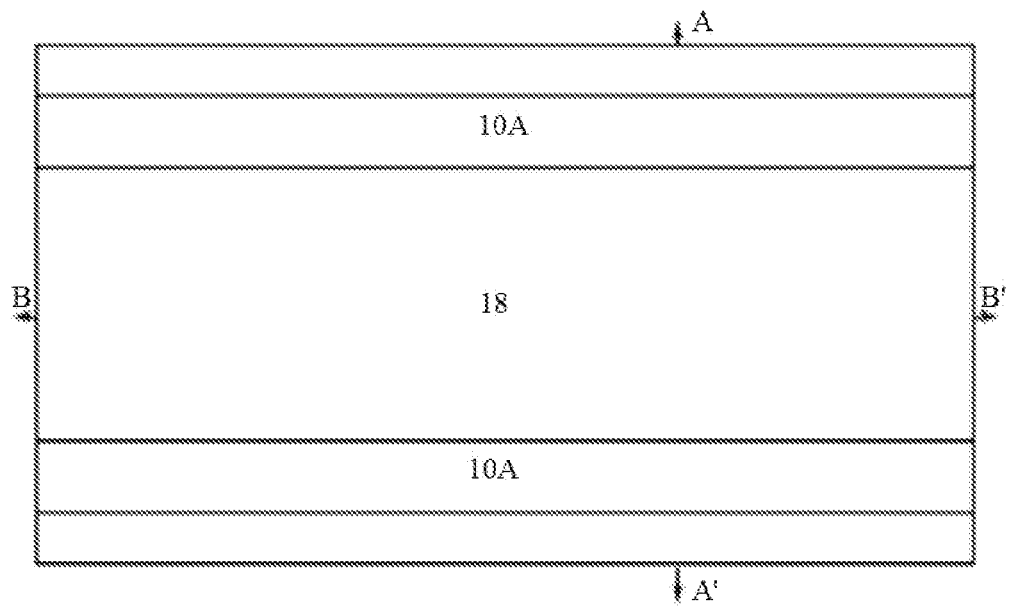
FIG. 13A shows a plan view of a resonator in a producing process according to an embodiment of the present invention.
Figure 13B:
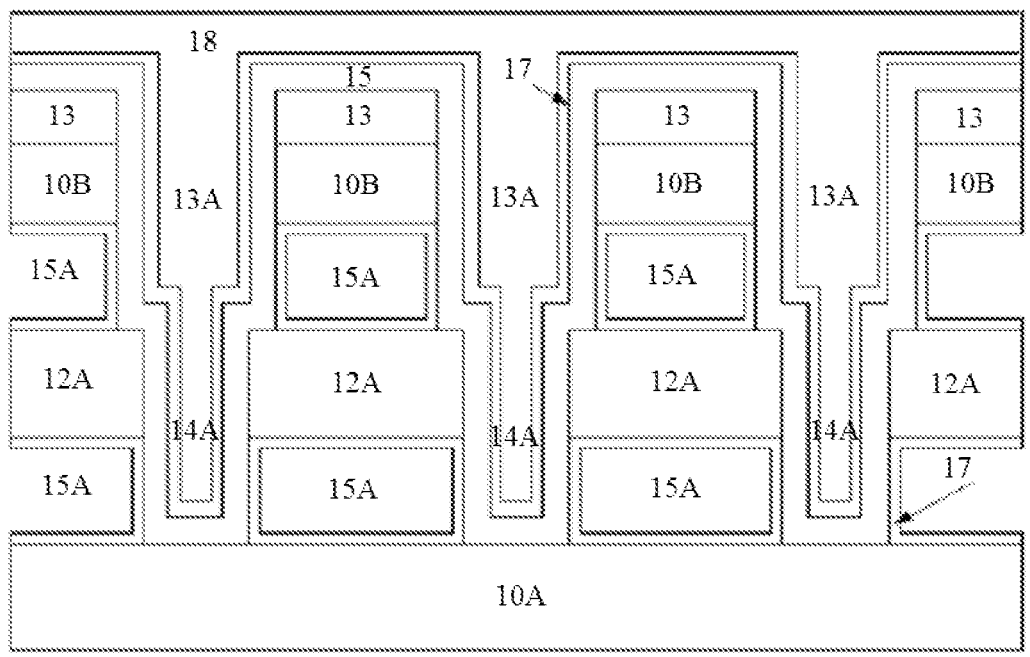
FIG. 13B shows a cross-sectional view along line B-B' of FIG. 13A.
Figure 13C:
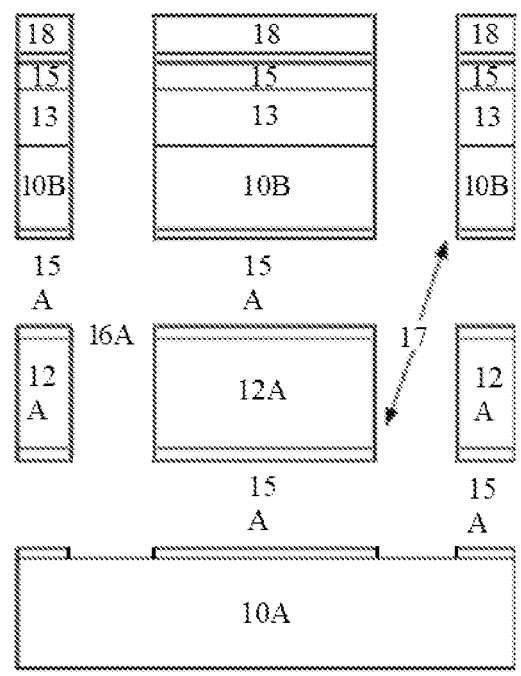
FIG. 13C shows a cross-sectional view along line A-A' of FIG. 13A.

As shown in FIGS. 13A-13C, using the photoresist pattern 18 as a mask, each layer is sequentially anisotropically dry-etched until the substrate 10A is exposed, thereby removing the vertical portion of the metal layer 17 and leaving only the horizontal portion of the metal layer 17. That is, the metal layer 17 only on the bottom of the capping layer 10B, the top and bottom of the piezoelectric layer 12, and the top of the substrate 10A is left as contact electrode layers.

Figure 14A:
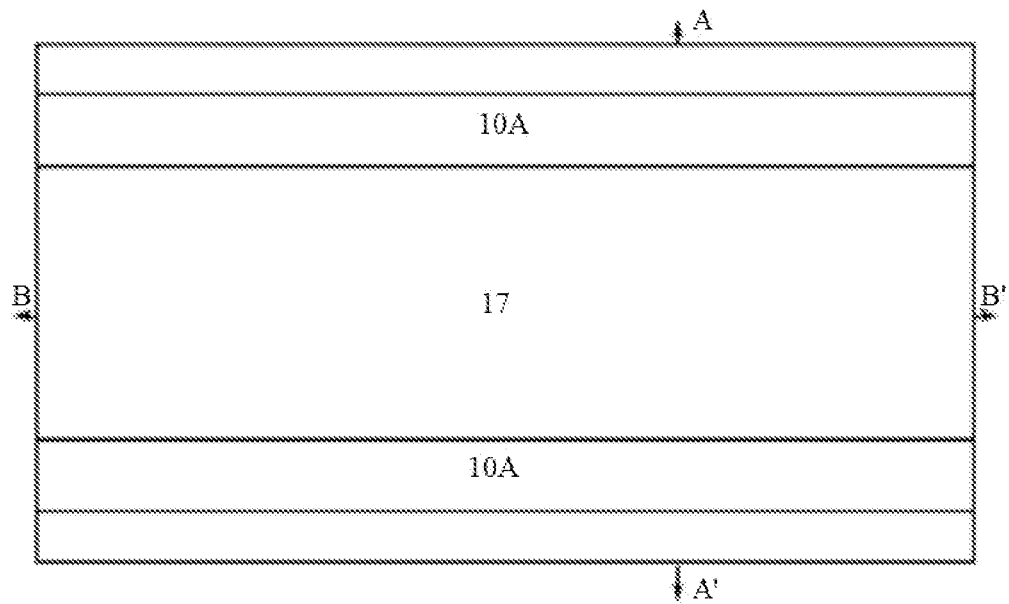
FIG. 14A shows a plan view of a resonator in a producing process according to an embodiment of the present invention.
Figure 14B:
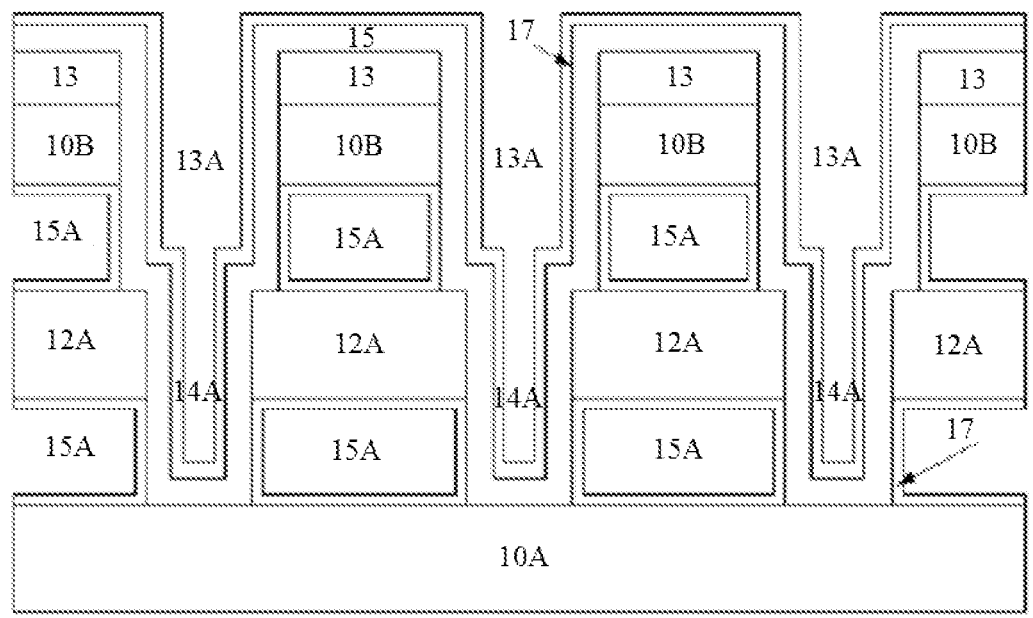
FIG. 14B shows a cross-sectional view along line B-B' of FIG. 14A.
Figure 14C:
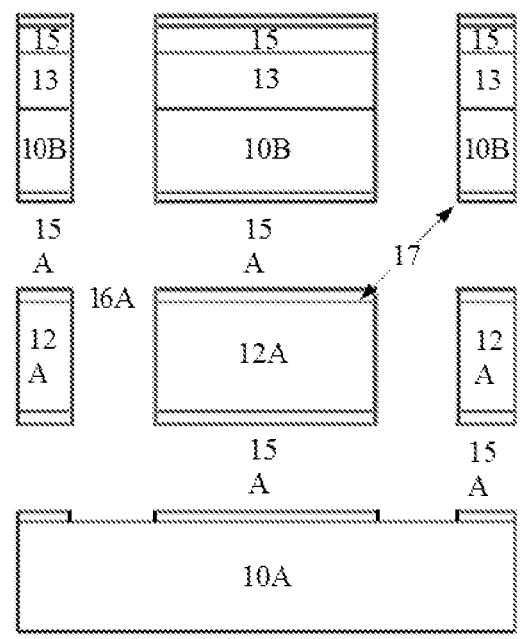
FIG. 14C shows a cross-sectional view along line A-A' of FIG. 14A.

As shown in FIGS. 14A-14C, the photoresist pattern 18 is removed, exposing the electrode layer 17 in the first opening and on top of the isolation layer 15. As shown in FIG. 14B, the electrode layer 17 wraps the recess 15A and directly contacts the top and bottom of the piezoelectric layer 12, which will be used as top and bottom electrodes.

Figure 15A:
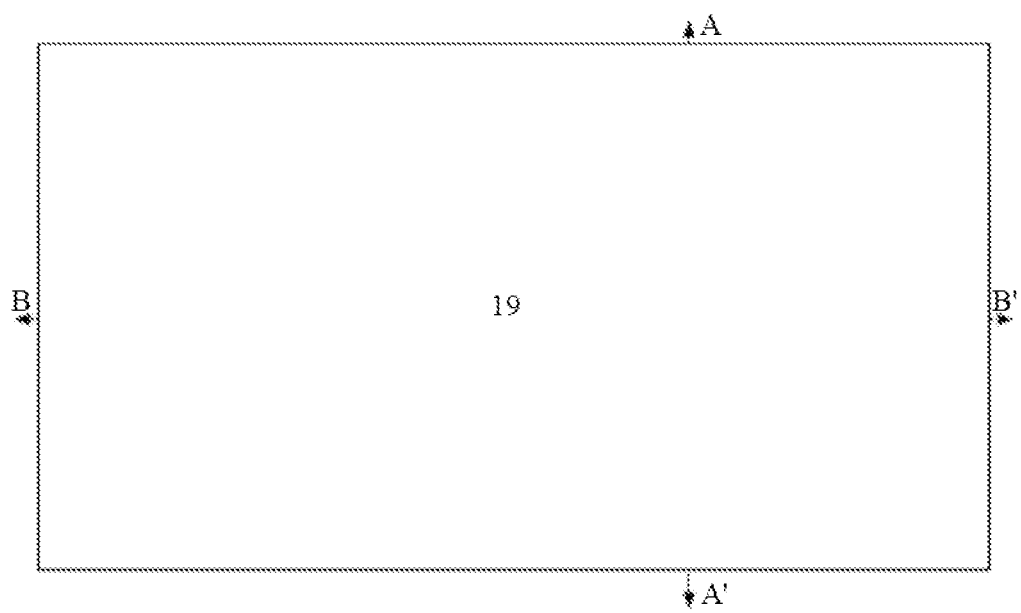
FIG. 15A shows a plan view of a resonator in a producing process according to an embodiment of the present invention.
Figure 15B:
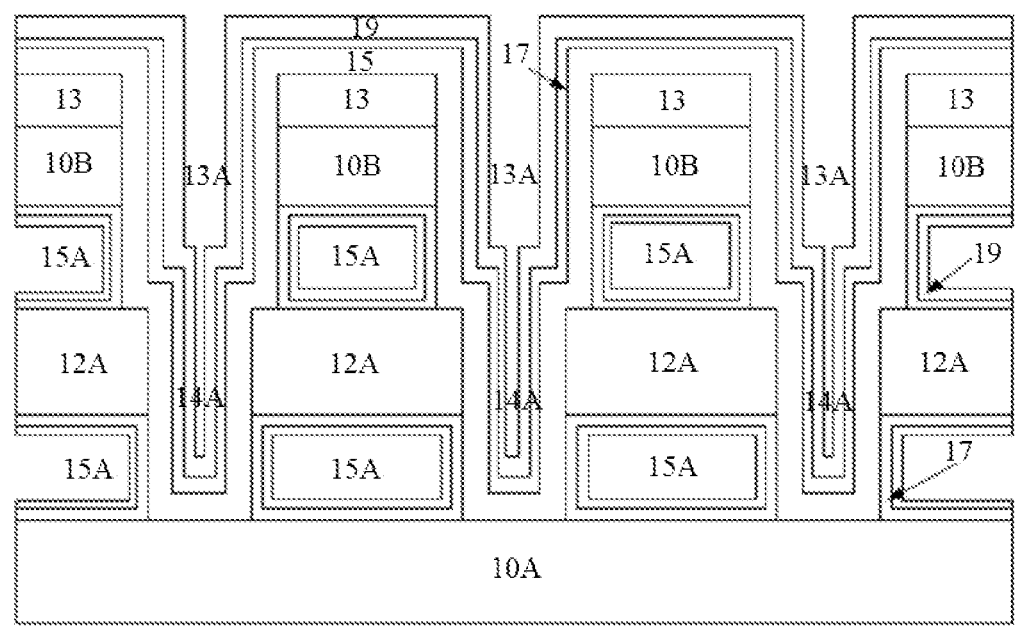
FIG. 15B shows a cross-sectional view along line B-B' of FIG. 15A.
Figure 15C:
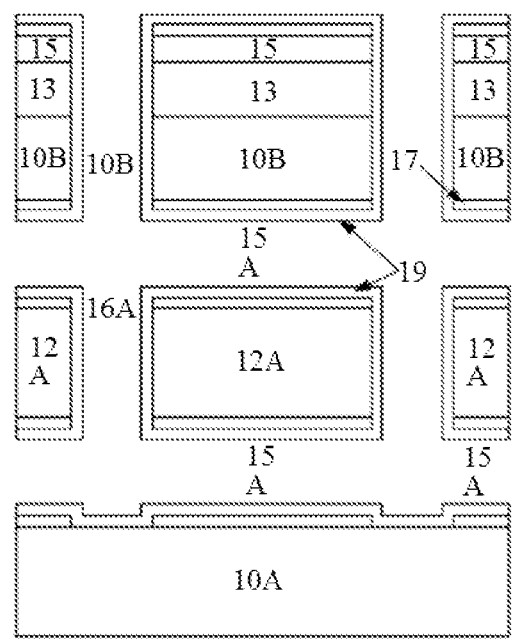
FIG. 15C shows a cross-sectional view along line A-A' of FIG. 1A.

As shown in FIGS. 15A-15C, a second isolation layer 19 is formed by a process with good conformality, such as HDPCVD, MBE, ALD, or in-situ water vapor doping thermal oxidation/nitridation. The material of the second isolation layer 19 may be the same as that of the (first) isolation layer 15, such as SiOx, SiOC, SiOC, SiOF, SiFC, BSG, PSG, or PBS. The second isolation layer 19 is mainly used for insulating and isolating the piezoelectric layer from the capping layer and the substrate in the vertical direction.

Figure 16A:
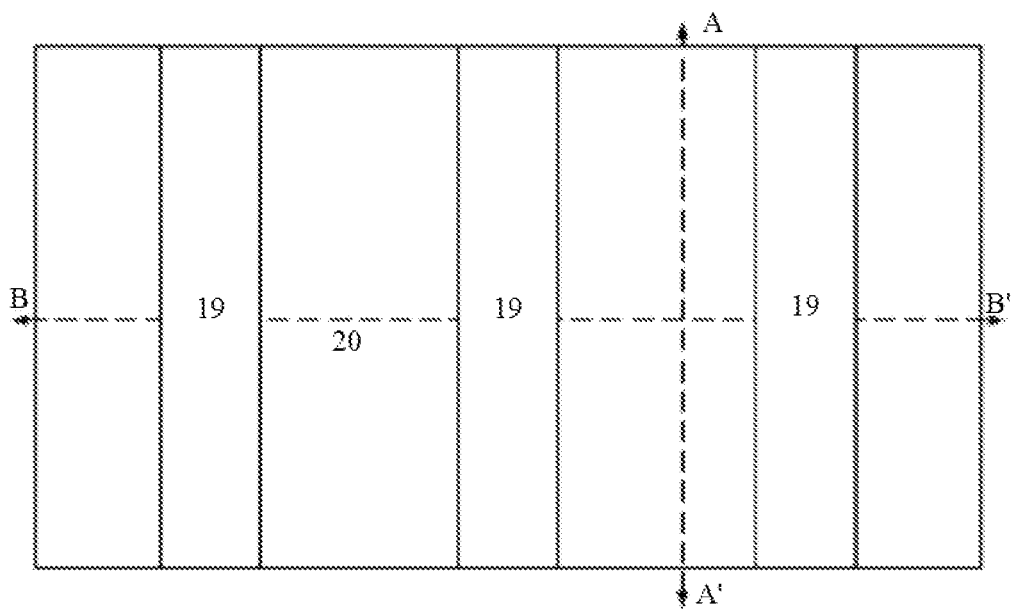
FIG. 16A shows a plan view of a resonator in a producing process according to an embodiment of the present invention.
Figure 16B:
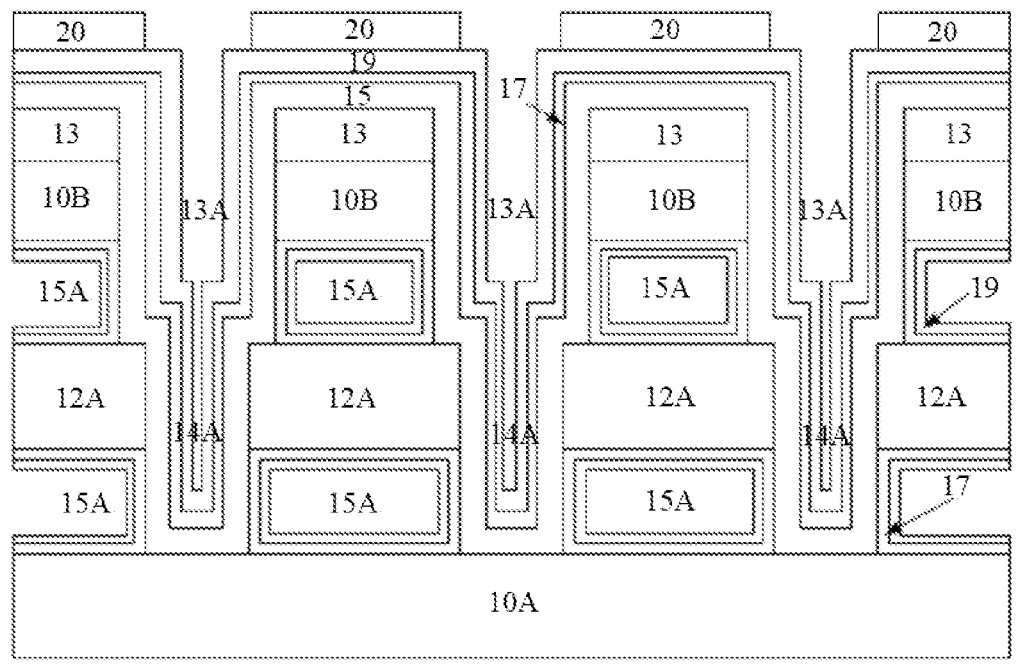
FIG. 16B shows a cross-sectional view along line B-B' of FIG. 16A.
Figure 16C:
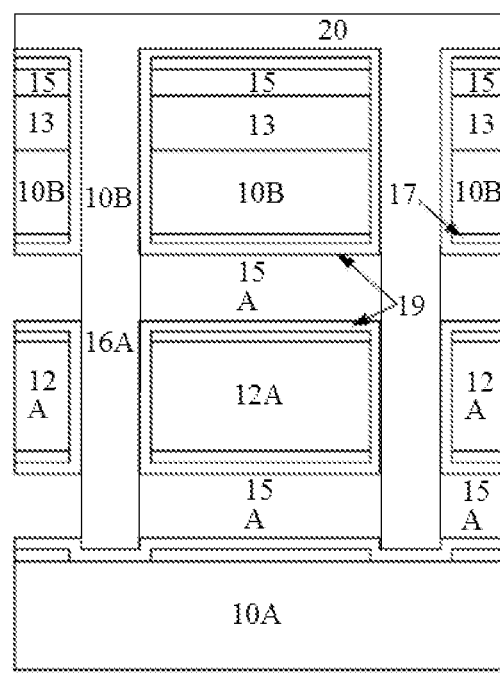
FIG. 16C shows a cross-sectional view along line A-A' of FIG. 16A picture.

As shown in FIGS. 16A-16C, photoresist is coated and exposed and developed to form photoresist patterns 20 extending along the first direction A-A'. The spacing of the photoresist patterns 20 along the second direction B-B' is preferably equal to the original width of the lower first portion 14A of the first opening. That is, the sidewalls of the photoresist pattern 20 are flush with the sidewalls of the piezoelectric layer 12A in the vertical direction.

Figure 17A:
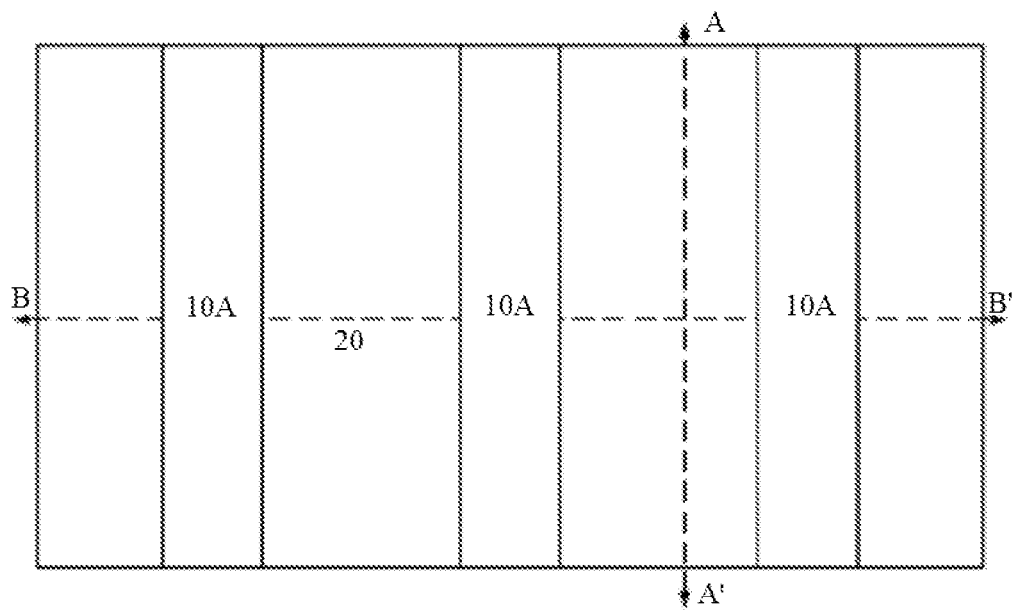
FIG. 17A shows a plan view of a resonator in a producing process according to an embodiment of the present invention.
Figure 17B:
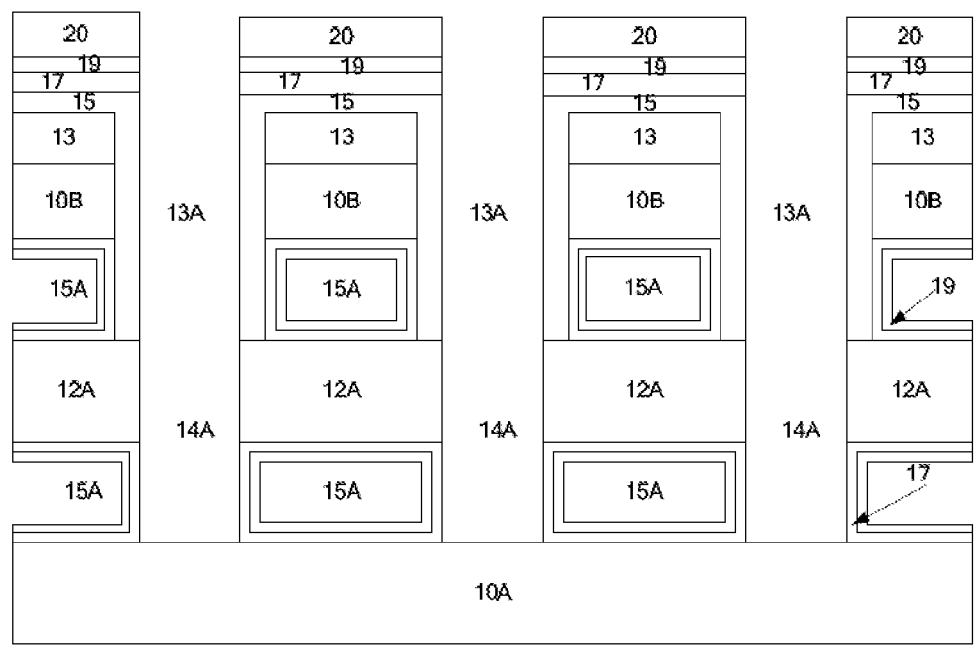
FIG. 17B shows a cross-sectional view along line B-B' of FIG. 17A.
Figure 17C:
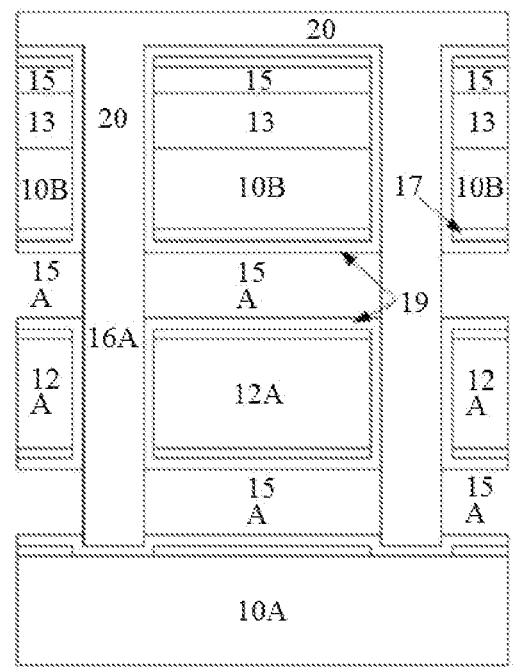
FIG. 17C shows a cross-sectional view along line A-A' of FIG. 17A.

As shown in FIGS. 17A-17C, using the photoresist pattern 20 as a mask, each film layer is anisotropically dry-etched until the substrate 10A is exposed, so that the first portion 14A of the first opening is re-exposed. During this process, since the width of the second portion 13A of the first opening is relatively large, the first isolation layer 15 of an insulating material will remain on the sidewalls of the second portion 13A. That is, as shown in FIG. 17B, the sidewall of the isolation layer 15 is flashed with the piezoelectric layer 12A. The remaining isolation layer 15 will be used to isolate the top and bottom electrode lead lines of the piezoelectric layer 12A in the horizontal direction.

Figure 18A:
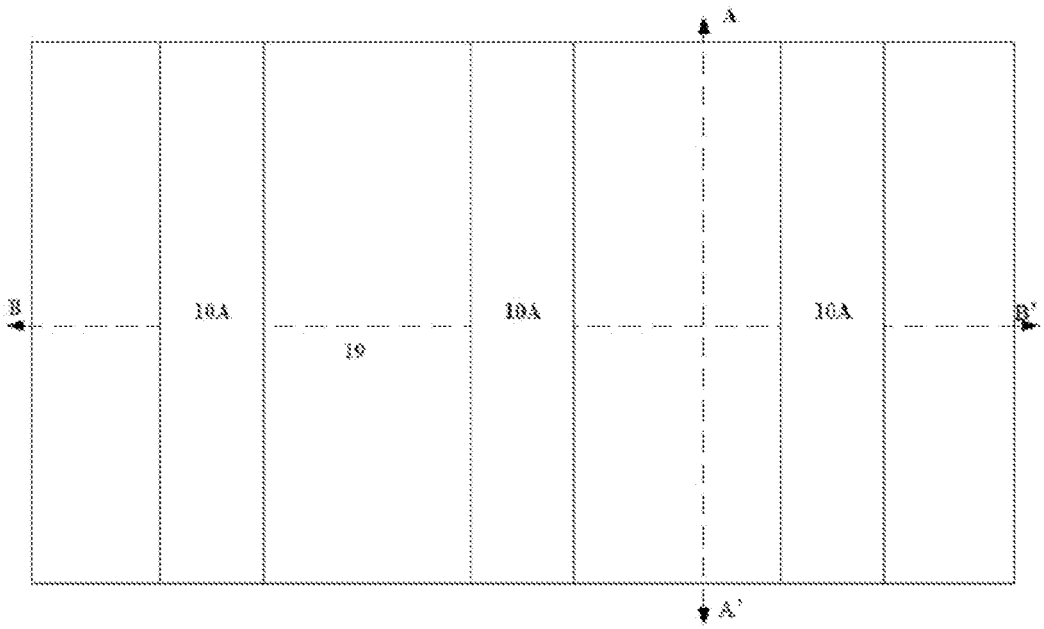
FIG. 18A shows a plan view of a resonator in a producing process according to an embodiment of the present invention.
Figure 18B:
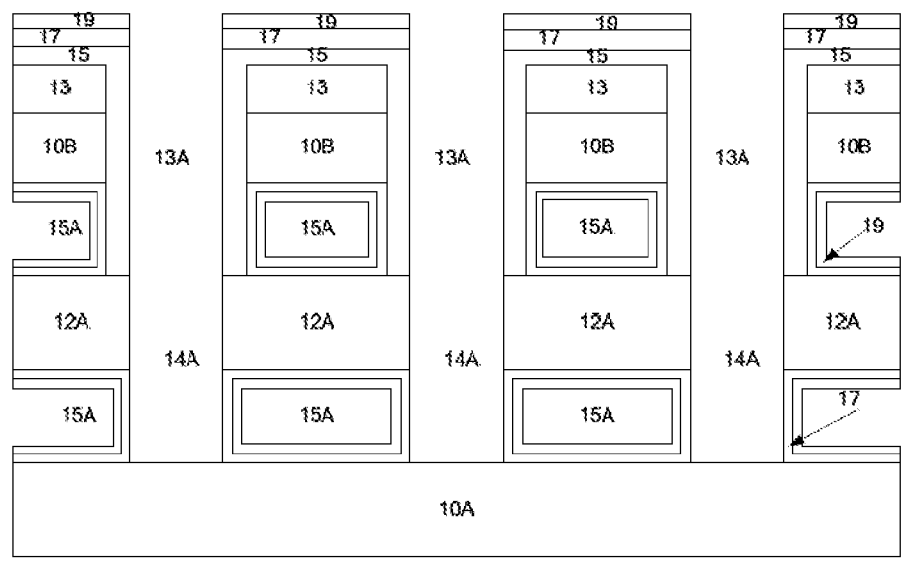
FIG. 18B shows a cross-sectional view along line B-B' of FIG. 18A.
Figure 18C:
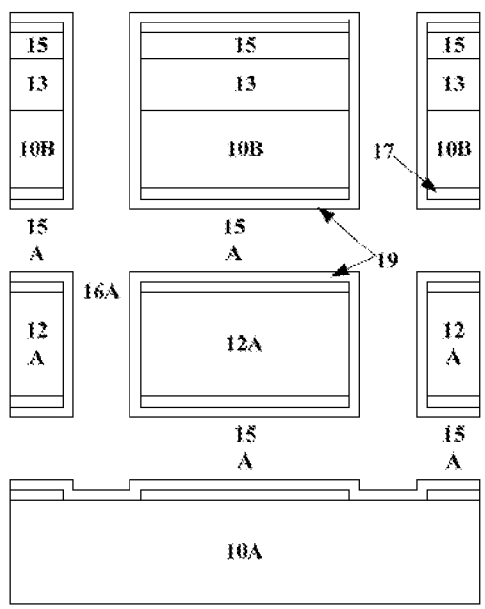
FIG. 18C shows a cross-sectional view along line A-A' of FIG. 18A.

As shown in FIGS. 18A-18C, the photoresist pattern 20 is removed using a dry ashing process.

Figure 19A:
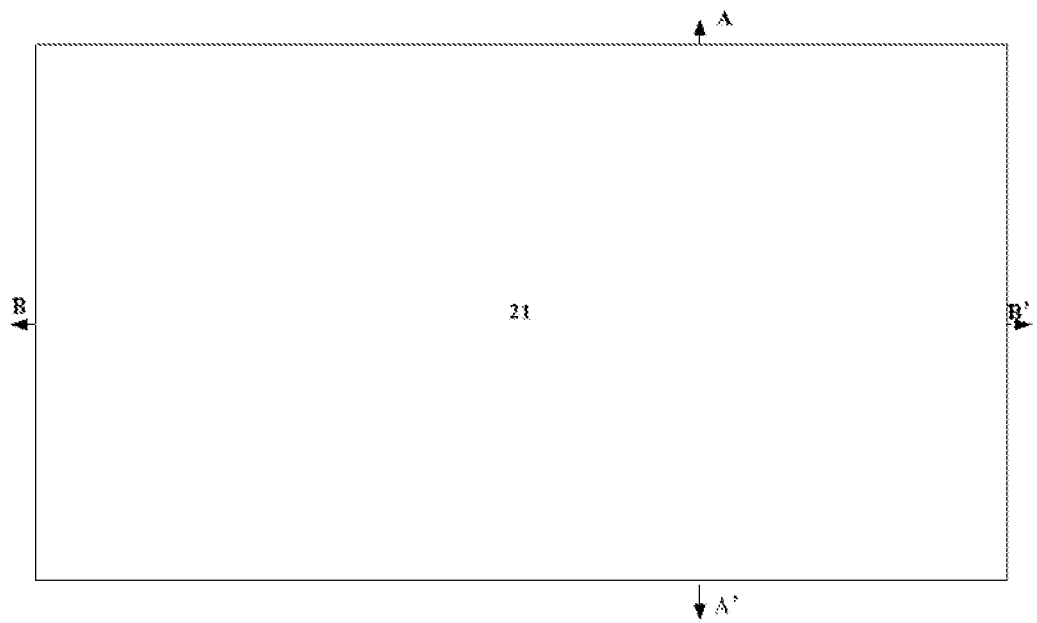
FIG. 19A shows a plan view of a resonator in a producing process according to an embodiment of the present invention.
Figure 19B:
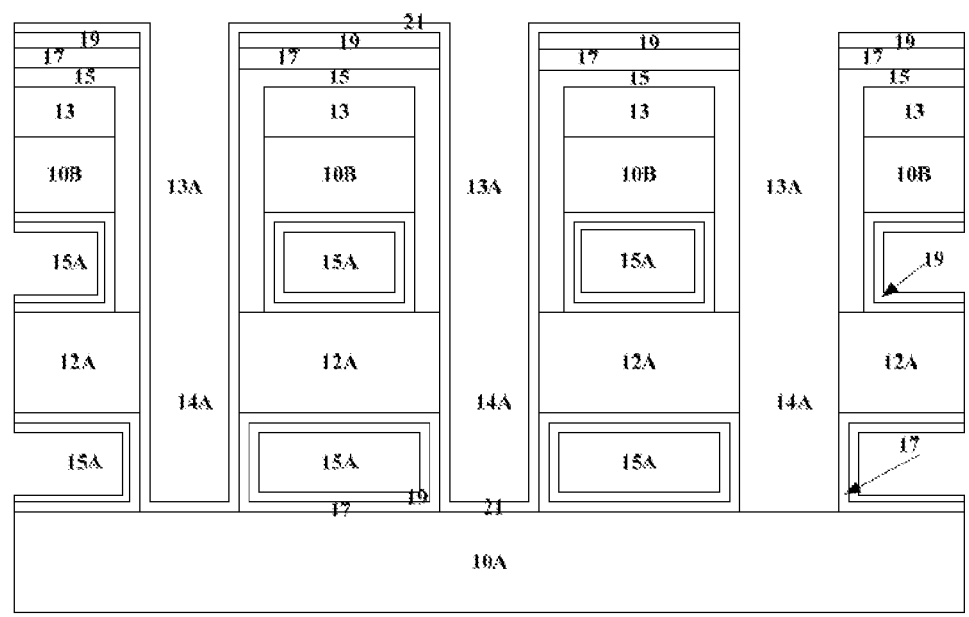
FIG. 19B shows a cross-sectional view along line B-B' of FIG. 19A.
Figure 19C:
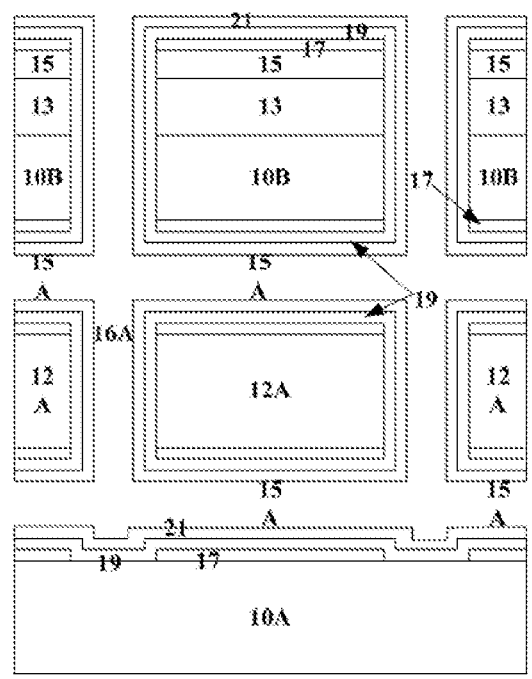
FIG. 19C shows a cross-sectional view along line A-A' of FIG. 19A.

As shown in FIGS. 19A-19C, a metal layer 21 is formed on the entire device using a deposition process with good conformality such as ALD, MBE, and MOCVD, which is used as the bottom electrode lead lines of the piezoelectric layer 12. The material of the metal layer 21 is, for example, elemental metal of, alloy of, conductive oxide of or conductive nitride of Mo, W, Ru, Al, Cu, Ti, Ta, In, Zn, Zr, Fe, or Mg, or any combination thereof, thereby including a seed layer (or a barrier layer) and a conductive layer. As shown in FIG. 19B, due to the existence of the first isolation layer 15, the metal layer 21 can only contact the metal layer 17 surrounding the cavity portion at the bottom of the piezoelectric layer 12A, but cannot contact the metal layer 17 above. Therefore, the first isolation layer 15 actually isolates the top and bottom electrodes of the piezoelectric layer.

Figure 20A:
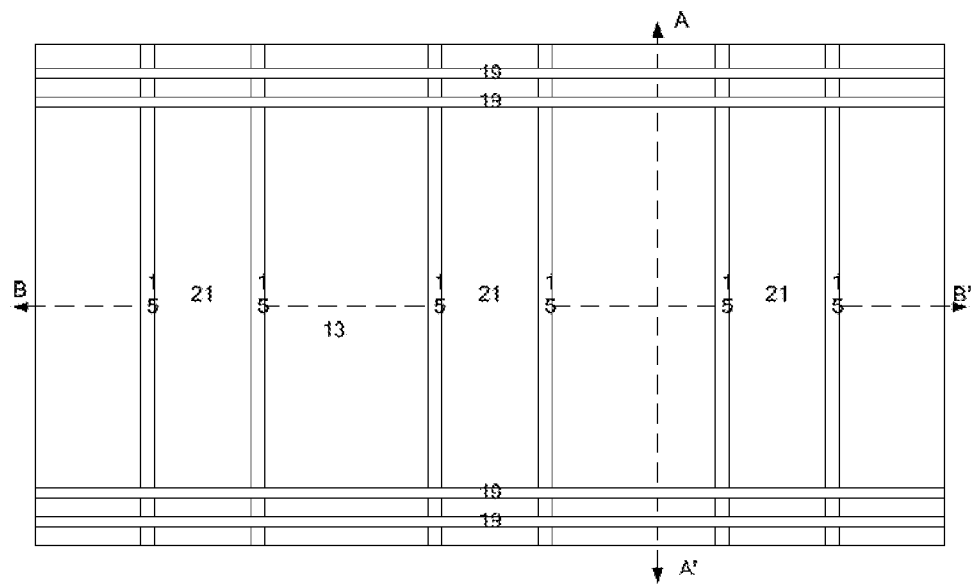
FIG. 20A shows a plan view of a resonator in a producing process according to an embodiment of the present invention.
Figure 20B:
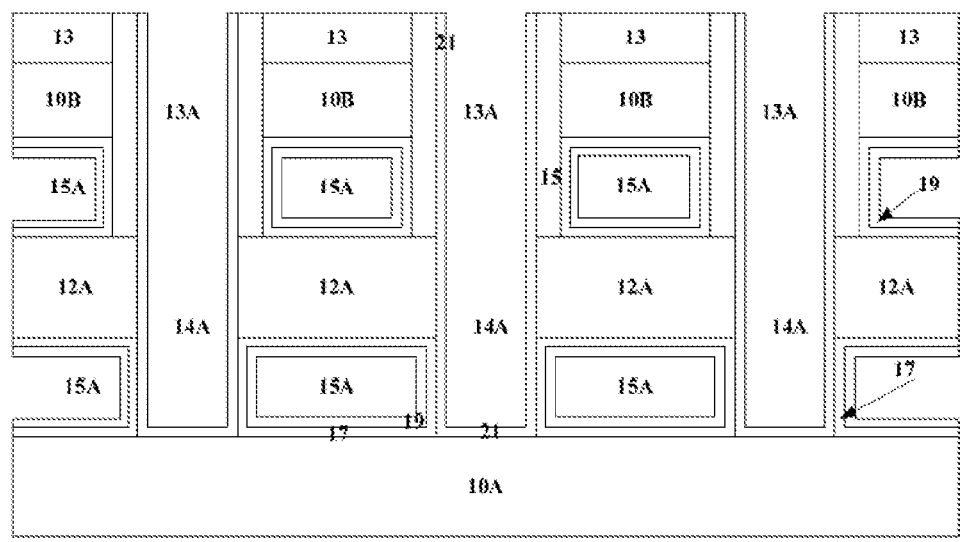
FIG. 20B shows a cross-sectional view along line B-B' of FIG. 20A.
Figure 20C:
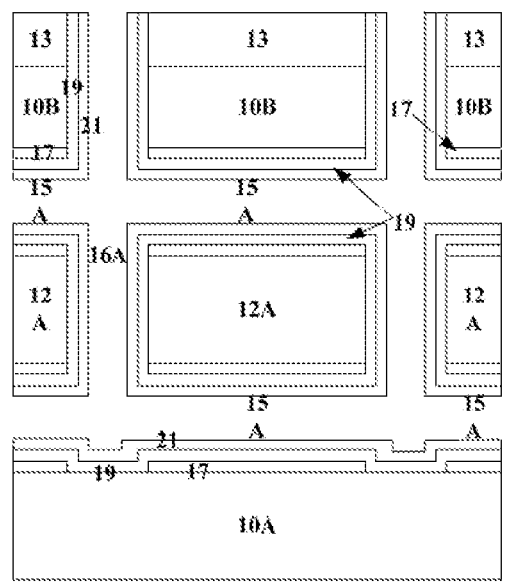
FIG. 20C shows a cross-sectional view along line A-A' of FIG. 20A.

As shown in FIGS. 20A-20C, the filling layer 16 is planarized by a process such as CMP or etch-back until the hard mask layer 13 is exposed.

Figure 21A:
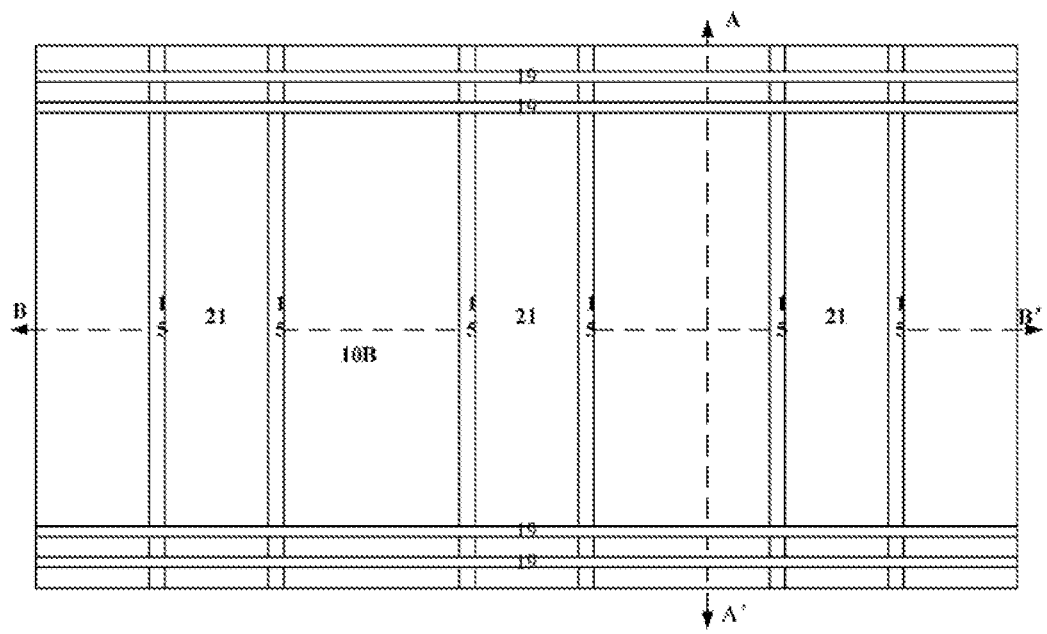
FIG. 21A shows a plan view of a resonator in a producing process according to an embodiment of the present invention.
Figure 21B:
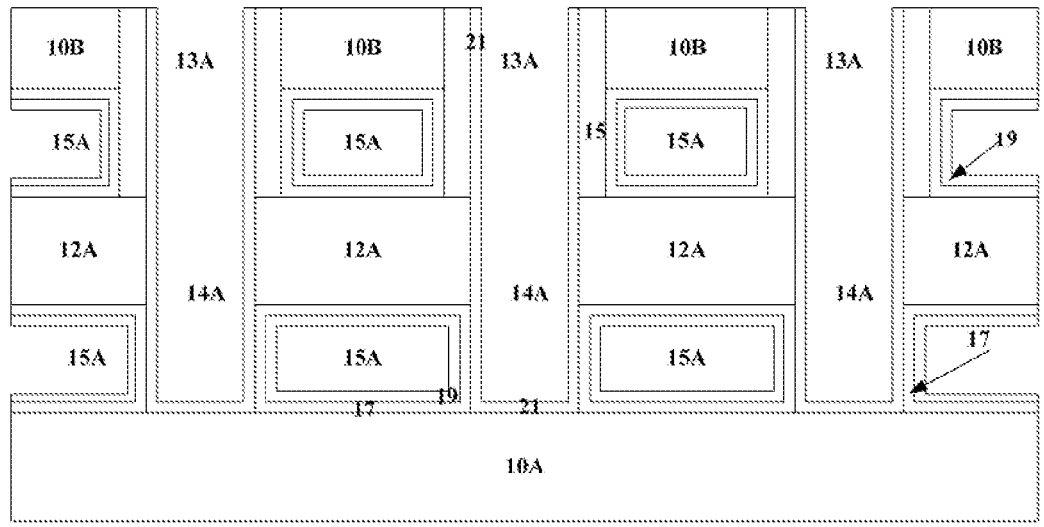
FIG. 21B shows a cross-sectional view along line B-B' of FIG. 21A.
Figure 21C:
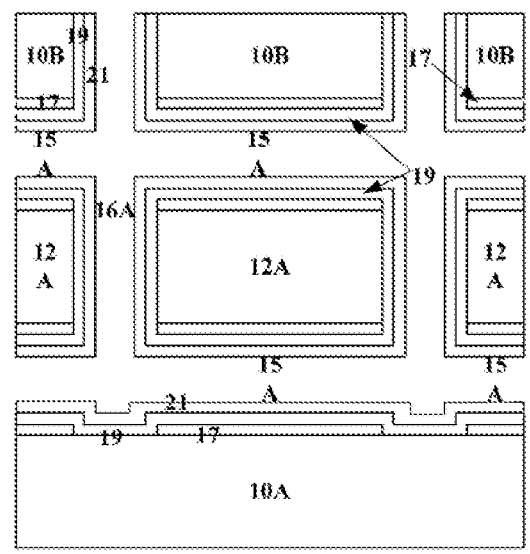
FIG. 21C shows a cross-sectional view along line A-A' of FIG. 21A.

As shown in FIGS. 21A-21C, the hard mask 13 is removed, which may be performed by CMP planarization or wet etching. In the CMP process, an oxidizing agent such as hydrogen peroxide, ozone or nitric acid may be added to the polishing liquid to accelerate the CMP speed and form in-situ an ultra-thin silicon oxide layer on the top of the capping layer 10B, which is used as a liner layer or a gate dielectric interface layer for the subsequent processes.

Figure 22A:
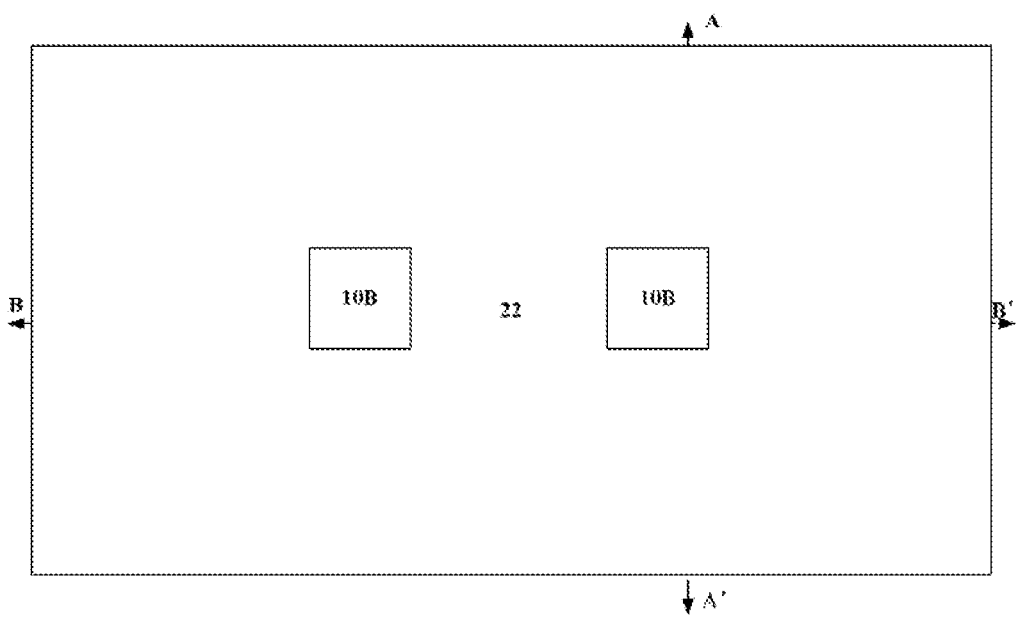
FIG. 22A shows a plan view of a resonator in a producing process according to an embodiment of the present invention.
Figure 22B:
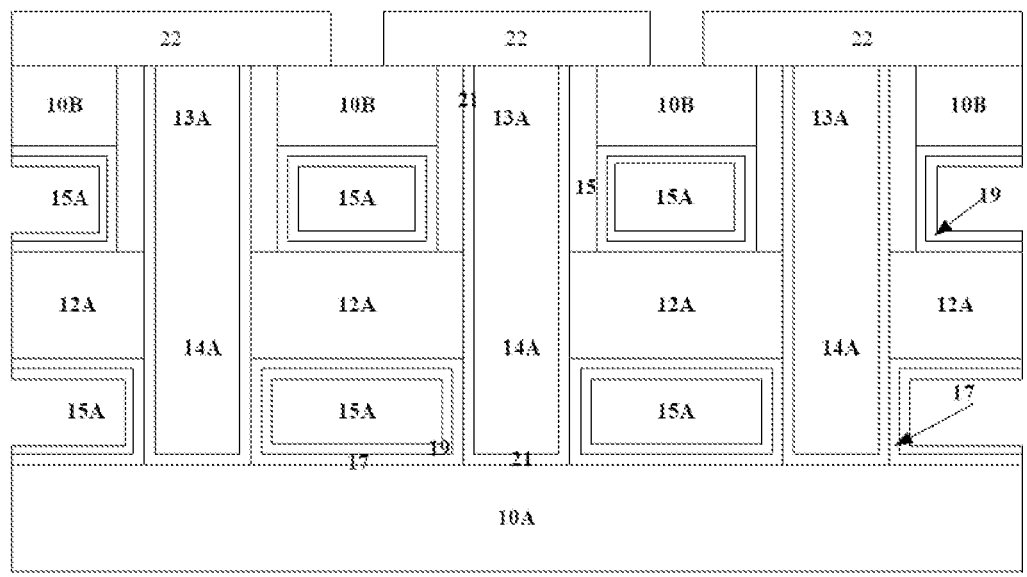
FIG. 22B shows a cross-sectional view along line B-B' of FIG. 22A.
Figure 22C:
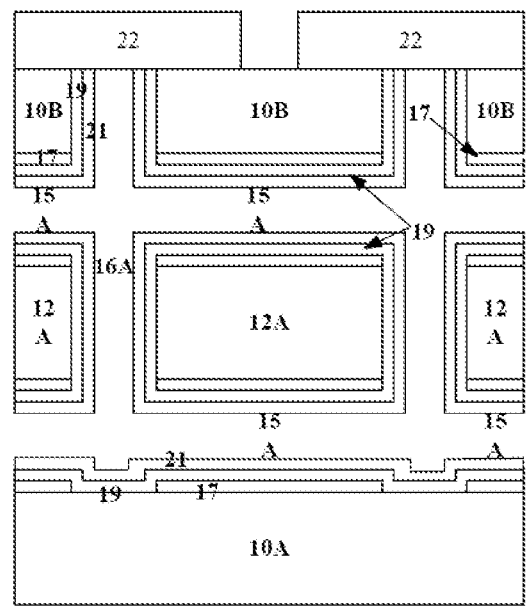
FIG. 22C shows a cross-sectional view along line A-A' of FIG. 22A.

As shown in FIGS. 22A-22C, a photoresist pattern 22 is formed over the entire device, exposing a portion of the capping layer 10B. Although only two photoresist pattern openings are shown in FIGS. 22A-22C, in practice at least one opening is formed in each portion of the capping layer 10B surrounded by openings 16A, 13A, 14A, to form a contact region subsequently.

Figure 23A:
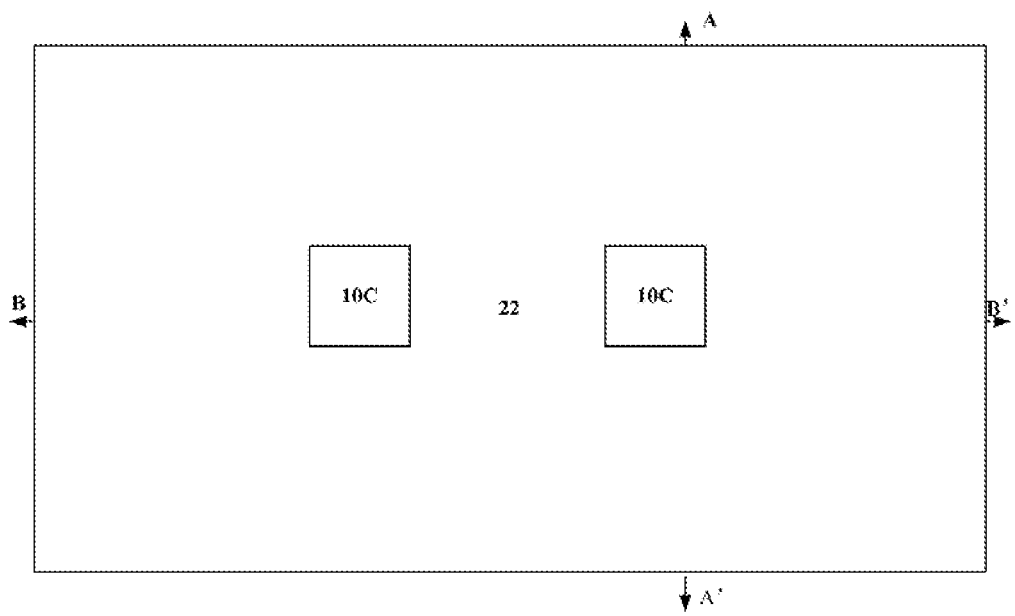
FIG. 23A shows a plan view of a resonator in a producing process according to an embodiment of the present invention.
Figure 23B:
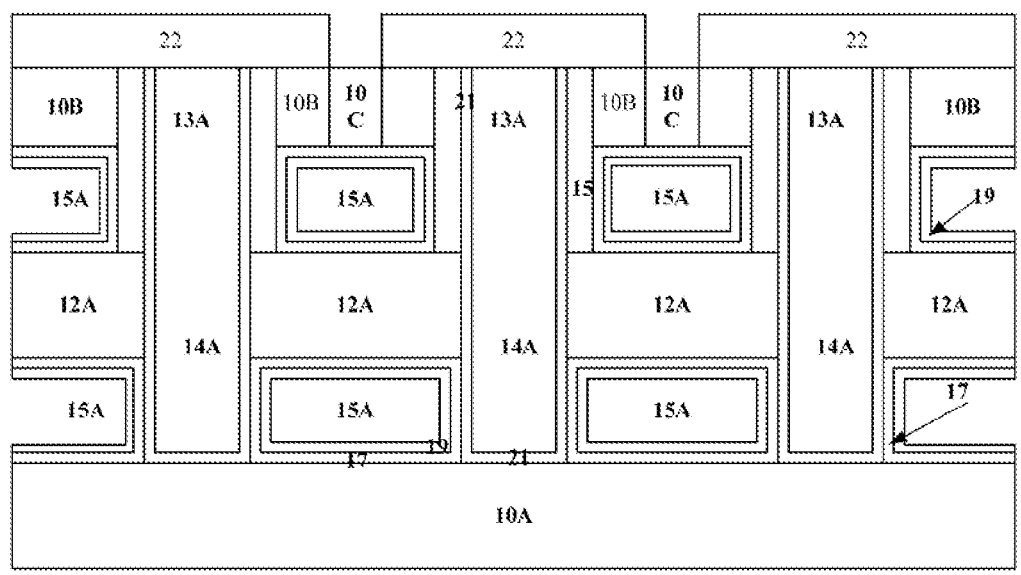
FIG. 23B shows a cross-sectional view along line B-B' of FIG. 23A.
Figure 23C:
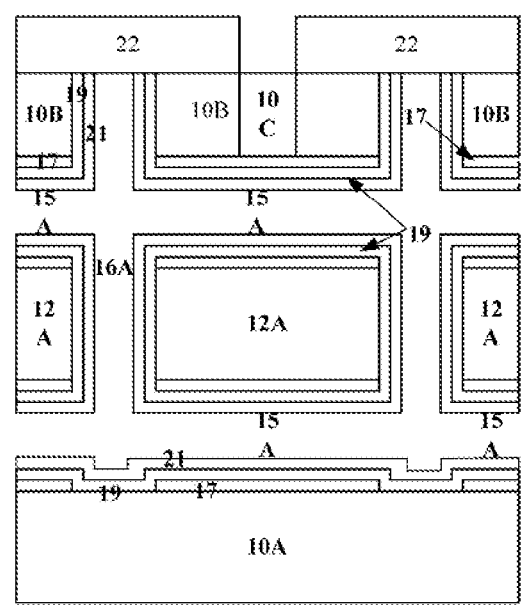
FIG. 23C shows a cross-sectional view along line A-A' of FIG. 21A.

As shown in FIGS. 23A-23C, using the photoresist pattern 22 as a mask, an ion implantation process is performed on the exposed capping layer 10B to form a contact region 10C. The ion implantation depth is increased such that the contact region 10C directly contacts the metal layer 17 surrounding the recess 15A, thereby eventually making electrical contact with the top of the piezoelectric layer 12A along the sidewalls of the recess 15A. In this way, the length of electric path between the driving transistor and the piezoelectric layer can be shortened inside the chip, thereby reducing the series resistance, enhancing the driving capability, improving the integration degree, and reducing the packaging cost.

In a preferred embodiment of the present invention, the capping layer 10B is a p-doped layer or an intrinsic layer, and n-type doping ions such as As, P, or Sb are used to implant the capping layer 10B to form the n-type source region 22S and drain region 22D. Alternatively, p-type source and drain regions may be formed by implanting p-type impurities such as B into the n-doped capping layer. The implantation energy in the selective implantation process is preferably set according to the thickness of the capping layer 10B so that the implantation depth is greater than or equal to the thickness of the capping layer 10B, to make the contact region 10C directly contact and electrically connect to the electrode layer 17 on the top of the cavity 15A under the capping layer 10B. Further preferably, after the ion implantation, an annealing process such as RTA is performed, to not only activate the doping ions but also repair the damage to the top of the capping layer 10B, the sidewalls of the insulating layer 15, the sidewalls and the bottom of the electrode layer 21 caused in the previous processes, which effectively improves the performance and stability of the drive transistor.

Figure 24A:
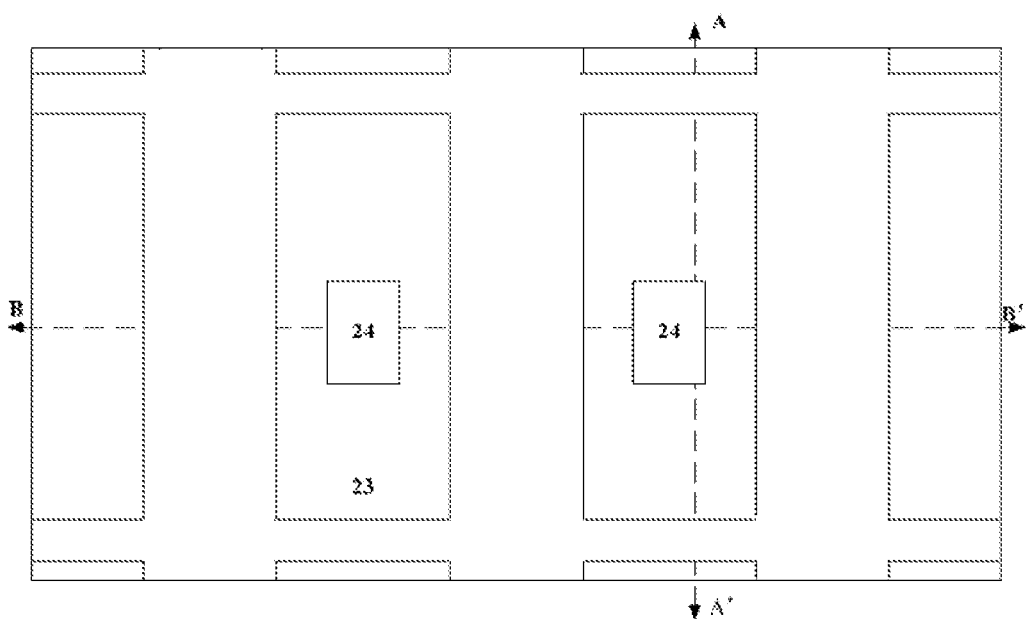
FIG. 24A shows a plan view of a resonator in a producing process according to an embodiment of the present invention.
Figure 24B:
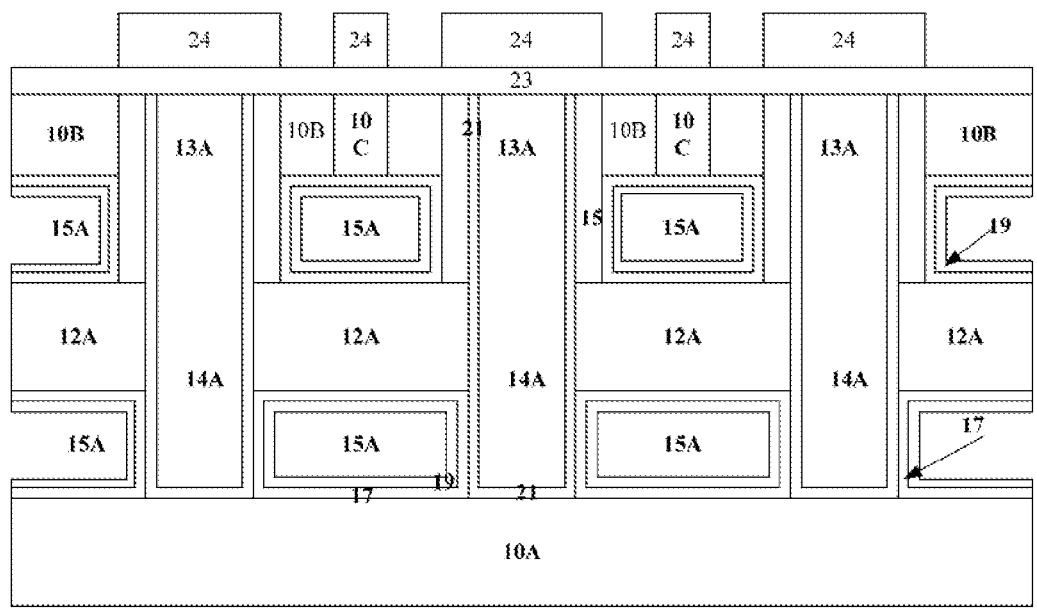
FIG. 24B shows a cross-sectional view along line B-B' of FIG. 24A.
Figure 24C:
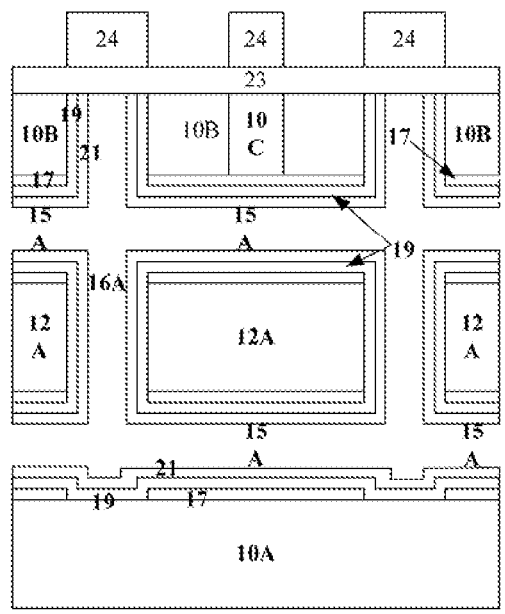
FIG. 24C shows a cross-sectional view along line A-A' of FIG. 21A.

As shown in FIGS. 24A-24C, a wiring layer 23 is formed on the entire device, and a photoresist pattern 24 is formed thereon by processes of coating, exposure, and development. For example, a thick film deposition process, such as PECVD, evaporation, sputtering or MOCVD, is used to form a wiring layer 23, whose material is elemental metal of, alloy of, conductive oxide of or conductive nitride of Mo, W, Ru, Al, Cu, Ti, Ta, In, Zn, Zr, Fe, or Mg, or any combination thereof, thereby including a seed layer (or a barrier layer) and a conductive layer. In a preferred embodiment of the present invention, the wiring layer 23 is a stacked metal layers of Al, Ti, Ni and W.

In a preferred embodiment of the present invention, after the wiring layer 23 is formed, an annealing process is performed, so that the metal contained in the wiring layer 23 reacts with semiconductor elements, such as Si or Ge, in the capping layer 10B, to form metal silicide or metal germanide, such as $WSi_2$, CoSi or NiSi, thereby forming an ohmic contact layer (not shown) on the top of the contact region 10C. Since its material is metal silicide or metal germanide, the surface contact resistance can be effectively reduced. In a preferred embodiment of the present invention, the annealing process includes two steps, namely, a first step of low temperature annealing (e.g., below 450 degrees Celsius) for forming silicon-rich or germanium-rich compounds, and a second step of high temperature annealing (e.g., 450 to 650 degrees Celsius) for converting the silicon-rich or germanium-rich compounds to be in a low resistance state. Advantageously, at least a part of the annealing process used for forming the ohmic contact layer (e.g., the second step of high temperature annealing) may be combined with the aforementioned annealing process for activating dopant ions, so as to save process steps and reduce costs.

The photoresist pattern 24 includes a first portion on top of the contact region 10C, and an annular second portion over the openings 13A, 14A, 16A around the first portion. The planar size of the first portion is greater than or equal to the size of the contact area 10C. The width of the second portion along the first direction A-A' is greater than or equal to the width of the opening 16A so as to at least cover the metal layer 21 in the opening 16A. The width of the second portion along the second direction B-B' is greater than or equal to the width of the openings 13A/14A so as to at least cover the metal layer 21 in the openings 13A/14A. In this way, it can be ensured that the bottom wiring layer 23 after being patterned can electrically contact with the metal layer 21, i.e., the bottom electrode layer of the piezoelectric film.

Figure 25A:
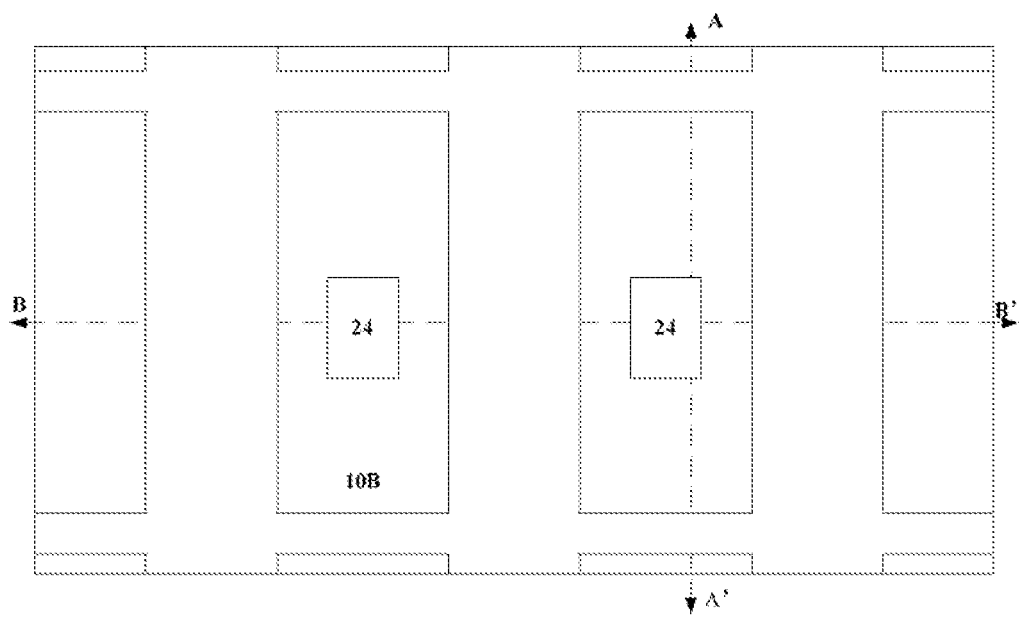
FIG. 25A shows a plan view of a resonator in a producing process according to an embodiment of the present invention.
Figure 25B:
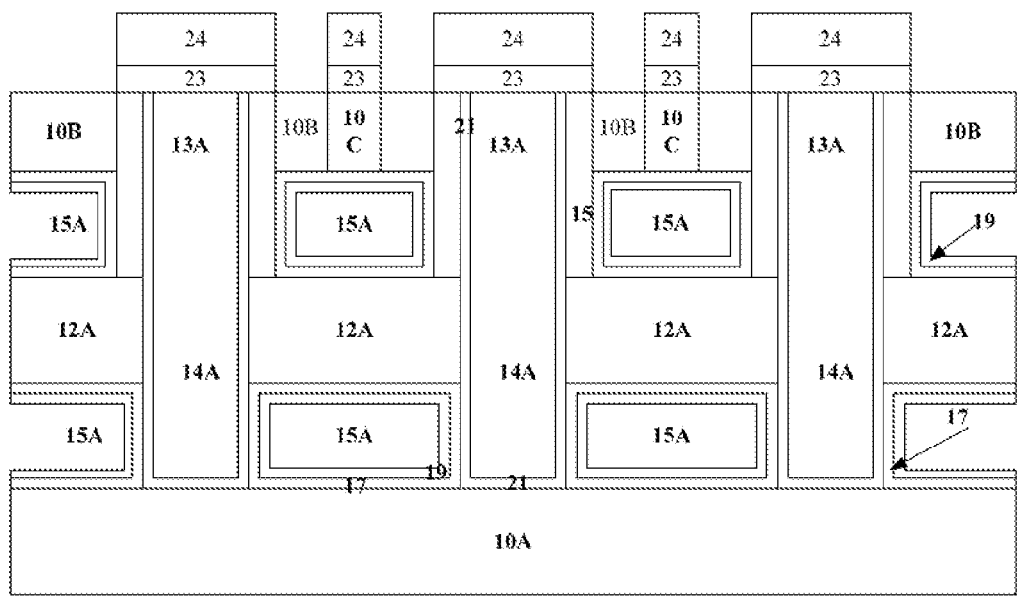
FIG. 25B shows a cross-sectional view along line B-B' of FIG. 25A.
Figure 25C:
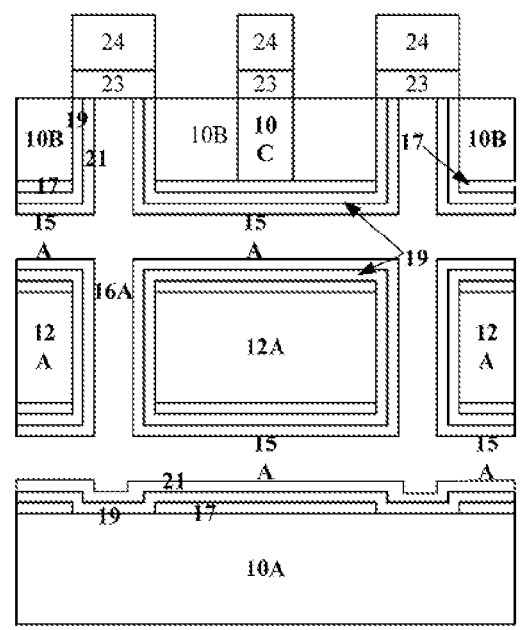
FIG. 25C shows a cross-sectional view along line A-A' of FIG. 21A.

As shown in FIGS. 25A-25C, using the photoresist pattern 24 as a mask, the wiring layer 23 is anisotropically dry-etched until the capping layer 10B is exposed. The etching process is, for example, plasma dry etching or reactive ion etching.

Figure 26A:
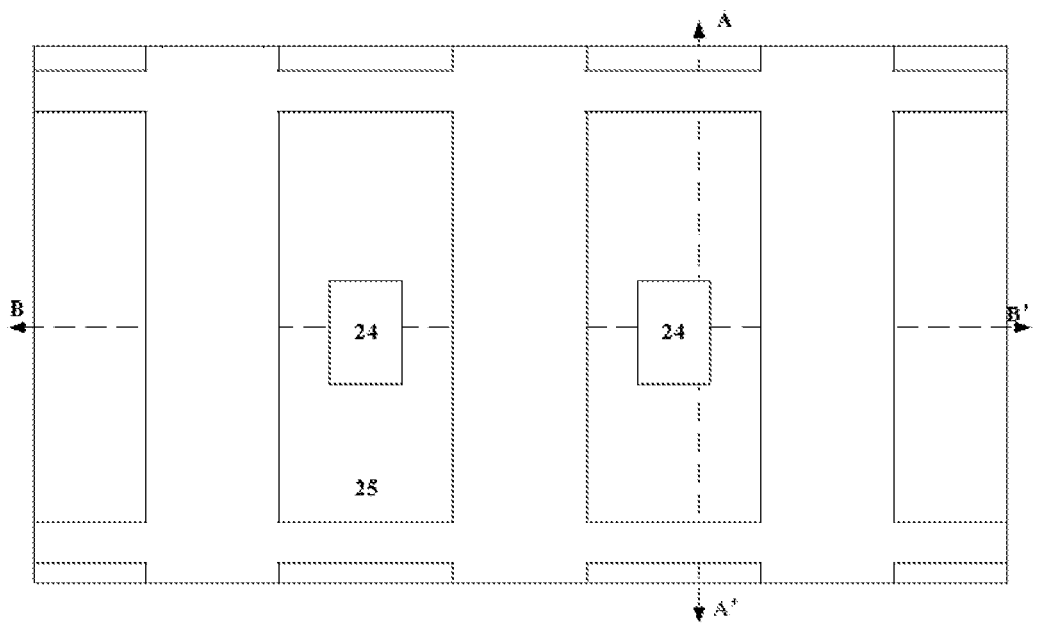
FIG. 26A shows a plan view of a resonator in a producing process according to an embodiment of the present invention.
Figure 26B:
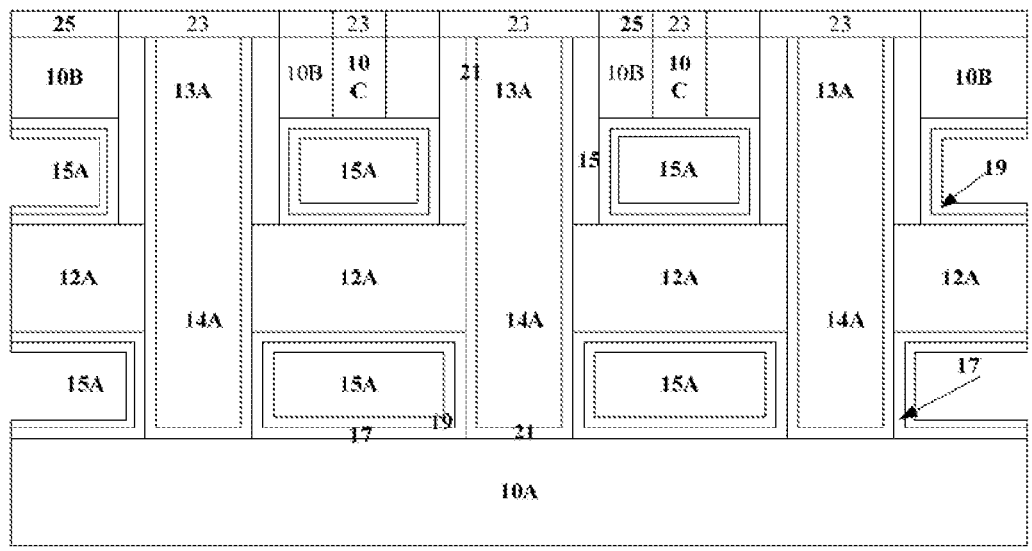
FIG. 26B shows a cross-sectional view along line B-B' of FIG. 26A.
Figure 26C:
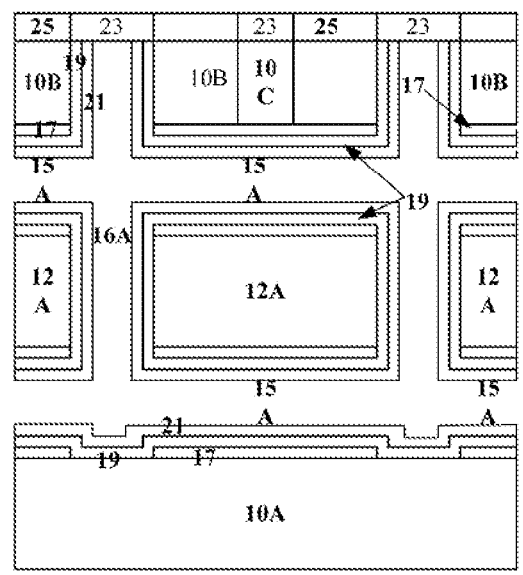
FIG. 26C shows a cross-sectional view along line A-A' of FIG. 21A.

As shown in FIGS. 26A-26C, the photoresist pattern 24 is removed to form an interlayer dielectric layer 25 over the entire device. The ILD layer 25 of a low-k material is formed by a process such as spin coating, spray coating or screen printing. The low-k material includes but is not limited to an organic low-k material (such as organic polymers containing aromatic groups or multi-rings), an inorganic low-k material (such as amorphous carbon nitride films, polycrystalline boron nitride films, fluorosilicate glass, BSG, PSG or BPSG), or a porous low-k material (such as disiloxane (SSQ) based porous low-k materials, porous silica, porous SiOCH, C-doped silica, F-doped porous amorphous carbon, porous diamond, or porous organic polymers). The ILD layer 25, as shown in FIGS. 26C and 26B, closes at least the top of the openings 16A and 13A and is preferably flush with the top of the capping layer 10B. Since the layer 25 is a soft low-k material formed by a low temperature process, it will not extend too much into the openings 16A and 13A (for example, the filling depth is less than ⅓ of the thickness of the capping layer 10B), and therefore it does not affect the shape of lateral cavity of the piezoelectric layer 12A, and thus does not affect the Q value of the resonator.

Figure 27:
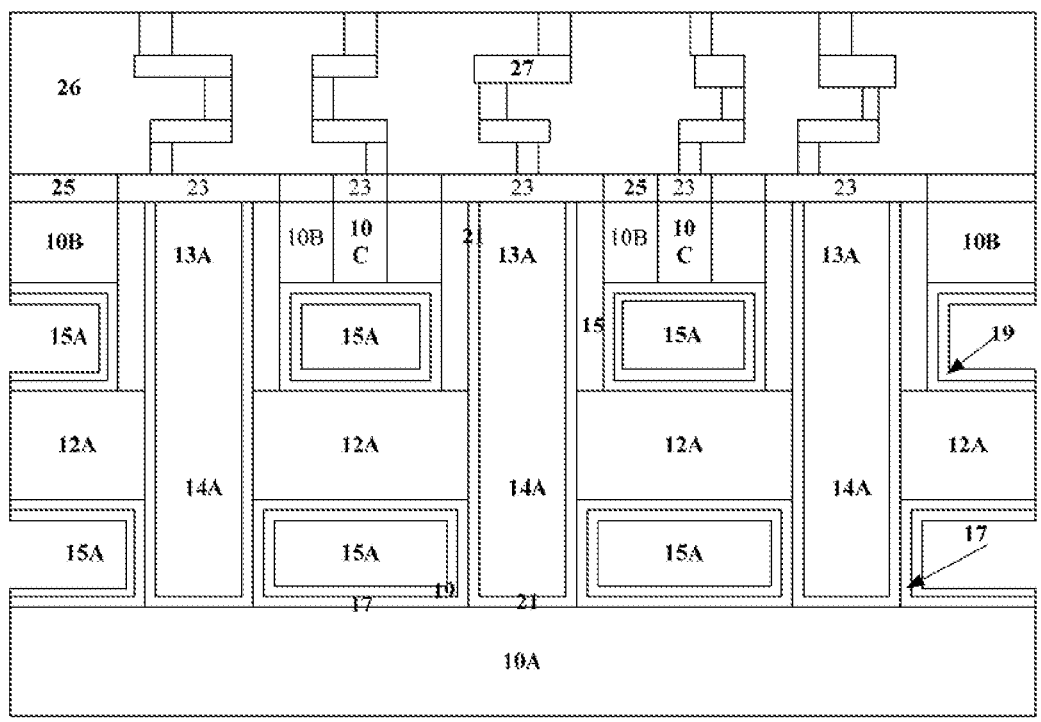
FIG. 27 shows a cross-sectional view along line B-B' of a resonator in a producing process according to an embodiment of the present invention.

As shown in FIG. 27, a metal interlayer dielectric (MID) layer 26 is further formed on the ILD layer 25, and a redistribution (RDL) layer 27 is formed in the MID 26, for rearranging the positions of the contact regions 10C (electrically connected to the electrodes at the top of the piezoelectric film 12A) and the metal layer 21 (electrically connected to the the electrodes at the bottom of the piezoelectric film 12A), to flexibly adjust the layout of the external electrical contacts. The MID layer 26 and the ILD layer 25 may be both made of a low-k material, and the RDL layer 27 may be made of the same material as the wiring layer 23. In a preferred embodiment of the present invention, after the ILD layer 25 and multiple MID layers 26 are formed in sequence, the RDL layer 27 is formed by a Damascus process.

Figure 28:
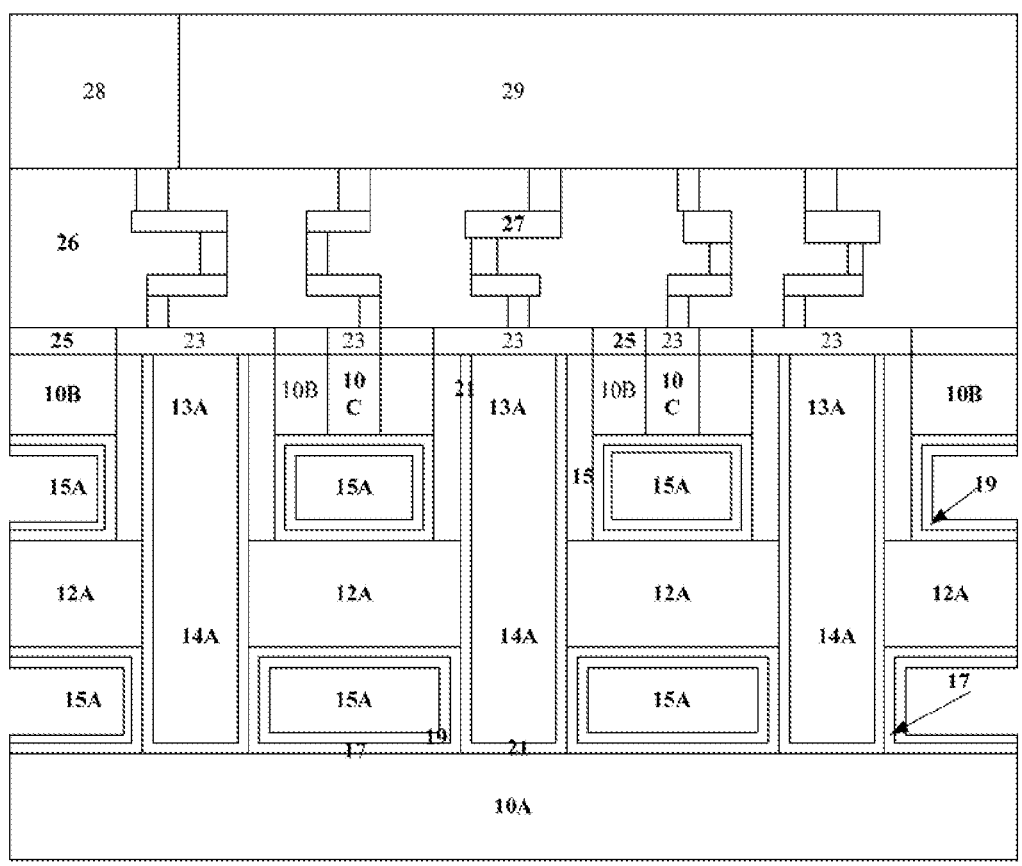
FIG. 28 shows a cross-sectional view along line B-B' of a resonator in a producing process according to an embodiment of the present invention.

As shown in FIG. 28, the package structure is completed. For example, a pad 28 and a passivation layer 29 are formed. For example, the pad 28 is formed by a deposition or etching process, which may be made of elemental metal of, alloy of, conductive oxide of or conductive nitride of Mo, W, Ru, Al, Cu, Ti, Ta, In, Zn, Zr, Fe, or Mg. In a preferred embodiment of the present invention, the pad 28 is made of Al to further reduce the cost. A passivation layer or solder resist layer 29 made of silicon oxide, silicon nitride or other organic resins is formed for insulation and isolation protection, or to be used as a solder resist layer for future soldering. Preferably, the surface of the passivation layer is treated by a process of, for example, oxygen and/or nitrogen atmosphere plasma annealing or laser annealing, to enhance the bonding strength between the passivation layer and the pad and between the passivation layer and future structures. The surface treatment also repairs the surface damage to the electrodes on both sides of the piezoelectric film and the electrode interconnection layer caused in each of the foregoing etching and deposition process steps, which is beneficial to reducing series resistance and parasitic capacitance. Particularly, a planarization process may be performed on the passivation layer 29 to expose the pad pattern 28. After that, further preferably conductive bumps (not shown) are formed on the pad patterns for external electrical connection.

The above describes, with reference to FIGS. 1A to 28, a complete process of producing a BAW resonator compatible with CMOS processes according to an embodiment of the present invention. The stacked BAW resonator finally produced on the first wafer includes: a substrate 10A and a capping layer 10B, and at least one layer of an array of piezoelectric films 12A (distributed along a first direction A-A' and a second direction B-B' which intersect with each other) between the substrate 10A and the capping layer 10B. The first cavities 15A are provided between the top piezoelectric film 12A and the capping layer 10B, between the bottom piezoelectric film 12A and the substrate 10A, and between the vertically adjacent piezoelectric films 12. The second cavities 16A (second openings) are provided between adjacent piezoelectric films 12 in the first direction A-A'. The third cavities (first openings 14A/13A) are provided between adjacent piezoelectric films 12 in the second direction B-B'. The metal layer 17 surrounds each first cavity 15A, to be used as the top and bottom electrodes of the piezoelectric layer 12A. The lead line 21 for the bottom electrode is arranged on the sidewall of the third cavity. A first isolation layer 15 is provided between the lead line 21 for the bottom electrode and the top electrode 17 of the piezoelectric layer 12A. The capping layer 10B includes a contact region 10C formed by an ion implantation process, which is electrically connected to the top electrode of the piezoelectric layer 12A. Above the the capping layer 10B, there is an ILD layer 25 including an wiring layer 23 therein, and a MID layer 26 including a RDL layer 27 therein, and a pad 28 used for external connection and a passivation layer 29.

Figure 29:
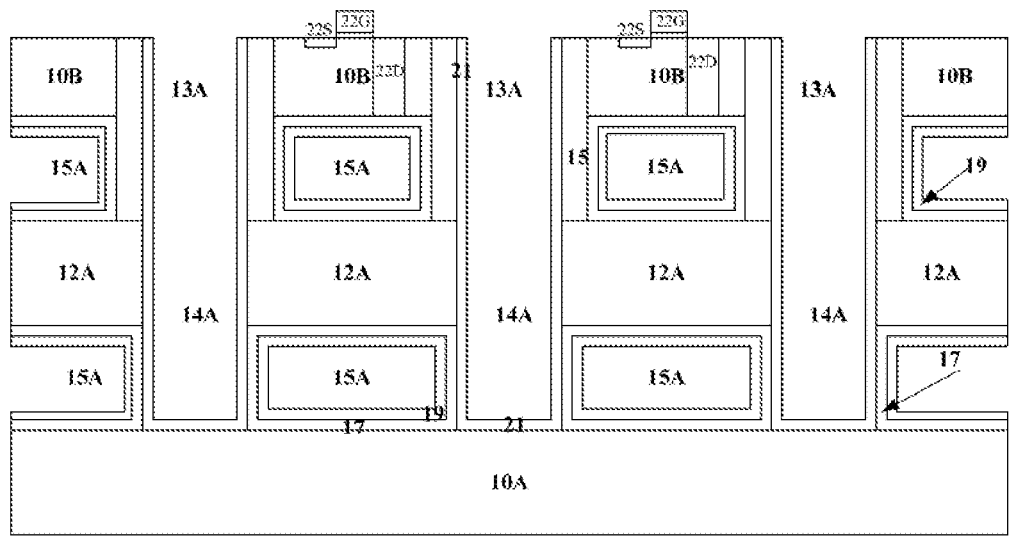
FIG. 29 shows a cross-sectional view along line B-B' of FIG. 21A of a resonator in a producing process according to an embodiment of the present invention.

In the embodiment of the stacked BAW resonator compatible with CMOS processes according to the present invention, as shown in FIG. 29, the driving transistor 22 is formed in the capping layer 10B. Specifically, for example, photoresist (not shown) is used to shield the first opening to expose only the active region of the capping layer 10B, and a gate stack 22G composed of a gate dielectric layer and a gate conductive layer is formed in the active region. The source region 22S and the drain region 22D are formed by ion doping implantation using the gate stack 22G as a mask. In particular, after the source region 22S and the drain region 22D are formed together by implantation, only the source region may be exposed by using a photoresist pattern, and the ion implantation depth may be increased so that the doped region 22D directly contacts the metal layer 17 surrounding the recess 15A, thereby eventually making electrical contact with the top of the piezoelectric layer 12A along the sidewalls of the recess 15A. In other words, the drain of the driving transistor 22 is electrically connected to the piezoelectric film 12A, so that the length of the electrical path between the driving transistor and the piezoelectric layer can be shortened inside the chip, thereby reducing the series resistance, enhancing the driving capability, improving the integration degree, and reducing the package cost.

In a preferred embodiment of the BAW resonator compatible with CMOS processes of the present invention, the capping layer 10B is a p-doped layer or an intrinsic layer, and and n-type doping ions such as As, P, or Sb are used to implant the capping layer 10B to form the n-type source region 22S and drain region 22D. Alternatively, p-type source region and drain region may be formed by implanting p-type impurities such as B into the n-doped capping layer. The implantation energy in the selective implantation process is preferably set according to the thickness of the capping layer 10B so that the implantation depth is greater than or equal to the thickness of the capping layer 10B, to make the contact region 10C directly contact and electrically connect to the electrode layer 17 on the top of the cavity 15A under the capping layer 10B. Further preferably, after the ion implantation, an annealing process such as RTA is performed, to not only activate the doping ions but also repair the damage to the top of the capping layer 10B, the sidewalls of the insulating layer 15, and the sidewalls and the bottom of the electrode layer 21 caused in the previous process steps, which effectively improves the performance and stability of the drive transistor.

In a preferred embodiment of the BAW resonator compatible with CMOS processes of the present invention, after the source and drain regions 22S and 22D are formed, an ohmic contact layer (not shown) is formed on top of the gate electrode 22G, the source region 22S and the drain region 22D, the material of which is metal silicide, metal germanide or the like, so as to effectively reduce the surface contact resistance. For example, a thin metal layer of W, Co, Pt, Ti, Ni, Ta, or the like are formed on the top of the driving transistor, and an annealing process is performed to make the metal react with the semiconductor elements such as Si or Ge in the gate electrode, and the source and drain regions of the driving transistor in the capping layer 10B, to form metal silicides or metal germanides, such as $WSi_2$, CoSi, NiSi, and the like. In a preferred embodiment of the present invention, the annealing process includes two steps, namely, a first step of low temperature annealing (e.g., below 450 degrees Celsius) for forming silicon-rich or germanium-rich compounds, and a second step of high temperature annealing (e.g., 450 to 650 degrees Celsius) for converting the silicon-rich or germanium-rich compounds to be in a low resistance state. Advantageously, at least a part of the annealing process used for forming the ohmic contact layer (e.g., the second step of high temperature annealing) may be combined with the aforementioned annealing process for activating dopant ions, to save process steps and reduce costs.

In another preferred embodiment of the BAW resonator compatible with CMOS processes of the present invention, the process of forming the ohmic contact layer is as follows. In the process of forming the source and drain regions 22S and 22D by ion implantation, the target material in the process chamber is the compound of ion implantation dopant and the above metal, such as compound of As/P/Sb/B and W/Co/Pt/Ti/Ni/Ta, for example, WP, NiP, $TiB_2$, or the like. In addition to using a mass analyzer to select and vertically guide implanted ions such as B and P onto the capping layer 10B for vertical ion implantation, a second mass analyzer is also used to guide, at an inclination, the impinged metal ions from a side of the implanted region to the surface of the source and drain regions (preferably repeatedly and alternately with the vertical ion implantation), thereby forming an ohmic contact layer in-situ. The energy of the vertical ion implantation may be greater than the energy of metal ions (preferably greater by one order of magnitude), so that the implanted dopant ions such as B and P can pass through the extremely thin ohmic contact layer and reach the bottom of the capping layer 10B. Therefore, the above-mentioned process of forming silicide and germanide by annealing after deposition can be saved, and the device does not need to be transferred from the ion implantation chamber to the deposition and annealing chamber, which saves time and reduces costs.

Figure 30A:
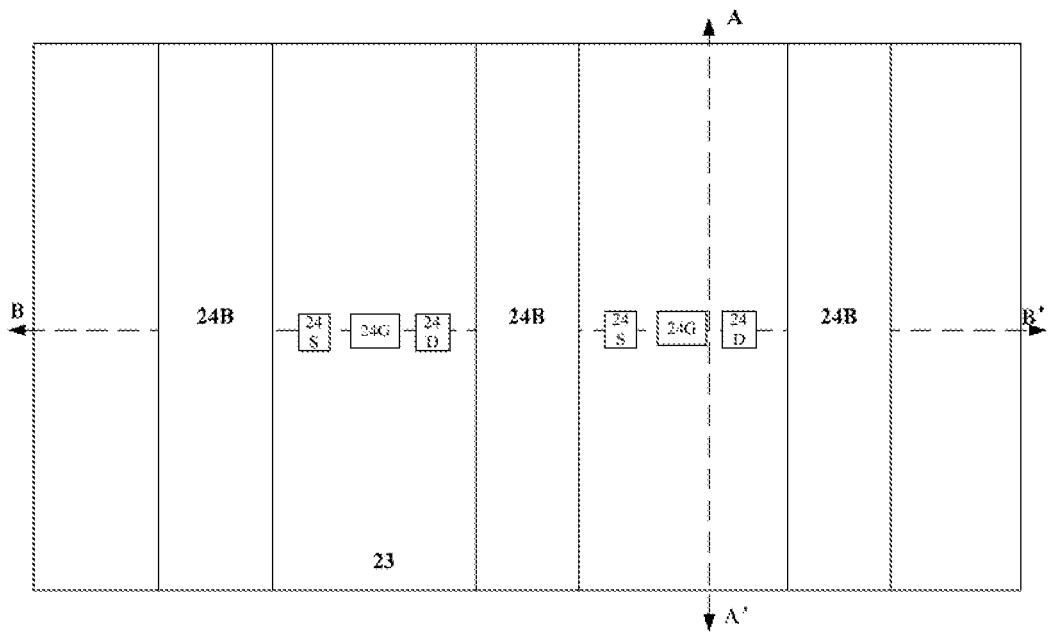
FIG. 30A shows a plan view of a resonator in a producing process according to an embodiment of the present invention.
Figure 30B:
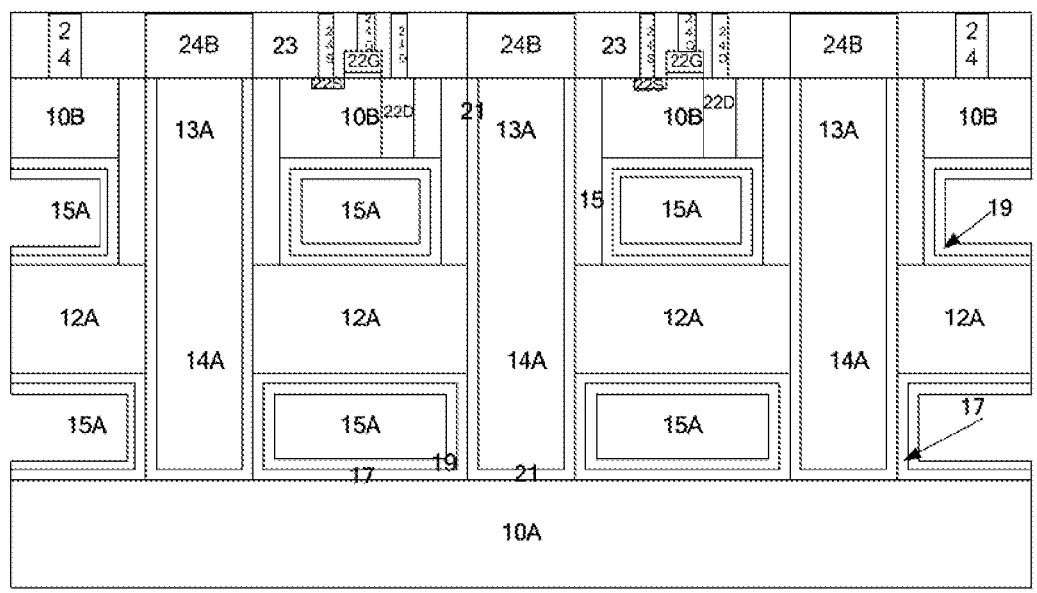
FIG. 30B shows a cross-sectional view along line B-B' of FIG. 30A.
Figure 30C:
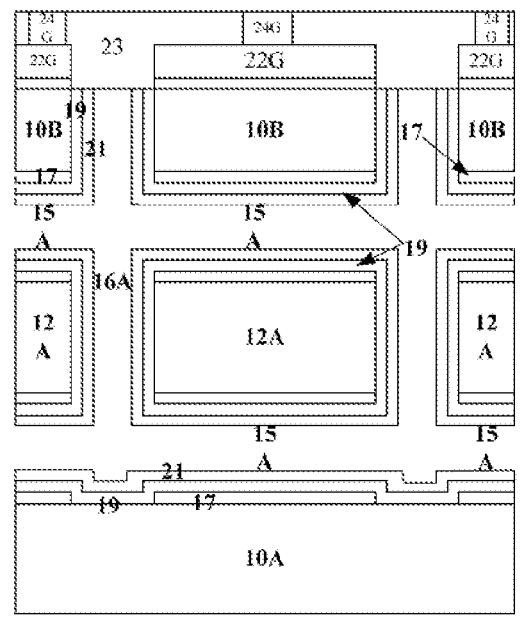
FIG. 30C shows a cross-sectional view along line A-A' of FIG. 30A.

As shown in FIGS. 30A-30C, an interlayer dielectric layer 23 is formed on the driving transistor 22, and contact plugs 24 are formed in the interlayer dielectric layer (ILD) 23. A process such as spin coating, spray coating or screen printing is used to form the ILD layer 23 of a low-k material. The low-k material includes but is not limited to an organic low-k material (such as organic polymers containing aromatic groups or multi-rings), an inorganic low-k material (such as amorphous carbon nitride films, polycrystalline boron nitride films, fluorosilicate glass, BSG, PSG, BPSG), or a porous low-k material (such as disiloxane (SSQ) based porous low-k materials, porous silica, porous SiOCH, C-doped silica, F-doped porous amorphous carbon, porous diamond, porous organic polymers). The ILD layer 23, as shown in FIG. 30C, closes at least the top of the opening 16A. Since the layer 23 is a soft low-k material formed by a low temperature process, it will not extend too much into the opening 16A (for example, the filling depth is less than ⅓ of the thickness of the capping layer 10B), and therefore it does not affect the shape of lateral cavity of the piezoelectric layer 12A, and thus does not affect the Q value of the resonator. The ILD layer is etched to form through holes exposing the bottom electrode lead line 21 and the gate electrode, and source and drain regions of the driving transistor 22, and a metal material is deposited to form the contact plugs 24. According to positions, the contact plugs are classified into contact plugs 24B connected to the bottom electrode of the piezoelectric film, and contact plugs 24G, 24S and 24D respectively connected to the gate electrode 22G, source electrode 22S and drain electrode 22D of the driving transistor.

Figure 31:
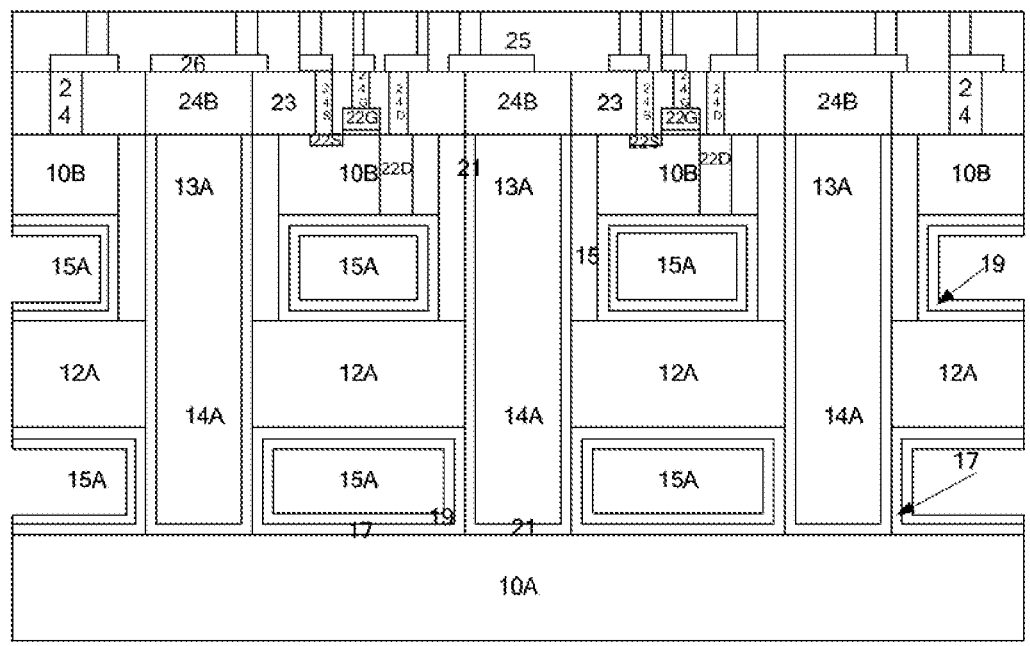
FIG. 31 shows a cross-sectional view along line B-B' of FIG. 30A of a resonator in a producing process according to an embodiment of the present invention.

As shown in FIG. 31, preferably a metal interlayer dielectric layer (MID) 25 is further formed on the ILD layer 23, and a redistribution (RDL) layer 26 is formed in the MID 25, for rearranging the positions of the contact plugs 24 to flexibly adjust the layout of the external electrical contacts. The MID layer 26 and the ILD layer 25 may be both made of a low-k material, and the RDL layer 26 may be made of the same material as the contact plugs 24. In a preferred embodiment of the present invention, after the ILD layer 23 and the MID layer 25 are formed in sequence, the contact plugs 24 and the RDL layer 26 are formed by a Damascus process.

The above describes, with reference to FIGS. 1A to 21C and FIGS. 29 to 31, a complete process of producing the BAW resonator compatible with CMOS processes according to an embodiment of the present invention. The stacked BAW resonator finally produced on a first wafer includes: a substrate 10A, a capping layer 10B, and at least one layer of an array of piezoelectric films 12A (distributed along a first direction A-A' and a second direction B-B' which intersect with each other) between the substrate 10A and the capping layer 10B. First cavities 15A are provided between the top piezoelectric film 12A and the capping layer 10B, between the bottom piezoelectric film 12A and the substrate 10A, and between the vertically adjacent piezoelectric films 12. The second cavities 16A (second openings) are provided between adjacent electrical films 12A in the first direction A-A'. The third cavities (first openings 14A/13A) are provided between adjacent electrical films 12A along the second direction B-B'. The metal layer 17 surrounds each first cavity 15A, to be used as the top and bottom electrodes of the piezoelectric layer 12A. The lead line 21 for the bottom electrode is arranged on the sidewall of the third cavity. A first isolation layer 15 is provided between the lead line 21 for the bottom electrode and the top electrode 17 of the piezoelectric layer 12A. The capping layer 10B includes a driving transistor 22. The drain region 22D of the driving transistor 22 is electrically connected to the top electrode of the piezoelectric layer 12A. Above the capping layer 10B, there are an ILD layer 23 including contact plugs 24 therein, and further a MID layer 25 including a RDL layer 26 therein.

Preferably, on the source and drain regions and the gate electrode of the driving transistor 22, there is an ohmic contact layer formed in-situ or by deposition annealing, so as to effectively reduce the interface resistance.

The encapsulation structure may then be further completed by, for example, forming a contact pad and a passivation layer (not shown). For example, a passivation layer of silicon oxide, silicon nitride or other organic resins is formed for insulation and isolation protection, or to be used as a solder resist layer for future soldering. Preferably, the surface of the passivation layer is treated by a process of, for example, oxygen and/or nitrogen atmosphere plasma annealing or laser annealing, to enhance the bonding strength between the passivation layer and the pads and between the passivation layer and future structures. The surface treatment also repairs the surface damage to the electrodes on both sides of the piezoelectric film and the electrode interconnection layer caused in each of the foregoing etching and deposition process steps, which is beneficial to reducing series resistance and parasitic capacitance. Particularly, a planarization process may be performed on the passivation layer to expose the pad pattern. After that, further preferably, conductive bumps (not shown) are formed on the pad patterns for external electrical connection.

Figure 32:
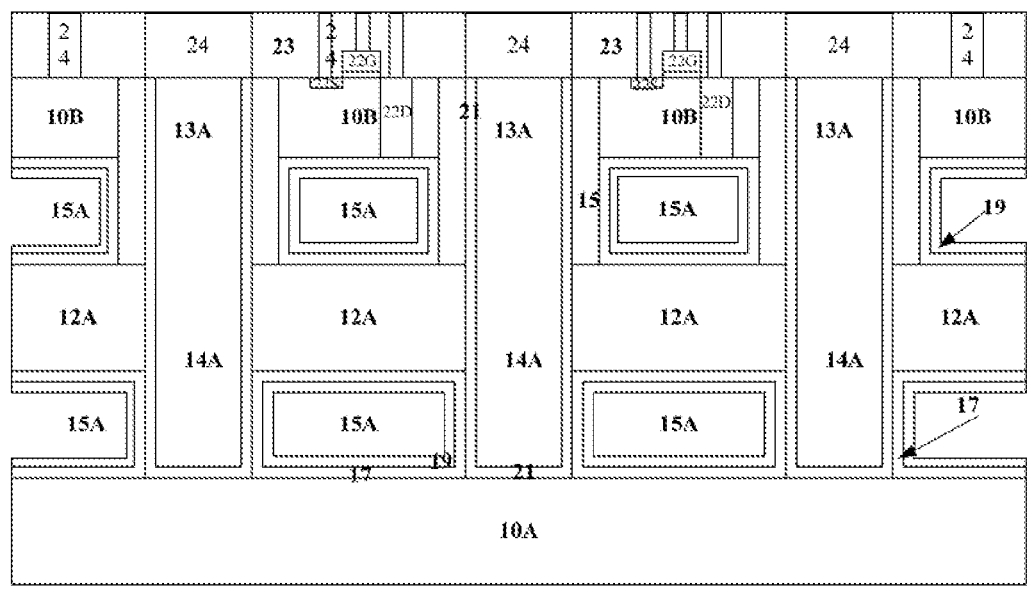
FIG. 32 shows a cross-sectional view along line B-B' of FIG. 21A of a resonator in a producing process according to an embodiment of the present invention.

In the embodiment of the stacked BAW resonator according to the present invention, as shown in FIG. 32, an interlayer dielectric layer 23 is formed on the driving transistor 22, and a contact plug 24 is formed in the interlayer dielectric layer (ILD) 23. A process of spin coating, spray coating, screen printing or the like is used to form the ILD layer 23 of a low-k material. The low-k material includes but is not limited to an organic low-k material (such as organic polymers containing aromatic groups or multi-rings), an inorganic low-k material (such as amorphous carbon nitride films, polycrystalline boron nitride films, fluorosilicate glass, BSG, PSG, BPSG), or a porous low-k material (such as disiloxane (SSQ) based porous low-k materials, porous silica, porous SiOCH, C-doped silica, F-doped porous amorphous carbon, porous diamond, porous organic polymers). The ILD layer is etched to form through holes exposing the bottom electrode lead line 21 and the gate electrode, and the source and drain regions of the driving transistor 22, and a metal material is deposited to form the contact plugs 24.

Figure 33:
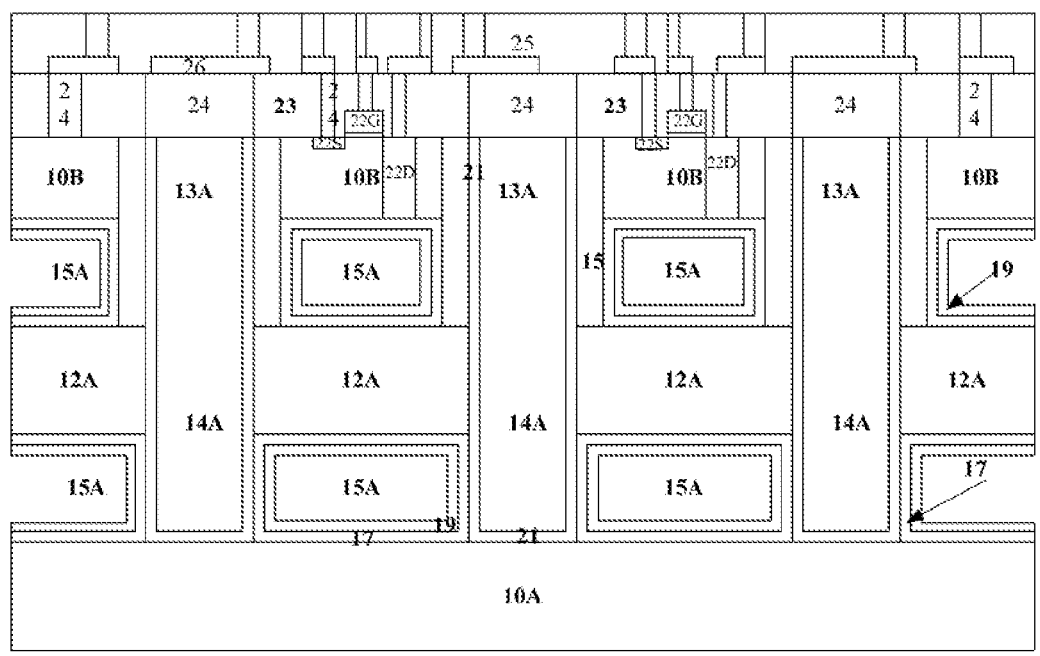
FIG. 33 shows a cross-sectional view along line B-B' of FIG. 21A of a resonator in a producing process according to an embodiment of the present invention.

As shown in FIG. 33, preferably a metal interlayer dielectric layer (MID) 25 is further formed on the ILD layer 23, and a redistribution (RDL) layer 26 is formed in the MID 25, for rearranging the positions of the contact plugs 24 to flexibly adjust the layout of the external electrical contacts. The MID 25 and the ILD 23 may be both made of a low-k material, and the RDL layer 26 can also be made of the same material as the contact plug 24. In a preferred embodiment of the present invention, after the ILD 23 and the MID 25 are formed in sequence, the contact plug 24 and the RDL layer 26 are formed by a Damascus process.

The above describes, with reference to FIGS. 1A to 21C, 29, 32 and 33, a complete process of producing the stacked BAW resonator according to an embodiment of the present invention. The stacked BAW resonator finally produced on a first wafer includes: a substrate 10A, a capping layer 10B, and at least one layer of an array of piezoelectric films 12A (distributed along a first direction A-A' and a second direction B-B' which intersect with each other) between the substrate 10A and the capping layer 10B. First cavities 15A are provided between the top piezoelectric film 12A and the capping layer 10B, between the bottom piezoelectric film 12A and the substrate 10A, and between the vertically adjacent piezoelectric films 12. The second cavities 16A (second openings) are provided between adjacent electrical films 12A in the first direction A-A'. The third cavities (first openings 14A/13A) are provided between adjacent electrical films 12A along the second direction B-B'. The metal layer 17 surrounds each first cavity 15A, to be used as the top and bottom electrodes of the piezoelectric layer 12A. The lead line 21 for the bottom electrode is arranged on the sidewall of the third cavity. A first isolation layer 15 is provided between the lead line 21 for the bottom electrode and the top electrode 17 of the piezoelectric layer 12A. The capping layer 10B includes a driving transistor 22. The drain region 22D of the driving transistor 22 is electrically connected to the top electrode of the piezoelectric layer 12A. Above the capping layer 10B, there are an ILD layer 23 including contact plugs 24 therein, and further a MID layer 25 including a RDL layer 26 therein.

Figure 34:
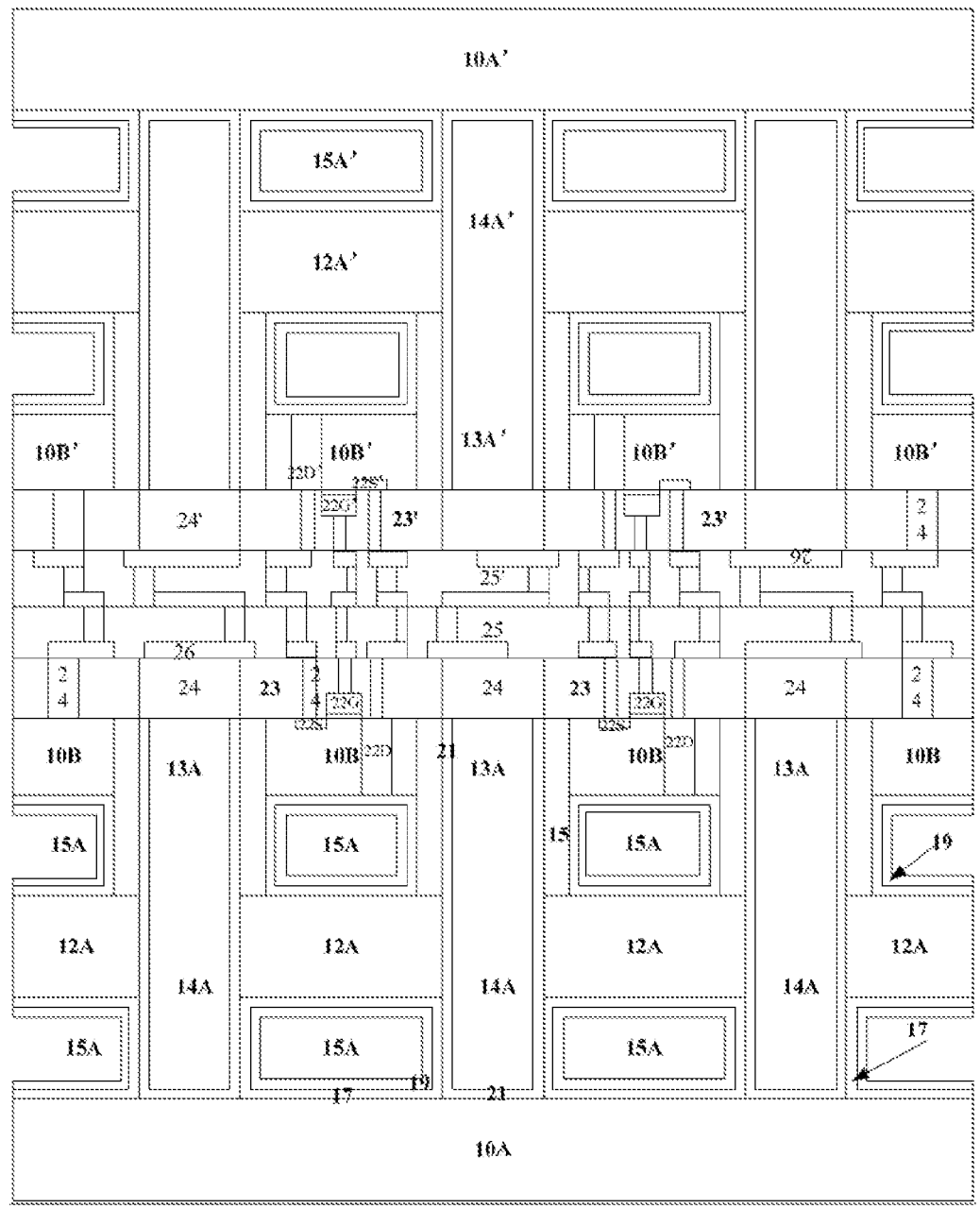
FIG. 34 shows a cross-sectional view along line B-B' of FIG. 21A of a resonator in a producing process according to another embodiment of the present invention.
Figure 35:
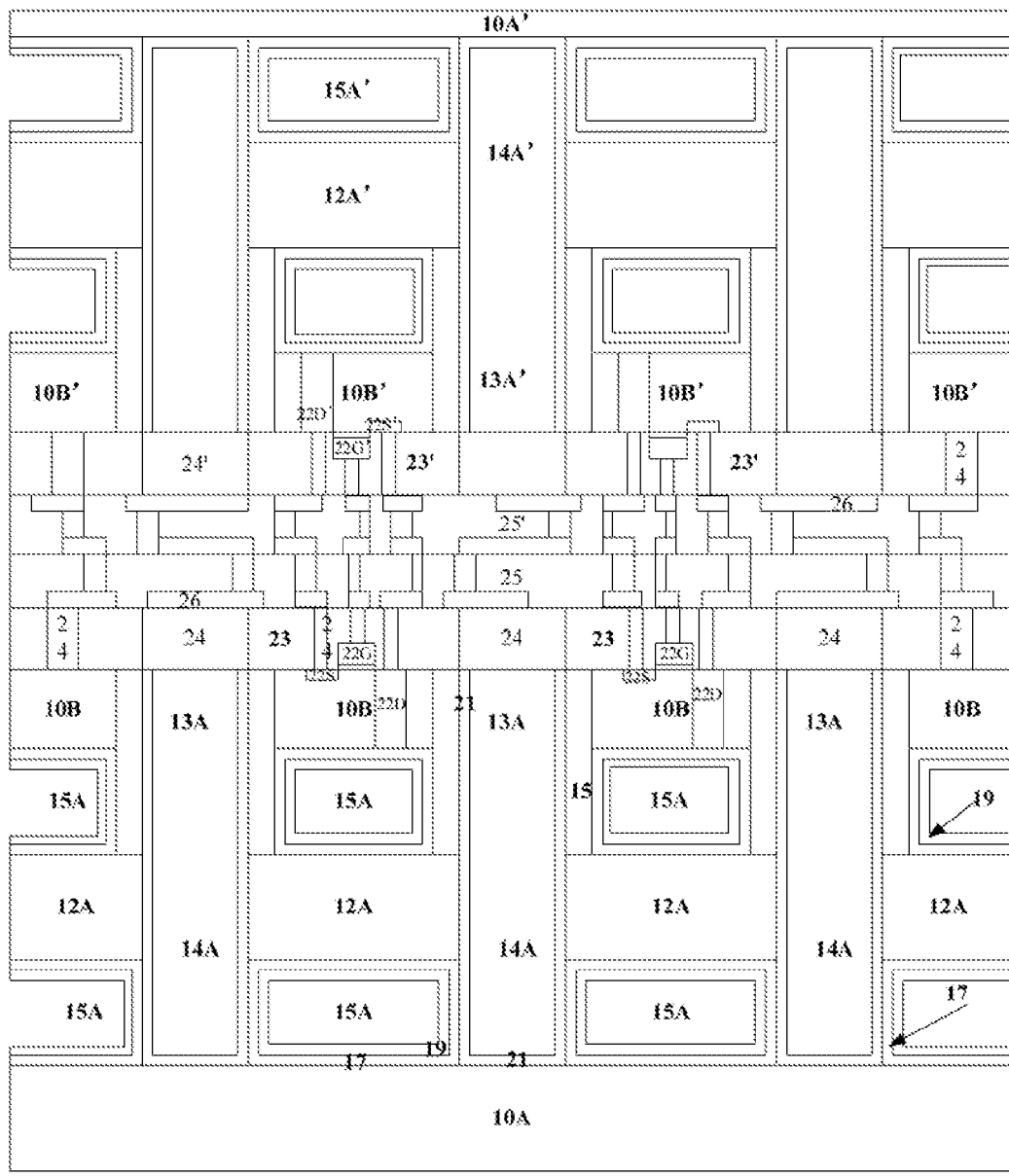
FIG. 35 shows a cross-sectional view along line B-B' of FIG. 21A of a resonator in a producing process according to another embodiment of the present invention.
Figure 36:
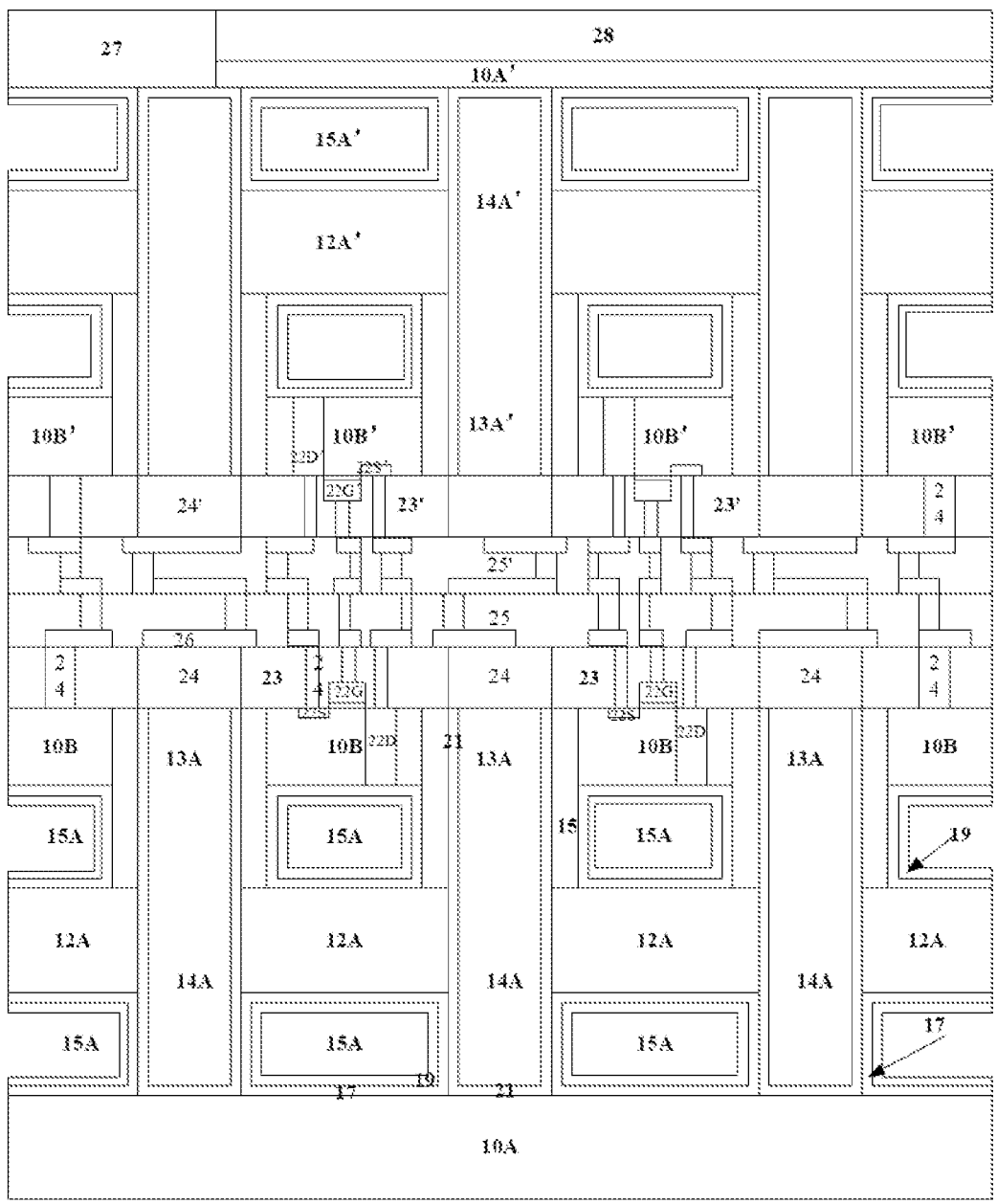
FIG. 36 shows a cross-sectional view along line B-B' of FIG. 21A of a resonator in a producing process according to another embodiment of the present invention.

Referring to FIGS. 34-36, a process of producing a two-chip stacked BAW resonator according to another embodiment of the present invention is described.

On the basis of FIGS. 1A-21C, 29, 32 and 33, the aforementioned stacked BAW resonator is formed on the first chip (wafer) and is formed on a second chip (wafer). Then, as shown in FIG. 34, the first wafer and the second wafer are bonded together by the RDL layers, to form a stacked structure in which the first wafer is mounted upward and the second wafer is mounted downward on the first wafer.

As shown in FIG. 35, the substrate 10A' of the second wafer is thinned by, for example, a CMP process or an etching back process, in order to reduce the height and contact resistance of subsequent package interconnects.

As shown in FIG. 36, a contact pad 27 and a passivation layer 28 are formed. For example, the thinned substrate 10A' is etched until the bottom electrode lead lines 21 are exposed, and the pad 27 is formed by deposition or electroplating. The width of the pad pattern along the second direction B-B' is greater than or equal to 1.5 times, preferably 2 times, the width of the cavity (the third cavity) formed by the remaining part of the first opening 14. Therefore, even if the upper structure is misaligned in the patterning process, it can also adequately make electrical connection to the underlying resonator array. A passivation layer 28 of silicon oxide, silicon nitride material or other organic resin is formed on the remaining portion of the substrate 10A' of the second wafer for insulation and isolation protection, or to be used as a solder resist layer for future soldering. Preferably, the surface of the passivation layer 28 is treated by, for example, a process of oxygen and/or nitrogen atmosphere plasma annealing or laser annealing, to enhance the bonding strength between the passivation layer 28 and the pads 27 and between the passivation layer 28 and future structures. The surface treatment can also repair the surface damage to the electrodes on both sides of the piezoelectric film and the electrode interconnection layer caused in each of the foregoing etching and deposition process steps, which is beneficial to reducing series resistance and parasitic capacitance. Particularly, a planarization process is performed on the passivation layer 28 to expose the pad pattern 27. After that, it is further preferable to form conductive bumps (not shown) on the pad pattern 27 for external electrical connection.

With the BAW resonator and the method of producing the BAW resonator in the present invention, a CMOS compatible process is used to produce a three-dimensional resonator in which multiple cavities surround a piezoelectric film.

Furthermore, in some embodiments of the present invention, a contact region or driving circuit electrically connected to the top electrode of the piezoelectric film is formed by deep ion implantation in the top capping layer, which reduces the package volume and reduces the interface resistance. In some embodiments of the present invention, especially in the embodiments of the stacked BAW resonator, the driving circuit is formed in the capping layer, and a redistribution layer is used to bond multiple chips together, which reduces the volume, increases the integration degree and reduces the cost.

The following embodiments are disclosed.

Embodiment 1. A bulk acoustic wave (BAW) resonator, comprising:
  a piezoelectric film array, comprising a plurality of piezoelectric films between a substrate of a chip and a capping layer on the top, wherein a plurality of first cavities are provided between adjacent piezoelectric films in a vertical direction, between the piezoelectric films and the capping layer, and between the piezoelectric films and the substrate, second cavities are shared between adjacent piezoelectric films in a first direction in a horizontal plane, and third cavities are shared between adjacent piezoelectric films in a second direction in the horizontal plane;
  a plurality of electrode layers, covering at least the top surface and bottom surface of each of the piezoelectric films;
  a plurality of electrode interconnection layers, connected to the electrode layers on the bottom surfaces of the piezoelectric films along sidewalls of the third cavities; and
  a contact region formed by ion implantation, which is located in the capping layer and is electrically connected to an electrode layer at the top surface of a top piezoelectric film.

Embodiment 2. The BAW resonator according to Embodiment 1, wherein an electrode layer, a first isolation layer and an electrode interconnection layer are provided between each of the first cavities and the shared third cavities, and optionally an electrode layer and a second isolation layer surround each of the first cavities; and optionally an interlayer dielectric layer is provided above the contact region, and a wiring layer is provided in the interlayer dielectric layer, preferably an intermetallic dielectric layer and at least one redistribution layer are provided above the interlayer dielectric layer, preferably a pad and a passivation layer are provided above the intermetallic dielectric layer and the redistribution layer, preferably a length that the interlayer dielectric layer extends into the second cavities or the third cavities is less than or equal to ⅓ of the thickness of the capping layer 3, optionally an ohmic contact layer is provided on the contact region.

Embodiment 3. The BAW resonator according to Embodiment 1 or 2, wherein
  the material of the substrate and/or the capping layer is selected from bulk Si, silicon-on-insulator (SOI), bulk Ge, GeOI, GaN, GaAs, SiC, InP, or GaP, and preferably the material of the substrate is the same as the material of the capping layer;
  optionally the material of the electrode layer and/or the electrode interconnection layer and/or the pad is selected from elemental metal of, alloy of, conductive oxide of or conductive nitride of Mo, W, Ru, Al, Cu, Ti, Ta, In, Zn, Zr, Fe, or Mg, or any combination thereof;
  optionally the material of the piezoelectric films is ZnO, AlN, BST, BT, PZT, PBLN, or PT;

optionally the material of the first isolation layer and/or the second isolation layer is SiOx, SiOC, SiOC, SiOF, SiFC, BSG, PSG, or PBSG, or any combination thereof; and preferably the material of the first isolation layer is the same as the material of the second isolation layer;

optionally the ohmic contact layer is made of metal silicide or metal germanide;

optionally the interlayer dielectric layer and/or the intermetallic dielectric layer is made of a low-k material; and optionally the material of the passivation layer is silicon oxide, silicon nitride or organic resin.

Embodiment 4. A method for producing a bulk acoustic wave (BAW) resonator, comprising:
  forming a plurality of sacrificial layers and a plurality of piezoelectric layers which are alternately stacked on a substrate;
  forming a capping layer on a top sacrificial layer, and forming a hard mask on the capping layer;
  forming a plurality of first openings extending along a first direction by etching the aforementioned layers in sequence until the substrate is exposed;
  forming a first isolation layer in each opening;
  forming a plurality of second openings extending along a second direction by etching until the substrate is exposed;
  removing the plurality of sacrificial layers through the second openings, to form a plurality of first cavities between adjacent piezoelectric layers, between the piezoelectric layers and the capping layer, and between the piezoelectric layers and the substrate;
  forming a plurality of electrode layers on at least top surfaces and bottom surfaces of the piezoelectric layers through the second openings;
  forming, in the first openings, electrode interconnection layers connected to electrodes at the bottom surfaces of the piezoelectric layers; and
  forming a contact region electrically connected to an electrode layer at the top surface of a top piezoelectric layer, by performing an ion implantation process on the capping layer.

Embodiment 5. The method for producing a BAW resonator according to Embodiment 4, further comprising:
  forming an electrode layer, a first isolation layer and an electrode interconnection layer between each of the first cavities and shared third cavities;
  optionally forming an electrode layer and a second isolation layer that surround each of the first cavities;
  optionally forming an interlayer dielectric layer above the driving transistor and forming a wiring layer in the interlayer dielectric layer,
  preferably forming an intermetallic dielectric layer and at least one redistribution layer above the interlayer dielectric layer;
  more preferably forming a pad and a passivation layer above the intermetallic dielectric layer and the redistribution layer, wherein preferably a length that the interlayer dielectric layer extends into the second cavities or the third cavities is less than or equal to ⅓ of the thickness of the capping layer; and
  optionally performing an annealing process after forming the wiring layer, so that metal reacts with the semiconductor material of the contact region to form an ohmic contact layer.

Embodiment 6. The method for producing a BAW resonator according to Embodiment 4 or 5, wherein the material of the substrate and/or the capping layer is selected from bulk Si, silicon-on-insulator (SOI), bulk Ge, GeOI, GaN, GaAs, SiC, InP, or GaP, and preferably, the material of the substrate is the same as the material of the capping layer;

optionally the material of the electrode layer and/or the electrode interconnection layer and/or the pad is selected from elemental metal of, alloy of, conductive oxide of or conductive nitride of Mo, W, Ru, Al, Cu, Ti, Ta, In, Zn, Zr, Fe, or Mg, or any combination thereof;

optionally the material of the piezoelectric films is ZnO, AlN, BST, BT, PZT, PBLN, or PT;

optionally the material of the first isolation layer and/or the second isolation layer is SiOx, SiOC, SiOC, SiOF, SiFC, BSG, PSG, or PBSG or any combination thereof; and preferably the material of the first isolation layer is the same as the material of the second isolation layer;

optionally the ohmic contact layer is made of metal silicide or metal germanide;

optionally the interlayer dielectric layer and/or the intermetallic dielectric layer is made of a low-k material; and optionally the material of the passivation layer is silicon oxide, silicon nitride or organic resin.

Embodiment 7. The method for producing a BAW resonator according to Embodiment 4, wherein the contact region is formed by selectively performing the ion implantation process using a mask and then performing a first annealing process.

Embodiment 8. The method for producing a BAW resonator according to Embodiment 5, wherein a process of forming the ohmic contact layer comprises:
  forming a metal layer on a source region and a drain region,
  performing a second annealing process so that the metal layer reacts with a semiconductor material of the capping layer to form metal silicide or metal germanide, wherein preferably the metal layer is made of W, Co, Pt, Ti, Ni, Ta, or any combination thereof.

Embodiment 9. The method for producing a BAW resonator according to Embodiment 8, wherein the second annealing process comprises:
  step a1), performing a low-temperature annealing process at a first temperature so that the metal layer reacts with the semiconductor material in the contact region to form a silicon-rich or germanium-rich compound; and
  step a2), performing a high-temperature annealing process at a second temperature to convert the silicon-rich or germanium-rich compound to be in a low resistance state, wherein the second temperature is higher than the first temperature;
  wherein preferably the annealing in step a2) is combined with the first annealing process;
  preferably the first temperature is lower than 450 degrees Celsius, and the second temperature is 450 to 650 degrees Celsius.

Embodiment 10. The method for producing a BAW resonator according to Embodiment 5, after forming the bonding pad and the passivation layer, further comprising:
  treating the surface of the passivation layer to enhance bond strength and/or repair surface damage; and/or
  forming a conductive bump on the pad pattern for external electrical connection.

Embodiment 11. A bulk acoustic wave (BAW) resonator compatible with CMOS processes, comprising:
  a piezoelectric film array, comprising a plurality of piezoelectric films between a substrate of a chip and a capping layer on the top, wherein a plurality of first cavities are provided between adjacent piezoelectric films in a vertical direction, between the piezoelectric films and the capping layer, and between the piezoelectric films and the substrate, second cavities are shared between adjacent piezoelectric films in a first direction in a horizontal plane, and third cavities are shared between adjacent piezoelectric films in a second direction in the horizontal plane;

a plurality of electrode layers, covering at least the top surface and bottom surface of each of the piezoelectric films;

a plurality of electrode interconnection layers, connected to the electrode layers on the bottom surfaces of the piezoelectric films along sidewalls of the third cavities; and a driving transistor, located in the capping layer, wherein a drain electrode of the driving transistor is electrically connected to an electrode layer at the top surface of a top piezoelectric film, wherein an ohmic contact layer is provided on a source electrode and the drain electrode of the drive transistor.

Embodiment 12. The BAW resonator compatible with CMOS processes according to Embodiment 11, wherein an electrode layer, a first isolation layer and an electrode interconnection layer are provided between each of the first cavities and the shared third cavities, and optionally an electrode layer and a second isolation layer surround each of the first cavities; and optionally an interlayer dielectric layer is provided above the driving transistor, and a contact plug is provided in the interlayer dielectric layer, preferably an intermetallic dielectric layer and a redistribution layer are provided above the interlayer dielectric layer, preferably a length that the interlayer dielectric layer extends into the second cavities or the third cavities is less than or equal to ⅓ of the thickness of the capping layer.

Embodiment 13. The BAW resonator compatible with CMOS processes according to Embodiment 11 or 12, wherein the material of the substrate and/or the capping layer is selected from bulk Si, silicon-on-insulator (SOI), bulk Ge, GeOI, GaN, GaAs, SiC, InP, or GaP, and preferably the material of the substrate is the same as the material of the capping layer;

optionally the material of the electrode layer and/or the electrode interconnection layer and/or the pad is selected from elemental metal of, alloy of, conductive oxide of or conductive nitride of Mo, W, Ru, Al, Cu, Ti, Ta, In, Zn, Zr, Fe, or Mg, or any combination thereof;

optionally the material of the piezoelectric films is ZnO, AlN, BST, BT, PZT, PBLN, or PT;

optionally the material of the first isolation layer and/or the second isolation layer is SiOx, SiOC, SiOC, SiOF, SiFC, BSG, PSG, or PBSG, or any combination thereof; and preferably the material of the first isolation layer is the same as the material of the second isolation layer;

optionally the ohmic contact layer is made of metal silicide or metal germanide; and optionally the interlayer dielectric layer is made of a low-k material.

Embodiment 14. A method for producing a bulk acoustic wave (BAW) resonator compatible with CMOS processes, comprising:

forming a plurality of sacrificial layers and a plurality of piezoelectric layers which are alternately stacked on a substrate;

forming a capping layer on a top sacrificial layer, and forming a hard mask on the capping layer;

forming a plurality of first openings extending along a first direction by etching the aforementioned layers in sequence until the substrate is exposed;

forming a first isolation layer in each opening;

forming a plurality of second openings extending along a second direction by etching until the substrate is exposed;

removing the plurality of sacrificial layers through the second openings, to form a plurality of first cavities between adjacent piezoelectric layers, between the piezoelectric layers and the capping layer, and between the piezoelectric layers and the substrate;

forming a plurality of electrode layers on at least top surfaces and bottom surfaces of the piezoelectric layers through the second openings;

forming, in the first openings, electrode interconnection layers connected to electrodes at the bottom surfaces of the piezoelectric layers;

forming a driving transistor in the capping layer, wherein a drain electrode of the driving transistor is electrically connected to an electrode layer at the top surface of a top piezoelectric layer; and forming an ohmic contact layer on the source/drain electrode of the driving transistor.

Embodiment 15. The method for producing a BAW resonator compatible with CMOS processes according to Embodiment 14, further comprising:

forming an electrode layer, a first isolation layer and an electrode interconnection layer between each of the first cavities and shared third cavities;

optionally forming an electrode layer and a second isolation layer that surround each of the first cavities;

optionally forming an interlayer dielectric layer above the driving transistor and forming a contact plug in the interlayer dielectric layer; and more preferably forming an intermetallic dielectric layer and a redistribution layer above the interlayer dielectric layer;

wherein preferably a length that the interlayer dielectric layer extends into the second cavities or the third cavities is less than or equal to ⅓ of the thickness of the capping layer.

Embodiment 16. The method for producing a BAW resonator compatible with CMOS processes according to Embodiment 14 or 15, wherein the material of the substrate and/or the capping layer is selected from bulk Si, silicon-on-insulator (SOI), bulk Ge, GeOI, GaN, GaAs, SiC, InP, or GaP, and preferably, the material of the substrate is the same as the material of the capping layer;

optionally the material of the electrode layer and/or the electrode interconnection layer and/or the pad is selected from elemental metal of, alloy of, conductive oxide of or conductive nitride of Mo, W, Ru, Al, Cu, Ti, Ta, In, Zn, Zr, Fe, or Mg, or any combination thereof;

optionally the material of the piezoelectric films is ZnO, AlN, BST, BT, PZT, PBLN, or PT;

optionally the material of the first isolation layer and/or the second isolation layer is SiOx, SiOC, SiOC, SiOF, SiFC, BSG, PSG, or PBSG or any combination thereof; and preferably the material of the first isolation layer is the same as the material of the second isolation layer;

optionally the ohmic contact layer is made of metal silicide or metal germanide; and optionally the interlayer dielectric layer is made of a low-k material.

Embodiment 17. The method for producing a BAW resonator compatible with CMOS processes according to Embodiment 14, comprising:
forming a shallow source region and a deep drain region by selectively performing an ion implantation process with a mask and performing a first annealing process.

Embodiment 18. The method for producing a BAW resonator compatible with CMOS processes according to Embodiment 17, wherein a process of forming the ohmic contact layer comprises:
a) forming a metal layer on the source region and the drain region, and performing a second annealing process so that the metal layer reacts with a semiconductor material of the capping layer to form metal silicide or metal germanide, wherein preferably the metal layer is made of W, Co, Pt, Ti, Ni, or Ta; or
b) forming the ohmic contact layer in-situ while forming a source region and a drain region by the ion implantation process, wherein preferably the ohmic contact layer is made of silicide or germanide of W, Co, Pt, Ti, Ni, or Ta.

Embodiment 19. The method for producing a BAW resonator compatible with CMOS processes according to Embodiment 18, wherein step a) comprises:
step a1), performing a low-temperature annealing process at a first temperature so that the metal layer reacts with the semiconductor material in the contact region to form a silicon-rich or germanium-rich compound; and
step a2), performing a high-temperature annealing process at a second temperature to convert the silicon-rich or germanium-rich compound to be in a low resistance state, wherein the second temperature is higher than the first temperature;
wherein preferably the annealing in step a2) is combined with the first annealing process; and
preferably the first temperature is lower than 450 degrees Celsius, and the second temperature is 450 to 650 degrees Celsius.

Embodiment 20. The method for producing a BAW resonator compatible with CMOS processes according to Embodiment 18, wherein in step b), a target material for the ion implantation process is a compound of implanted ions and the metal contained in the ohmic contact layer, preferably the implanted ions are As, P, Sb, or B, and the metal is W, Co, Pt, Ti, Ni, or Ta; and
preferably, the implanted ions are selected by a first mass analyzer and implanted vertically, and alternately ions of the metal are selected by a second mass analyzer and guided to the surface of the source region and the drain region at an inclination; preferably the energy of the implanted ions is greater than the energy of the ions of the metal.

Embodiment 21. A stacked bulk acoustic wave (BAW) resonator, comprising:
a piezoelectric film array, comprising a plurality of piezoelectric films between a substrate of a chip and a capping layer on the top, wherein a plurality of first cavities are provided between adjacent piezoelectric films in a vertical direction, between the piezoelectric films and the capping layer, and between the piezoelectric films and the substrate, second cavities are shared between adjacent piezoelectric films in a first direction in a horizontal plane, and third cavities are shared between adjacent piezoelectric films in a second direction in the horizontal plane;
a plurality of electrode layers, covering at least the top surface and bottom surface of each of the piezoelectric films;
a plurality of electrode interconnection layers, connected to the electrode layers on the bottom surfaces of the piezoelectric films along sidewalls of the third cavities; and
a driving transistor, located in the capping layer, wherein a drain electrode of the driving transistor is electrically connected to an electrode layer at the top surface of a top piezoelectric film.

Embodiment 22. The stacked BAW resonator according to Embodiment 21, wherein, optionally the second cavities have the same width in the first direction; and optionally the width of a pad in the second direction is greater than or equal to 1.5 times the width of the third cavities.

Embodiment 23. The stacked BAW resonator according to Embodiment 21, wherein
an electrode layer, a first isolation layer and an electrode interconnection layer are provided between each of the first cavities and the shared third cavities, and optionally an electrode layer and a second isolation layer surround each of the first cavities; and
optionally, an interlayer dielectric layer is provided above the driving transistor, and a contact plug is provided in the interlayer dielectric layer, preferably an intermetallic dielectric layer and a redistribution layer are provided above the interlayer dielectric layer.

Embodiment 24. The stacked BAW resonator according to Embodiment 21 or 23, wherein
the material of the substrate and/or the capping layer is selected from bulk Si, silicon-on-insulator (SOI), bulk Ge, GeOI, GaN, GaAs, SiC, InP, or GaP, and preferably the material of the substrate is the same as the material of the capping layer;
optionally the material of the electrode layer and/or the electrode interconnection layer and/or the pad is selected from elemental metal of, alloy of, conductive oxide of or conductive nitride of Mo, W, Ru, Al, Cu, Ti, Ta, In, Zn, Zr, Fe, or Mg, or any combination thereof;
optionally the material of the piezoelectric films is ZnO, AlN, BST, BT, PZT, PBLN, or PT;
optionally the material of the first isolation layer and/or the second isolation layer is SiOx, SiOC, SiOC, SiOF, SiFC, BSG, PSG, or PBSG, or any combination thereof; and preferably the material of the first isolation layer is the same as the material of the second isolation layer;
optionally the material of the pad is Al, Mg, or In, or any combinations thereof.

Embodiment 25. A stacked BAW resonator package structure, comprising a first stacked resonator on a first wafer and a second stacked resonator on a second wafer, the first wafer being oppositely bonded to the second wafer, wherein the first stacked resonator and second stacked resonator each are the stacked BAW resonator according to any one of Embodiments 21 to 24.

Embodiment 26. A method for producing a stacked bulk acoustic wave (BAW) resonator, comprising:
forming a plurality of sacrificial layers and a plurality of piezoelectric layers which are alternately stacked on a substrate;
forming a capping layer on a top sacrificial layer, and forming a hard mask on the capping layer;
forming a plurality of first openings extending along a first direction by etching the aforementioned layers in sequence until the substrate is exposed;

forming a first isolation layer in each opening;
forming a plurality of second openings extending along a second direction by etching until the substrate is exposed;
removing the plurality of sacrificial layers through the second openings, to form a plurality of first cavities between adjacent piezoelectric layers, between the piezoelectric layers and the capping layer, and between the piezoelectric layers and the substrate;
forming a plurality of electrode layers on at least top surfaces and bottom surfaces of the piezoelectric layers through the second openings;
forming, in the first openings, electrode interconnection layers connected to electrodes at the bottom surfaces of the piezoelectric layers;
forming a driving transistor in the capping layer, wherein a drain electrode of the driving transistor is electrically connected to an electrode layer at the top surface of a top piezoelectric layer.

Embodiment 27. The method for producing a stacked BAW resonator according to Embodiment 26, wherein, optionally second cavities have the same width in the first direction; and optionally the width of a pad in the second direction is greater than or equal to 1.5 times the width of third cavities.

Embodiment 28. The method for producing a stacked BAW resonator according to Embodiment 26, comprising:
forming an electrode layer, a first isolation layer, and an electrode interconnection layer between each of the first cavities and shared third cavities;
optionally forming an electrode layer and a second isolation layer that surround each of the first cavities;
optionally forming an interlayer dielectric layer above the driving transistor and forming a contact plug in the interlayer dielectric layer, and
preferably forming an intermetallic dielectric layer and a redistribution layer above the interlayer dielectric layer.

Embodiment 29. The method for producing a stacked BAW resonator according to Embodiment 26 or 28, wherein
the material of the substrate and/or the capping layer material is selected from bulk Si, silicon-on-insulator (SOI), bulk Ge, GeOI, GaN, GaAs, SiC, InP, or GaP, and preferably the material of the substrate is the same as the material of the capping layer;
optionally the material of the electrode layer and/or the electrode interconnection layer is selected from elemental metal of, alloy of, conductive oxide of or conductive nitride of Mo, W, Ru, Al, Cu, Ti, Ta, In, Zn, Zr, Fe, or Mg, or any combination thereof;
optionally the material of the piezoelectric films is ZnO, AlN, BST, BT, PZT, PBLN, or PT;
optionally, the material of the first isolation layer and/or the second isolation layer is SiOx, SiOC, SiOC, SiOF, SiFC, BSG, PSG, or PBSG, or any combination thereof, and preferably the material of the first isolation layer is the same as the material of the second isolation layer; and
optionally the material of the pad is Al, Mg, or In, or any combinations thereof.

Embodiment 30. A method for producing a stacked BAW resonator packaging structure, comprising:
producing a first stacked BAW resonator on a first wafer by the method for producing a stacked BAW resonator according to any one of Embodiments 26 to 29;
producing a second stacked BAW resonator on a second wafer by the method for producing a stacked BAW resonator according to any one of Embodiments 26 to 29;
bonding the first wafer and the second wafer oppositely;
preferably thinning a second substrate of the second wafer after bonding the first wafer and the second wafer; and
preferably forming a bonding pad and a passivation layer on the thinned second substrate.

Although the invention has been described with reference to one or more exemplary embodiments, those skilled in the art can make various suitable changes and equivalents in device structure without departing from the scope of the invention. In addition, many modifications adapted to a particular situation or material may be made from the disclosed teachings without departing from the scope of the invention. Therefore, the present invention is not limited to the particular embodiments disclosed as the best mode for carrying out the present invention, but include all embodiments of device structures and methods of making the same that fall within the scope of the present invention.

The invention claimed is:
1. A bulk acoustic wave (BAW) resonator, comprising:
a piezoelectric film array, comprising a plurality of piezoelectric films between a substrate of a chip and a capping layer on a top, wherein a plurality of first cavities are provided between adjacent piezoelectric films of the plurality of piezoelectric films in a vertical direction, between the piezoelectric films of the plurality of piezoelectric films and the capping layer, and between the plurality of piezoelectric films and the substrate, second cavities are shared between adjacent piezoelectric films of the plurality of piezoelectric films in a first direction in a horizontal plane, and third cavities are shared between adjacent piezoelectric films of the plurality of piezoelectric films in a second direction in the horizontal plane;
a plurality of electrode layers, covering at least the top surface and bottom surface of each of the plurality of piezoelectric films; and
a plurality of electrode interconnection layers, connected to the plurality of electrode layers on the bottom surfaces of the plurality of piezoelectric films along sidewalls of the third cavities.

2. The BAW resonator according to claim 1, wherein a contact region formed by ion implantation is located in the capping layer and is electrically connected to an electrode layer at the top surface of a top piezoelectric film of the plurality of piezoelectric films, wherein:
an electrode layer of the plurality of electrode layers, a first isolation layer and an electrode interconnection layer of the plurality of electrode interconnection layers are provided between each of the first cavities and the shared third cavities, and an electrode layer and a second isolation layer surround each of the first cavities; and
an interlayer dielectric layer is provided above the contact region, and a wiring layer is provided in the interlayer dielectric layer, an intermetallic dielectric layer and at least one redistribution layer are provided above the interlayer dielectric layer, a pad and a passivation layer are provided above the intermetallic dielectric layer and the redistribution layer, a length that the interlayer dielectric layer extends into the second cavities or the third cavities is less than or equal to ⅓ of a thickness of the capping layer, optionally an ohmic contact layer is provided on the contact region.

3. The BAW resonator according to claim 2, wherein:
a material of the substrate and/or the capping layer is selected from bulk Si, silicon-on-insulator (SOI), bulk Ge, GeOI, GaN, GaAs, SiC, InP, or GaP;
a material of the plurality of electrode layers and/or the plurality of electrode interconnection layers and/or the pad is selected from elemental metal of, alloy of, conductive oxide of or conductive nitride of Mo, W, Ru, Al, Cu, Ti, Ta, In, Zn, Zr, Fe, or Mg, or any combination thereof;
a material of the plurality of piezoelectric films is ZnO, AlN, BST, BT, PZT, PBLN, or PT;
a material of the first isolation layer and/or the second isolation layer is SiOx, SiOC, SiOF, SiFC, BSG, PSG, or PBSG, or any combination thereof;
the ohmic contact layer is made of metal silicide or metal germanide;
the interlayer dielectric layer and/or the intermetallic dielectric layer is made of a low-k material; and
a material of the passivation layer is silicon oxide, silicon nitride or organic resin.

4. The BAW resonator according to claim 1, wherein a driving transistor is located in the capping layer, and a drain electrode of the driving transistor is electrically connected to an electrode layer at the top surface of a top piezoelectric film of the plurality of piezoelectric films, wherein:
an electrode layer of the plurality of electrode layers, a first isolation layer and an electrode interconnection layer of the plurality of electrode layers of the plurality of electrode layers are provided between each of the first cavities and the shared third cavities, and an electrode layer and a second isolation layer surround each of the first cavities; and
an interlayer dielectric layer is provided above the driving transistor, and a contact plug is provided in the interlayer dielectric layer, and an intermetallic dielectric layer and a redistribution layer are provided above the interlayer dielectric layer.

5. The BAW resonator of claim 4, wherein an ohmic contact layer is provided on a source electrode and the drain electrode of the drive transistor, wherein:
a length that the interlayer dielectric layer extends into the second cavities or the third cavities is less than or equal to 1/3 of a thickness of the capping layer.

6. The BAW resonator according to claim 5, wherein:
a material of the substrate and/or the capping layer is selected from bulk Si, silicon-on-insulator (SOI), bulk Ge, GeOI, GaN, GaAs, SiC, InP, or GaP;
a material of the plurality of electrode layers and/or the plurality of electrode interconnection layers is selected from elemental metal of, alloy of, conductive oxide of or conductive nitride of Mo, W, Ru, Al, Cu, Ti, Ta, In, Zn, Zr, Fe, or Mg, or any combination thereof;
a material of the plurality of piezoelectric films is ZnO, AlN, BST, BT, PZT, PBLN, or PT;
a material of the first isolation layer and/or the second isolation layer is SiOx, SiOC, SiOF, SiFC, BSG, PSG, or PBSG, or any combination thereof;
the ohmic contact layer is made of metal silicide or metal germanide; and
the interlayer dielectric layer is made of a low-k material.

7. The BAW resonator according to claim 4, wherein, the second cavities have a same width in the first direction; a width of a pad in the second direction is greater than or equal to 1.5 times a width of the third cavities.

8. The BAW resonator according to claim 4, wherein:
a material of the substrate and/or the capping layer is selected from bulk Si, silicon-on-insulator (SOI), bulk Ge, GeOI, GaN, GaAs, SiC, InP, or GaP;
a material of the plurality of electrode layers and/or the plurality of electrode interconnection layers is selected from elemental metal of, alloy of, conductive oxide of or conductive nitride of Mo, W, Ru, Al, Cu, Ti, Ta, In, Zn, Zr, Fe, or Mg, or any combination thereof;
a material of the plurality of piezoelectric films is ZnO, AlN, BST, BT, PZT, PBLN, or PT;
a material of the first isolation layer and/or the second isolation layer is SiOx, SiOC, SiOF, SiFC, BSG, PSG, or PBSG, or any combination thereof; and
a material of a pad is Al, Mg, or In, or any combinations thereof.

9. A method for producing a bulk acoustic wave (BAW) resonator, comprising:
forming a plurality of sacrificial layers and a plurality of piezoelectric layers which are alternately stacked on a substrate;
forming a capping layer on a top sacrificial layer of the plurality of sacrificial layers, and forming a hard mask on the capping layer;
forming a plurality of first openings extending along a first direction by etching the plurality of sacrificial layers and the plurality of piezoelectric layers in sequence until the substrate is exposed;
forming a first isolation layer in each of the plurality of first openings;
forming a plurality of second openings extending along a second direction by etching until the substrate is exposed;
removing the plurality of sacrificial layers through the second openings, to form a plurality of first cavities between adjacent piezoelectric layers of the plurality of piezoelectric layers, between the plurality of piezoelectric layers and the capping layer, and between the plurality of piezoelectric layers and the substrate;
forming a plurality of electrode layers on at least top surfaces and bottom surfaces of the plurality of piezoelectric layers through the second openings; and
forming, in the first openings, electrode interconnection layers connected to electrodes at the bottom surfaces of the plurality of piezoelectric layers.

10. The method for producing a BAW resonator according to claim 9, further comprising:
forming a contact region electrically connected to an electrode layer of the plurality of electrode layers at the top surface of a top piezoelectric layer of the plurality of piezoelectric layers, by performing an ion implantation process on the capping layer;
forming an electrode layer of the plurality of electrode layers and a second isolation layer that surround each of the first cavities;
forming an interlayer dielectric layer above a driving transistor and forming a wiring layer in the interlayer dielectric layer,
forming an intermetallic dielectric layer and at least one redistribution layer above the interlayer dielectric layer;
forming a pad and a passivation layer above the intermetallic dielectric layer and the redistribution layer, wherein a length that the interlayer dielectric layer extends into the second cavities is less than or equal to 1/3 of the thickness of the capping layer; and
performing an annealing process after forming the wiring layer to form an ohmic contact layer.

11. The method for producing a BAW resonator according to claim 10, wherein the contact region is formed by selectively performing the ion implantation process using a mask and then performing a first annealing process.

12. The method for producing a BAW resonator according to claim 10,
wherein a process of forming the ohmic contact layer comprises:
forming a metal layer on a source region and a drain region, and
performing a second annealing process so that the metal layer reacts with a semiconductor material of the capping layer to form metal silicide or metal germanide, wherein the metal layer is made of W, Co, Pt, Ti, Ni, Ta, or any combination thereof.

13. The method for producing a BAW resonator according to claim 12, wherein the second annealing process comprises:
step a1), performing a low-temperature annealing process at a first temperature so that the metal layer reacts with the semiconductor material in the contact region to form a silicon-rich or germanium-rich compound; and
step a2), performing a high-temperature annealing process at a second temperature to convert the silicon-rich or germanium-rich compound to be in a low resistance state, wherein the second temperature is higher than the first temperature;
wherein the first temperature is lower than 450 degrees Celsius, and the second temperature is 450 to 650 degrees Celsius.

14. The method for producing a BAW resonator according to claim 10, after forming the pad and the passivation layer, further comprising:
treating the surface of the passivation layer to enhance bond strength and/or repair surface damage; and/or
forming a conductive bump on the pad for external electrical connection.

15. The method for producing a BAW resonator according to claim 9, further comprising:
forming a driving transistor in the capping layer, wherein a drain electrode of the driving transistor is electrically connected to an electrode layer of the plurality of electrode layers at the top surface of a top piezoelectric layer of the plurality of piezoelectric layers; and
forming an ohmic contact layer on a source electrode or the drain electrode of the driving transistor.

16. The method for producing a BAW resonator according to claim 15, comprising:
forming a shallow source region and a deep drain region by selectively performing an ion implantation process with a mask and performing a first annealing process; and
wherein a process of forming the ohmic contact layer comprises:
a) forming a metal layer on the source region and the drain region, and performing a second annealing process so that the metal layer reacts with a semiconductor material of the capping layer to form metal silicide or metal germanide, wherein the metal layer is made of W, Co, Pt, Ti, Ni, or Ta; or
b) forming the ohmic contact layer in-situ while forming a source region and a drain region by the ion implantation process, wherein the ohmic contact layer is made of silicide or germanide of W, Co, Pt, Ti, Ni, or Ta.

17. The method for producing a BAW resonator according to claim 16, wherein step a) comprises:
step a1), performing a low-temperature annealing process at a first temperature so that the metal layer reacts with the semiconductor material in the contact region to form a silicon-rich or germanium-rich compound; and
step a2), performing a high-temperature annealing process at a second temperature to convert the silicon-rich or germanium-rich compound to be in a low resistance state, wherein the second temperature is higher than the first temperature;
wherein the first temperature is lower than 450 degrees Celsius, and the second temperature is 450 to 650 degrees Celsius.

18. The method for producing a BAW resonator according to claim 16, wherein in step b), a target material for the ion implantation process is a compound of implanted ions and the metal contained in the ohmic contact layer, preferably the implanted ions are As, P, Sb, or B, and the metal is W, Co, Pt, Ti, Ni, or Ta; and
the implanted ions are selected by a first mass analyzer and implanted vertically, and alternately ions of the metal are selected by a second mass analyzer and guided to the surface of the source region and the drain region at an inclination; the energy of the implanted ions is greater than the energy of the ions of the metal.

19. The method for producing a BAW resonator according to claim 15, comprising:
forming an electrode layer of the plurality of electrode layers, a first isolation layer, and an electrode interconnection layer of the plurality of electrode interconnection layers between each of the first cavities and shared third cavities;
forming an electrode layer of the plurality of electrode layers and a second isolation layer that surround each of the first cavities;
forming an interlayer dielectric layer above the driving transistor and forming a contact plug in the interlayer dielectric layer, and
forming an intermetallic dielectric layer and a redistribution layer above the interlayer dielectric layer, wherein a length that the interlayer dielectric layer extends into the second cavities or the third cavities is less than or equal to ⅓ of the thickness of the capping layer.

20. The method for producing a BAW resonator according to claim 15, comprising:
forming an electrode layer of the plurality of electrode layers, a first isolation layer, and an electrode interconnection layer of the plurality of electrode interconnection layers between each of the first cavities and shared third cavities;
forming an electrode layer of the plurality of electrode layers and a second isolation layer that surround each of the first cavities;
forming an interlayer dielectric layer above the driving transistor and forming a contact plug in the interlayer dielectric layer, and
forming an intermetallic dielectric layer and a redistribution layer above the interlayer dielectric layer.

* * * * *